(12) United States Patent
Zhang et al.

(10) Patent No.: US 12,322,342 B2
(45) Date of Patent: Jun. 3, 2025

(54) DISPLAY SUBSTRATE AND DISPLAY DEVICE

(71) Applicant: BOE TECHNOLOGY GROUP CO., LTD., Beijing (CN)

(72) Inventors: Xing Zhang, Beijing (CN); Zhan Gao, Beijing (CN); Yicheng Lin, Beijing (CN); Pan Xu, Beijing (CN); Ying Han, Beijing (CN); Dacheng Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/642,786

(22) PCT Filed: Mar. 25, 2021

(86) PCT No.: PCT/CN2021/083034
§ 371 (c)(1),
(2) Date: Mar. 14, 2022

(87) PCT Pub. No.: WO2022/198575
PCT Pub. Date: Sep. 29, 2022

(65) Prior Publication Data
US 2024/0005869 A1    Jan. 4, 2024

(51) Int. Cl.
*G09G 3/3266* (2016.01)
*G09G 3/3233* (2016.01)
(Continued)

(52) U.S. Cl.
CPC ......... *G09G 3/3258* (2013.01); *G09G 3/3233* (2013.01); *G09G 3/3266* (2013.01);
(Continued)

(58) Field of Classification Search
CPC .............. G09G 3/3266; G09G 3/3233; G09G 2300/0426; G09G 2300/0842; G09G 2310/0286
See application file for complete search history.

(56) References Cited

U.S. PATENT DOCUMENTS 8,587,499 B2    11/2013    Kang et al.
10,962,850 B1    3/2021    Yang et al.
(Continued)

FOREIGN PATENT DOCUMENTS

CN    101958340 A    1/2011
CN    106920804 A    7/2017
(Continued)

OTHER PUBLICATIONS

Second Chinese Office Action in Chinese Application No. 202180000588.9 dated Dec. 28, 2024 with English translaiton.

*Primary Examiner* — Stacy Khoo
(74) *Attorney, Agent, or Firm* — Collard & Roe, P.C.; William Collard

(57) ABSTRACT

A display substrate and a display device are provided. The display substrate includes a base substrate and a plurality of sensing signal lines. The base substrate includes a display region including repeating units arranged in array, each repeating unit includes a transparent region and a pixel region arranged in a first direction. Two lines of repeating units are provided between adjacent two of the plurality of sensing signal lines, the two lines of repeating units extend along a second direction, and each of the plurality of sensing signal lines is connected with sub-pixel driving circuits of the plurality of sub-pixels of two lines of repeating units which are adjacent to the each of the plurality of sensing signal lines and extend along the second direction, and is configured to provide a reference voltage signal. The display
(Continued)

substrate reduces the space occupied by the signal lines and improves the light transmittance.

19 Claims, 17 Drawing Sheets

(51) Int. Cl.
  *G09G 3/3258* (2016.01)
  *H10K 59/131* (2023.01)
(52) U.S. Cl.
  CPC ... *H10K 59/131* (2023.02); *G09G 2300/0426* (2013.01); *G09G 2300/0842* (2013.01); *G09G 2310/0286* (2013.01)

(56) References Cited

U.S. PATENT DOCUMENTS

| | | | |
|---|---|---|---|
| 11,063,097 | B2 | 7/2021 | Baek |
| 11,088,175 | B2 | 8/2021 | Wen |
| 11,404,506 | B2 | 8/2022 | Kim |
| 2017/0256205 | A1 | 9/2017 | Zhu et al. |
| 2018/0061859 | A1 | 3/2018 | Wen |
| 2018/0331169 | A1 | 11/2018 | Nam et al. |
| 2019/0123121 | A1* | 4/2019 | Liu ................. H10K 59/122 |
| 2019/0172873 | A1 | 6/2019 | Ji et al. |
| 2021/0036081 | A1 | 2/2021 | Song et al. |
| 2022/0045161 | A1 | 2/2022 | Li et al. |
| 2022/0140043 | A1 | 5/2022 | Cao et al. |
| 2022/0165831 | A1* | 5/2022 | Han ................. H10K 59/126 |
| 2022/0262886 | A1 | 8/2022 | Yuan et al. |

FOREIGN PATENT DOCUMENTS

| | | | | |
|---|---|---|---|---|
| CN | 108231847 | A | | 6/2018 |
| CN | 108666343 | A | | 10/2018 |
| CN | 109728000 | A | | 5/2019 |
| CN | 109935212 | A | * | 6/2019 ........... G09G 3/3233 |
| CN | 110021628 | A | | 7/2019 |
| CN | 110611043 | A | | 12/2019 |
| CN | 110718575 | A | | 1/2020 |
| CN | 110750021 | A | | 2/2020 |
| CN | 110783490 | A | | 2/2020 |
| CN | 110858607 | A | | 3/2020 |
| CN | 111048570 | A | | 4/2020 |
| CN | 111179828 | A | | 5/2020 |
| CN | 111312769 | A | | 6/2020 |
| CN | 111430415 | A | | 7/2020 |
| CN | 210984239 | U | | 7/2020 |
| CN | 111564476 | A | | 8/2020 |
| CN | 111584574 | A | | 8/2020 |
| CN | 111899651 | A | | 11/2020 |
| CN | 112002712 | A | | 11/2020 |
| CN | 112289841 | A | | 1/2021 |
| KR | 10-2016-0038494 | A | | 4/2016 |
| KR | 10-2019-0054563 | A | | 5/2019 |
| KR | 10-2019-0068934 | A | | 6/2019 |
| KR | 10-2020-0066959 | A | | 6/2020 |

\* cited by examiner

DISPLAY SUBSTRATE AND DISPLAY DEVICE

CROSS REFERENCE TO RELATED APPLICATIONS

This application is the National Stage of PCT/CN2021/083034 filed on Mar. 25, 2021, the disclosure of which is incorporated by reference.

TECHNICAL FIELD

At least one embodiment of the present disclosure relates to a display substrate and a display device.

BACKGROUND

In the display field, the current market demand for large-size and high-PPI (Pixels Per Inch) transparent display devices is increasing day by day. Transparent display devices can be used in applications such as vehicles, smart homes, and shop windows and the like. At the same time, the development of transparent display technology can effectively expand the application field of OLED (Organic Light-Emitting Diode).

SUMMARY

At least one embodiment of the present disclosure provides a display substrate. The display substrate comprises: a base substrate, comprising a display region, wherein the display region comprises a plurality of repeating units arranged in array, each of the plurality of repeating units comprises a transparent region and a pixel region which are arranged in a first direction, the pixel region comprises a plurality of sub-pixels, each of the plurality of sub-pixels comprises a sub-pixel driving circuit and a light-emitting element, the light-emitting element is located on a side of the sub-pixel driving circuit away from the base substrate, and the sub-pixel driving circuit is configured to drive the light-emitting element to emit light; and a plurality of sensing signal lines provided on the base substrate and extending along a second direction different from the first direction, wherein two lines of repeating units are provided between adjacent two of the plurality of sensing signal lines, the two lines of repeating units respectively extend along the second direction, and each of the plurality of sensing signal lines is connected with sub-pixel driving circuits of the plurality of sub-pixels of two lines of repeating units which are adjacent to the each of the plurality of sensing signal lines, and is configured to provide a reference voltage signal.

For example, in the display substrate provided by at least one embodiment of the present disclosure, the plurality of power supply lines are provided on the base substrate and extend along the second direction; in the first direction, the plurality of power supply lines and the plurality of sensing signal lines are alternately arranged; one line of repeating units extending along the second direction is provided between each of the plurality of sensing signal lines and a power supply line adjacent to the each of the plurality of sensing signal lines, two lines of repeating units respectively extending along the second direction are provided between adjacent two of the plurality of power supply lines, and each of the plurality of power supply lines is connected with sub-pixel driving circuits of the plurality of sub-pixels of two lines of repeating units which are adjacent to the each of the plurality of power supply lines and respectively extend along the second direction, and is configured to provide a first power supply voltage.

For example, the display substrate provided by at least one embodiment of the present disclosure further comprises a peripheral region, a gate driving circuit, and a plurality of gate lines extending along the first direction; the peripheral region at least partially surrounding the display region, the gate driving circuit is located in the peripheral region, and the plurality of gate lines are connected with the gate driving circuit and are connected with sub-pixel driving circuits of pixel regions of respective lines of the repeating units respectively extending along the first direction; the gate driving circuit is configured to sequentially output a gate scanning signal for driving the sub-pixel driving circuits of the pixel regions of respective lines of the repeating units respectively extending along the first direction to work; and the plurality of repeating units are arranged in N lines respectively extending along the first direction, the gate driving circuit comprises N cascaded shift register units, and an (n)th-stage shift register unit is connected with sub-pixel driving circuits of pixel regions of an (n)th line of repeating units, wherein 1≤n≤N, and N is an integer greater than or equal to 2.

For example, in the display substrate provided by at least one embodiment of the present disclosure, the sub-pixel driving circuits of the pixel region are arranged along the first direction, and each of the sub-pixel driving circuits comprises a data writing circuit, a driving circuit, a charge storage circuit, and a sensing circuit; the driving circuit is connected with a first node, a second node, and a third node, the third node is further connected with a first power supply voltage terminal, the first power supply voltage terminal is connected with one of the plurality of power supply lines, and the driving circuit is configured to receive the first power supply voltage through the third node and control a driving current flowing through the light-emitting element under control of a level of the first node; the data writing circuit is connected with the first node, and is configured to receive the gate scanning signal as a scanning driving signal and write a data signal to the first node in response to the scanning driving signal; the charge storage circuit is connected with the first node and the second node, and is configured to store the data signal that is written and a reference voltage signal; the sensing circuit is connected with the second node, and is configured to receive the gate scanning signal as a sensing driving signal, the sensing circuit is further connected with one of the plurality of sensing signal lines to receive the reference voltage signal and write the reference voltage signal to the driving circuit or read a sensing voltage signal from the driving circuit in response to the sensing driving signal; and the light-emitting element is connected with the second node and a second power supply voltage terminal, and is configured to receive a second power supply voltage through the second power supply voltage terminal and emit light under the driving of the driving current.

For example, in the display substrate provided by at least one embodiment of the present disclosure, the plurality of gate lines comprises a first gate line and a second gate line; the first gate line is connected with data writing circuits of a plurality of sub-pixel driving circuits of pixel regions of a (M)th line of repeating units extending in the first direction, sensing circuits of a plurality of sub-pixel driving circuits of pixel regions of a (M−1)th line of repeating units C1 extending in the first direction, and an output terminal of a (M)th-stage shift register unit, so that a gate scanning signal output from the output terminal of the (M)th-stage shift register unit is outputted to the data writing circuits of the plurality of sub-pixel driving circuits of the pixel regions of the (M)th line of repeating units as a scanning driving signal, and is outputted to the sensing circuits of the plurality of sub-pixel driving circuits of the pixel regions of the (M−1)th line of repeating units as a sensing driving signal; and the second gate line is connected with sensing circuits of the plurality of sub-pixel driving circuits of the pixel regions of the (M)th line of repeating units extending in the first direction, data writing circuits of a plurality of sub-pixel driving circuits of pixel regions of a (M+1)th line of repeating units extending in the first direction, and an output terminal of a (M+1)th-stage shift register unit, so that a gate scanning signal output from the output terminal of the (M+1)th-stage shift register unit is outputted to the data writing circuits of the plurality of sub-pixel driving circuits of the pixel regions of the (M+1)th line of repeating units as a scanning driving signal, and is outputted to the sensing circuits of the plurality of sub-pixel driving circuits of the pixel regions of the (M)th line of repeating units as a sensing driving signal, wherein 1<M<N, and M is an integer.

For example, in the display substrate provided by at least one embodiment of the present disclosure, the data writing circuit comprises a data writing transistor, the driving circuit comprises a driving transistor, and the sensing circuit comprises a sensing transistor; and an active layer of the data writing transistor, an active layer of the driving transistor, and an active layer of the sensing transistor respectively extend along the second direction, and the base substrate is a flexible substrate.

For example, the display substrate provided by at least one embodiment of the present disclosure further comprises a semiconductor layer, a first conductive layer, a second conductive layer, a second insulating layer, and a fourth insulating layer located on the base substrate; the second conductive layer is located on a side of the semiconductor layer away from the base substrate, the fourth insulating layer is located between the second conductive layer and the semiconductor layer, the first conductive layer is located on a side of the second conductive layer away from the base substrate, and the second insulating layer is located between the second conductive layer and the first conductive layer; the semiconductor layer comprises the active layer of the data writing transistor, the active layer of the driving transistor, and the active layer of the sensing transistor; each of the plurality of power supply lines comprises a first sub-line located in the second conductive layer and a second sub-line located in the first conductive layer, the first sub-line comprises a plurality of first wiring segments arranged along the second direction, the plurality of first wiring segments are located in each of the repeating units, and the second sub-line passes through the display region; and the second sub-line is stacked on a side of the first sub-line away from the base substrate, and is connected with the first sub-line through at least one first via penetrating through the second insulating layer.

For example, in the display substrate provided by at least one embodiment of the present disclosure, each of the plurality of sensing signal lines comprises a third sub-line located in the second conductive layer and a fourth sub-line located in the first conductive layer, the third sub-line comprises a plurality of second wiring segments arranged along the second direction, the plurality of second wiring segments are located in each of the repeating units, and the fourth sub-line passes through the display region; and the fourth sub-line is stacked on a side of the third sub-line away from the base substrate, and is connected with the third sub-line through at least one second via penetrating through the second insulating layer.

For example, in the display substrate provided by at least one embodiment of the present disclosure, the display region comprises a first repeating unit and a second repeating unit that are adjacently arranged along the first direction, one of the plurality of sensing signal lines is provided between a pixel region of the first repeating unit and a transparent region of the second repeating unit, and the one of the plurality of sensing signal lines is connected with a plurality of sub-pixel driving circuits of pixel regions of the first repeating unit and the second repeating unit; one of the plurality of power supply lines is provided on a side of a pixel region of the second repeating unit away from a transparent region of the second repeating unit, the one of the plurality of power supply lines is connected with a plurality of sub-pixel driving circuits of the pixel region of the second repeating unit, another of the plurality of power supply lines is provided on a side of a transparent region of the first repeating unit away from the pixel region of the first repeating unit, and the another of the plurality of power supply lines is connected with a plurality of sub-pixel driving circuits of the pixel region of the first repeating unit; the plurality of sub-pixel driving circuits in the pixel region of the first repeating unit and the plurality of sub-pixel driving circuits in the pixel region of the second repeating unit respectively comprise a first sub-pixel driving circuit, a second sub-pixel driving circuit, and a third sub-pixel driving circuit that are arranged in the first direction; the first conductive layer comprises a first transition electrode extending along the first direction, and a first electrode and a second electrode of the sensing transistor, a first terminal of the first transition electrode is connected with the first electrode of the sensing transistor of the third sub-pixel driving circuit of the first repeating unit, and a second terminal of the first transition electrode is connected with the first electrode of the sensing transistor of the first sub-pixel driving circuit of the second repeating unit; and the first transition electrode intersects with the second sub-line of the sensing signal line so as to be connected with the second sub-line of the sensing signal line.

For example, in the display substrate provided by at least one embodiment of the present disclosure, the second conductive layer comprises a first connection line extending along the first direction; and the first connection line is connected with first electrodes of sensing transistors of the first sub-pixel driving circuit, the second sub-pixel driving circuit, and the third sub-pixel driving circuit of the first repeating unit or the second repeating unit through at least part of a third via; and at least part of each of orthographic projections of the first electrodes of the sensing transistors of the first sub-pixel driving circuit, the second sub-pixel driving circuit, and the third sub-pixel driving circuit on a main surface of the base substrate overlaps with an orthographic projection of the first connection line on the main surface of the base substrate.

For example, in the display substrate provided by at least one embodiment of the present disclosure, the first electrode of the sensing transistor comprises a first sub-portion and a second sub-portion connected with each other along the second direction; a part of the third via is configured to penetrate through the second insulating layer and the fourth insulating layer to expose the active layer of the sensing transistor, another part of the third via is configured to penetrate through the second insulating layer to expose the first connection line; and the first sub-portion is in contact with the active layer of the sensing transistor, and the second sub-portion is in contact with the first connection line.

For example, in the display substrate provided by at least one embodiment of the present disclosure, the charge storage circuit comprises a storage capacitor, the semiconductor layer further comprises a first electrode plate of the storage capacitor, and the first conductive layer further comprises a second electrode plate of the storage capacitor; and the second electrode of the sensing transistor is connected with an end of the second electrode plate close to the sensing transistor, and the second electrode of the sensing transistor and the second electrode plate are integral with each other.

For example, in the display substrate provided by at least one embodiment of the present disclosure, in the second direction, the data writing transistor and the driving transistor are located on a side of the storage capacitor away from the sensing transistor, and the driving transistor is located between the data writing transistor and the storage capacitor; the first conductive layer further comprises a first electrode and a second electrode of the data writing transistor, a first electrode and a second electrode of the driving transistor, a second transition electrode and a third transition electrode, and each of the second transition electrode and the third transition electrode comprises the third node; the second electrode of the driving transistor is located on a side of the driving transistor away from the storage capacitor; one end of the second transition electrode is connected with the second electrode of the driving transistor of the third sub-pixel driving circuit of the second repeating unit, and the other end of the second transition electrode is connected with one of the plurality of power supply lines close to the third sub-pixel driving circuit of the second repeating unit; and one end of the third transition electrode is connected with the second electrode of the driving transistor of the first sub-pixel driving circuit of the first repeating unit, and the other end of the third transition electrode is connected with another one of the plurality of power supply lines close to the transparent region of the first repeating unit.

For example, in the display substrate provided by at least one embodiment of the present disclosure, the second conductive layer comprises a second connection line extending along the first direction; the second connection line is connected with second electrodes of driving transistors of the first sub-pixel driving circuit, the second sub-pixel driving circuit, and the third sub-pixel driving circuit of the first repeating unit or the second repeating unit through at least part of a fourth via; and at least part of each of orthographic projections of the second electrodes of the driving transistors of the first sub-pixel driving circuit, the second sub-pixel driving circuit, and the third sub-pixel driving circuit on the main surface of the base substrate overlaps with an orthographic projection of the second connection line on the main surface of the base substrate.

For example, in the display substrate provided by at least one embodiment of the present disclosure, the first electrode of the driving transistor is connected with an end of the second electrode plate of the storage capacitor away from the sensing transistor, the first electrode of the driving transistor and the second electrode plate are integral with each other; and the first electrode plate of the storage capacitor is connected with the active layer of the driving transistor, and the first electrode plate of the storage capacitor and the active layer of the driving transistor are integral with each other.

For example, in the display substrate provided by at least one embodiment of the present disclosure, each of the first electrode plate and the second electrode plate of the storage capacitor is a strip extending along the second direction; the display substrate further comprises a filter layer, and the filter layer is located on a side of the light-emitting element away from the base substrate; the filter layer comprises a first sub-pixel filter region, a second sub-pixel filter region, and a third sub-pixel filter region; in each of the plurality of repeating units, the first sub-pixel filter region, the second sub-pixel filter region, and the third sub-pixel filter region are sequentially arranged along the second direction, and the second sub-pixel filter region is located between the first sub-pixel filter region and the third sub-pixel filter region; an orthographic projection of the first sub-pixel filter region on the main surface of the base substrate overlaps with an orthographic projection of at least part of the sensing transistor of the sub-pixel driving circuits in the pixel region on the main surface of the base substrate, and further overlaps with an orthographic projection of a part of the storage capacitor close to the sensing transistor on the main surface of the base substrate; an orthographic projection of the third sub-pixel filter region on the main surface of the base substrate overlaps with an orthographic projection of at least part of the data writing transistor and the driving transistor of the sub-pixel driving circuits in the pixel region on the main surface of the base substrate, and further overlaps with an orthographic projection of a part of the storage capacitor close to the driving transistor on the main surface of the base substrate; and an orthographic projection of the second sub-pixel filter region on the main surface of the base substrate overlaps with an orthographic projection of a part, which is in middle of the storage capacitor in the first direction, of the storage capacitor of the sub-pixel driving circuits in the pixel region on the main surface of the base substrate.

For example, the display substrate provided by at least one embodiment of the present disclosure further comprises a third insulating layer and a pixel defining layer; the third insulating layer is located on a side of the first conductive layer away from the base substrate, the light-emitting element is located on a side of the third insulating layer away from the base substrate, the light-emitting element of each of the plurality of sub-pixels comprises a first electrode, a second electrode, and a light-emitting layer located between the first electrode and the second electrode, and the pixel defining layer is configured to define a light-emitting region of the light-emitting element; a plurality of light-emitting elements of each of the plurality of repeating units comprise a first light-emitting element, a second light-emitting element, and a third light-emitting element; the first light-emitting element, the second light-emitting element, and the third light-emitting element are provided to respectively correspond to the first sub-pixel filter region, the second sub-pixel filter region, and the third sub-pixel filter region; the display substrate further comprises a fifth via, a sixth via, and a seventh via that penetrate through at least the third insulating layer, and the fifth via, the sixth via, and the seventh via are respectively configured to expose the first sub-pixel driving circuit, the second sub-pixel driving circuit, and the third sub-pixel driving circuit; and the first electrode of the first light-emitting element is connected with the first sub-pixel driving circuit through the fifth via, the first electrode of the second light-emitting element is connected with the second sub-pixel driving circuit through the sixth via, and the first electrode of the third light-emitting element is connected with the third sub-pixel driving circuit through the seventh via.

For example, in the display substrate provided by at least one embodiment of the present disclosure, an orthographic projection of the fifth via on the main surface of the base substrate does not overlap with an orthographic projection of the light-emitting region of the first light-emitting element on the main surface of the base substrate; an orthographic projection of the sixth via on the main surface of the base substrate does not overlap with an orthographic projection of the light-emitting region of the second light-emitting element on the main surface of the base substrate; and an orthographic projection of the seventh via on the main surface of the base substrate does not overlap with an orthographic projection of the light-emitting region of the third light-emitting element on the main surface of the base substrate.

For example, the display substrate provided by at least one embodiment of the present disclosure further comprises a black matrix; in the pixel region of each of the plurality of repeating units, the black matrix comprises a plurality of light-shielding bars respectively extending along the first direction; at least part of orthographic projections of the plurality of light-shielding bars on the main surface of the base substrate respectively overlap with an interval between the first sub-pixel filter region and the second sub-pixel filter region in the second direction and an interval between the second sub-pixel filter region and the third sub-pixel filter region in the second direction; orthographic projections of the fifth via and the sixth via on the main surface of the base substrate are close to an orthographic projection of the light-shielding bar, which is between the first sub-pixel filter region and the second sub-pixel filter region, on the main surface of the base substrate, and are respectively located on two sides of the orthographic projection of the light-shielding bar, which is between the first sub-pixel filter region and the second sub-pixel filter region, on the main surface of the base substrate; and an orthographic projection of the seventh via on the main surface of the base substrate is close to an orthographic projection of the light-shielding bar, which is between the second sub-pixel filter region and the third sub-pixel filter region, on the main surface of the base substrate, and overlaps with the third sub-pixel filter region.

For example, in the display substrate provided by at least one embodiment of the present disclosure, in a pixel region of each of the plurality of repeating units, the black matrix comprises a plurality of light-shielding bars extending along the first direction; at least part of orthographic projections of the plurality of light-shielding bars on the main surface of the base substrate respectively overlap with an interval between the first sub-pixel filter region and the second sub-pixel filter region in the second direction and an interval between the second sub-pixel filter region and the third sub-pixel filter region in the second direction; an orthographic projection of the fifth via on the main surface of the base substrate overlaps with an orthographic projection of an end of the first electrode plate of the storage capacitor of the first sub-pixel driving circuit, which is connected with the second electrode of the sensing transistor, on the main surface of the base substrate; an orthographic projection of the sixth via on the main surface of the base substrate is close to an orthographic projection of the light-shielding bar, which is between the first sub-pixel filter region and the second sub-pixel filter region, on the main surface of the base substrate, and overlaps with the second sub-pixel filter region; and an orthographic projection of the seventh via on the main surface of the base substrate is close to an orthographic projection of the light-shielding bar, which is between the second sub-pixel filter region and the third sub-pixel filter region, on the main surface of the base substrate, and overlaps with the third sub-pixel filter region.

For example, the display substrate provided by at least one embodiment of the present disclosure further comprises a plurality of data lines; the plurality of data lines respectively extending along the second direction, and the plurality of data lines comprise a first data line, a second data line, and a third data line provided in each of the plurality of repeating units; the first data line and the second data line are located between the first sub-pixel driving circuit and the second sub-pixel driving circuit, and the third data line is located between the second sub-pixel driving circuit and the third sub-pixel driving circuit; the first data line, the second data line, and the third data line are electrically connected with the first sub-pixel driving circuit, the second sub-pixel driving circuit, and the third sub-pixel driving circuit, respectively, to provide a data signal; the first conductive layer further comprises a fourth transition electrode, a fifth transition electrode, and a sixth transition electrode arranged along the first direction; the fourth transition electrode is connected with the first data line and the second electrode of the data writing transistor of the first sub-pixel driving circuit; the fifth transition electrode is connected with the second data line and the second electrode of the data writing transistor of the second sub-pixel driving circuit; and the sixth transition electrode is connected with the third data line and the second electrode of the data writing transistor of the third sub-pixel driving circuit.

For example, in the display substrate provided by at least one embodiment of the present disclosure, the first gate line and the second gate line are located in the second conductive layer, the first gate line is close to sensing transistors of the first repeating unit and the second repeating unit, and the second gate line is close to data writing transistors of the first repeating unit and the second repeating unit; the first gate line comprises a fold line portion, the fold line portion comprises a first fold line portion extending along the first direction, and a second fold line portion and a third fold line portion that are respectively connected with two ends of the first fold line portion and extend along the second direction, and the first fold line portion, the second fold line portion, and the third fold line portion bypass the first connection line; and an orthographic projection of the first fold line portion on the main surface of the base substrate overlaps with orthographic projections of the active layers of the sensing transistors of the first sub-pixel driving circuit, the second sub-pixel driving circuit, and the third sub-pixel driving circuit on the main surface of the base substrate, and overlapping portions respectively form gate electrodes of the sensing transistors.

For example, in the display substrate provided by at least one embodiment of the present disclosure, in the second direction, a portion of the first gate line that is routed with the first connection line side by side, is located on a side of the first connection line close to the transparent region of the second repeating unit.

For example, in the display substrate provided by at least one embodiment of the present disclosure, the second conductive layer further comprises a third connection line, a fourth connection line, and a fifth connection line; each of the third connection line, the fourth connection line, and the fifth connection line is roughly "L" shaped fold line, the fourth connection line and the fifth connection line have the same bending direction, and a bending direction of the third connection line is opposite to a bending direction of the fourth connection line and the fifth connection line; and the third connection line is connected with the second gate line and a gate electrode of the data writing transistor of the first sub-pixel driving circuit, the fourth connection line is connected with the second gate line and a gate electrode of the data writing transistor of the second sub-pixel driving circuit, and the fifth connection line is connected with the second gate line and a gate electrode of the data writing transistor of the third sub-pixel driving circuit.

For example, in the display substrate provided by at least one embodiment of the present disclosure, the first conductive layer comprises a seventh transition electrode, an eighth transition electrode, and a ninth transition electrode respectively extending along the second direction; orthographic projections of the seventh transition electrode, the eighth transition electrode, and the ninth transition electrode on the main surface of the base substrate overlap with an orthographic projection of the second connection line on the main surface of the base substrate; a first end of the seventh transition electrode is connected with a gate electrode of the driving transistor of the first sub-pixel driving circuit through at least part of an eighth via penetrating through the second insulating layer, and a second end of the seventh transition electrode is connected with the first electrode of the data writing transistor of the first sub-pixel driving circuit; a first end of the eighth transition electrode is connected with a gate electrode of the driving transistor of the second sub-pixel driving circuit through at least part of a ninth via penetrating through the second insulating layer, and a second end of the eighth transition electrode is connected with the first electrode of the data writing transistor of the second sub-pixel driving circuit; and a first end of the ninth transition electrode is connected with a gate electrode of the driving transistor of the third sub-pixel driving circuit through at least part of a tenth via penetrating through the second insulating layer, and a second end of the ninth transition electrode is connected with the first electrode of the data writing transistor of the third sub-pixel driving circuit.

At least one embodiment of the present disclosure provides a display device, comprising the display substrate as described above.

BRIEF DESCRIPTION OF THE DRAWINGS

In order to clearly illustrate the technical solution of the embodiments of the present disclosure, the drawings of the embodiments will be briefly described. It is obvious that the described drawings in the following are only related to some embodiments of the present disclosure and thus are not limitative of the present disclosure.

DETAILED DESCRIPTION

Figure 1:
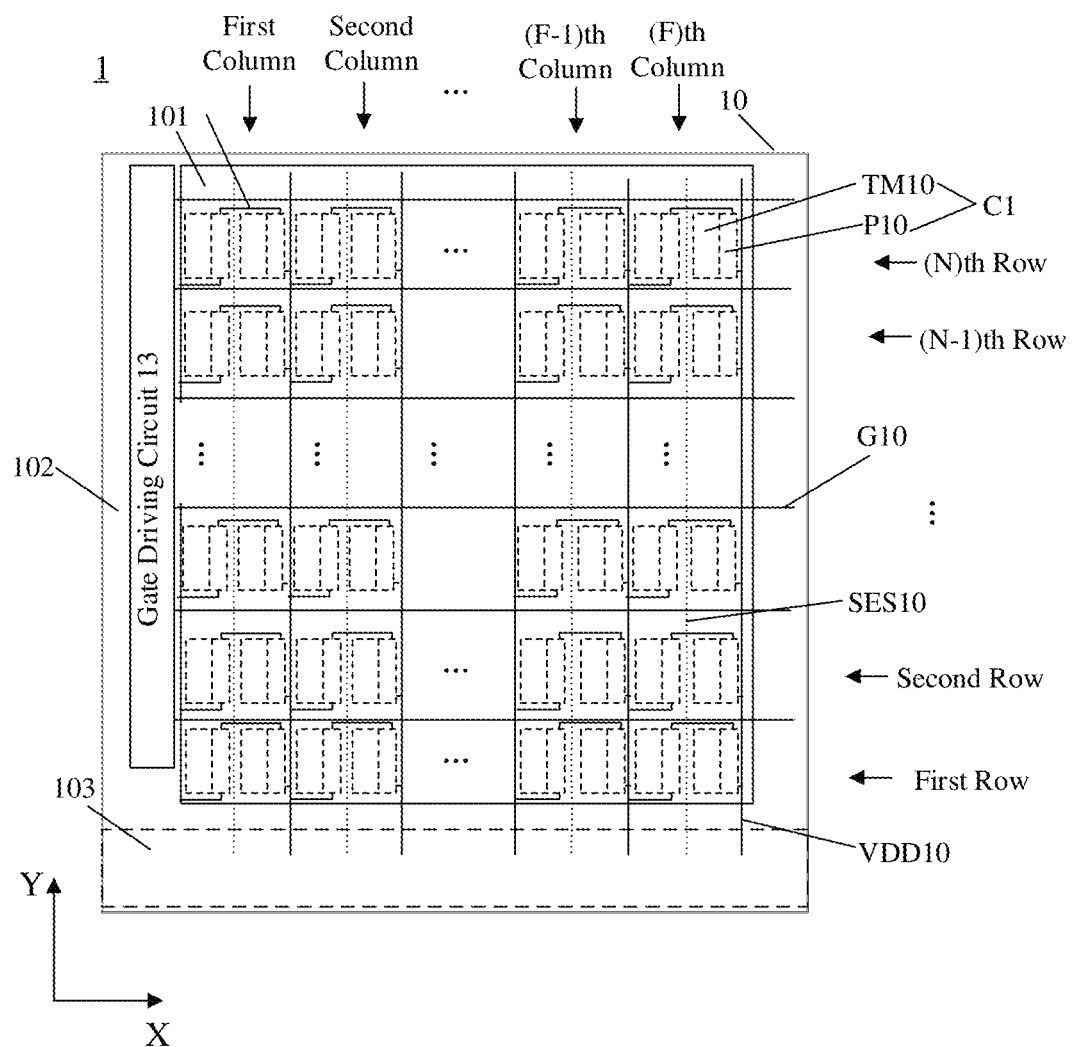
FIG. 1 is a schematic view of a display substrate provided by at least one embodiment of the present disclosure.

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Hereinafter, the present disclosure will be described by several specific embodiments. In order to keep the following description of the embodiments of the present disclosure clear and concise, detailed descriptions of known functions and known components may be omitted. In the case where any component of the embodiments of the present disclosure is illustrated in more than one drawing, the component is represented by the same reference number in each drawing.

At present, a common large-size transparent display resolution on the market is about 40 PPI, and there are few high-PPI products. A bottleneck of current large-size and high-PPI transparent display device is that as the PPI increases, the pixel size becomes smaller, the metal wiring density becomes larger, but the metal wiring density cannot be made too large. Moreover, because the top-emitting white light OLED uses a transparent cathode with a relatively large resistance, an auxiliary cathode must be provided to reduce the resistance drop (IR Drop) of wirings, so the conventional auxiliary cathode also occupies an area of a transparent region of the transparent display device. All of the above reasons may cause the area of the transparent region to be reduced, which will affect the transmittance. At the same time, a small aperture diffraction effect is more likely to occur, which is reflected in the actual experience is that the object seen through the transparent display device has a ghost phenomenon, which seriously affects the user experience. How to increase the area of the transparent region as much as possible under the premise of high PPI is a key to the design of the current transparent display device.

At least one embodiment of the present disclosure provides a display substrate including a base substrate and a light-shielding layer. The base substrate includes a display region, and the display region includes a plurality of repeating units arranged in array. Each of the plurality of repeating units includes a transparent region and a pixel region which are arranged in a first direction, and the pixel region includes a plurality of sub-pixels. Each of the plurality of sub-pixels includes a sub-pixel driving circuit and a light-emitting element, and the light-emitting element is located on a side of the sub-pixel driving circuit away from the base substrate. The sub-pixel driving circuit is configured to drive the light-emitting element to emit light, and the light-emitting element includes a first electrode, a second electrode, and a light-emitting layer located between the first electrode and the second electrode. The light-shielding layer is provided on the base substrate and located on a side of the sub-pixel driving circuit close to the base substrate, at least part of an orthographic projection of the light-shielding layer on a main surface of the base substrate overlaps with an orthographic projection of the sub-pixel driving circuit on the main surface of the base substrate, and the light-shielding layer is connected with the second electrode so as to be multiplexed as an auxiliary electrode of the second electrode.

At least one embodiment of the present disclosure further provides a display device corresponding to the above-mentioned display substrate.

The display substrate provided by the above-mentioned embodiment of the present disclosure uses the light-shielding layer for preventing light from irradiating on the sub-pixel driving circuit and further enables the light-shielding layer to be connected with the second electrode so that the light-shielding layer is multiplexed as the auxiliary electrode of the second electrode, thereby increasing the area of the transparent region of the display substrate and improving the light transmittance of the display substrate. Moreover, because the resistance of the auxiliary electrode multiplexed by the light-shielding layer is smaller, the effect of preventing the increase of the resistance of the second electrode is more obvious (that is, the effect of reducing the resistance drop is more obvious).

The embodiments of the present disclosure and some examples thereof are described in detail below with reference to the accompanying drawings.

Figure 2:
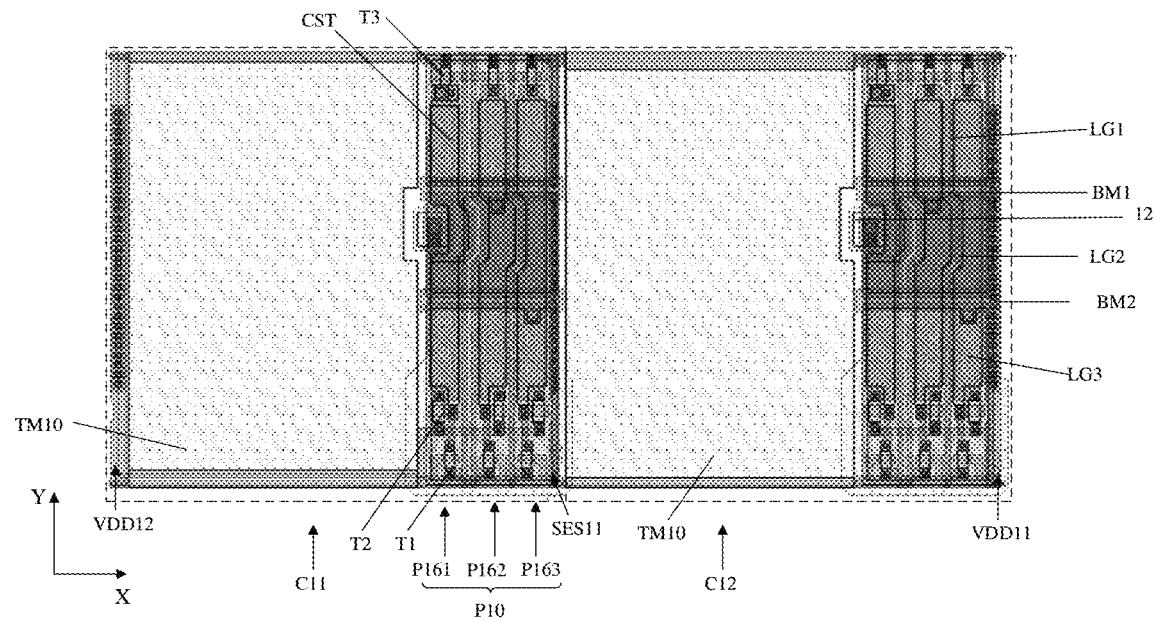
FIG. 2 is a schematic view of a plane layout of a display substrate provided by at least one embodiment of the present disclosure.
Figure 3:
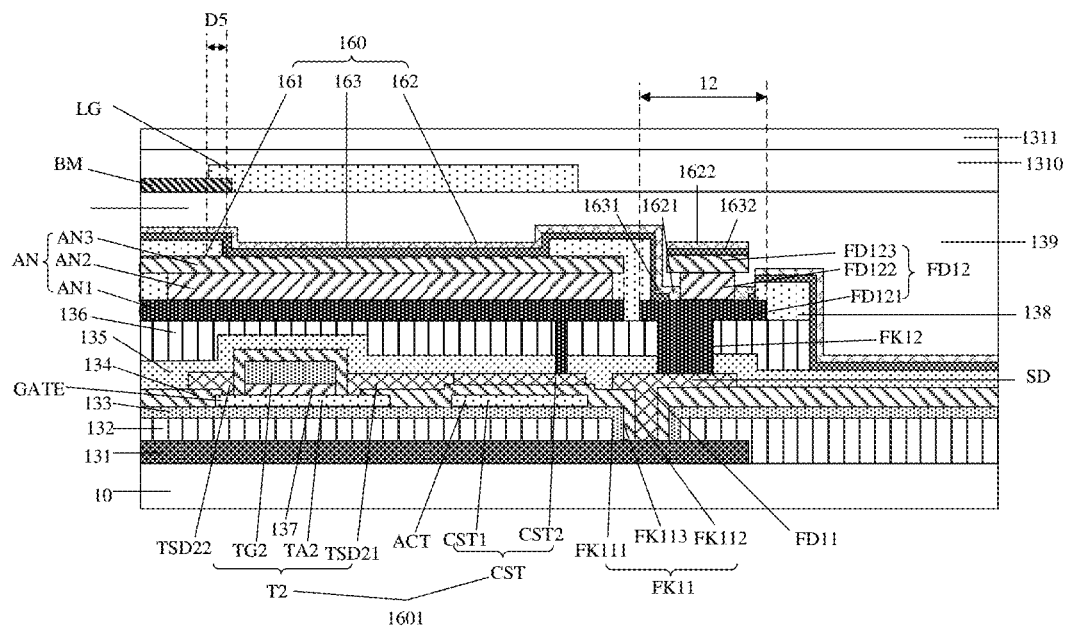
FIG. 3 is a schematic cross-sectional view of a part of the structure of the display substrate as shown in FIG. 2.

FIG. 1 is a schematic view of a display substrate provided by at least one embodiment of the present disclosure. FIG. 2 is a schematic view of a plane layout of the display substrate provided by at least one embodiment of the present disclosure. FIG. 3 is a schematic cross-sectional view of a part of the structure of the display substrate as shown in FIG. 2.

For example, as illustrated in FIG. 1, the display substrate 1 includes a base substrate 10. The base substrate 10 includes a display region 101. The display region 101 includes a plurality of repeating units C1 arranged in array. The plurality of repeating units C1 are arranged in rows and columns along a first direction X and a second direction Y, for example, arranged in a first row to an (N)th row each extending in the first direction X and a first column to a (F)th column each extending in the second direction Y. Each of the plurality of repeating units C1 includes a transparent region TM10 and a pixel region P10 arranged along the first direction X. The pixel region P10 includes a plurality of sub-pixels. For example, the embodiment of the present disclosure takes the case where the pixel region P10 includes three sub-pixels as an example.

For example, the base substrate 10 is a flexible substrate or a rigid substrate. The base substrate 10 is made of, for example, glass, plastic, quartz or other suitable materials, which are not limited in the embodiments of the present disclosure.

For example, as illustrated in FIG. 1, the display substrate 1 includes a plurality of power supply lines VDD10 and a plurality of sensing signal lines SES10. The plurality of power supply lines VDD10 and the plurality of sensing signal lines SES10 are provided on the base substrate 10 and extend in the second direction Y. The plurality of power supply lines VDD10 and the plurality of sensing signal lines SES10 are respectively connected with a plurality of sub-pixels and extend to a bonding region 103 of the display substrate 1. Each power supply line VDD10 is connected with a corresponding column of sub-pixels arranged in the second direction Y and provides a second power supply voltage signal. Each sensing line SES10 is connected with a corresponding column of sub-pixels arranged in the second direction Y and provides a reference voltage signal. The display substrate further includes a gate driving circuit 13 located in a peripheral region 102 and a plurality of gate lines G10, and the plurality of gate lines G10 extend along the first direction X. The gate driving circuit 13 is configured to output a gate scanning signal for driving a plurality of sub-pixel unit circuits to work row by row. Each gate line G10 is connected with the gate driving circuit 13 and a corresponding row of sub-pixels arranged in the first direction X and provides the gate scanning signal for driving the corresponding row of sub-pixels to work.

For example, as illustrated in FIG. 2 and FIG. 3, each of the sub-pixels includes a sub-pixel driving circuit 1601 (for example, a first sub-pixel driving circuit P161, a second sub-pixel driving circuit P162, and a third sub-pixel driving circuit P163) and a light-emitting element 160. The light-emitting element 160 is located on a side of the sub-pixel driving circuit 1601 away from the base substrate 10. The sub-pixel driving circuit 1601 is configured to drive the light-emitting element 160 to emit light. The light-emitting element 160 includes a first electrode 161, a second electrode 162, and a light-emitting layer 163 located between the first electrode 161 and the second electrode 162.

For example, in some embodiments, each sub-pixel driving circuit 1601 includes a pixel circuit having a circuit structure such as 7T1C, 8T2C, 4T1C, or 3T1C in the art. The embodiments of the present disclosure are introduced by taking the pixel circuit including a circuit structure of 3T1C as an example, which is not limited by the embodiments of the present disclosure.

For example, as illustrated in FIG. 2 and FIG. 3, the light-shielding layer 131 is provided on the base substrate 10 and is located on a side of the sub-pixel driving circuit 1601 close to the base substrate 10 to block external light. At least part of an orthographic projection of the light-shielding layer 131 on a main surface (for example, the upper surface of the base substrate 10) of the base substrate 10 overlaps with an orthographic projection of the sub-pixel driving circuit 1601 on the main surface of the base substrate 10. The light-shielding layer 131 is connected with the second electrode 162 so as to be multiplexed as an auxiliary electrode of the second electrode 162. The orthographic projection of the light-shielding layer 131 on the main surface of the base substrate 10 overlaps with the pixel region P10 of the repeating unit C1 and does not overlap with the transparent region TM10 of the repeating unit C1. The light-shielding layer 131 shields the pixel region P10 from light and is multiplexed as the auxiliary electrode of the second electrode 162, thereby increasing the area of the transparent region TM10 of the display substrate 1 and improving the light transmittance of the display substrate 1. Moreover, because the resistance of the auxiliary electrode multiplexed by the light-shielding layer 131 is smaller, the effect of preventing the increase of the resistance of the second electrode 162 is more obvious (that is, the effect of reducing the resistance drop is more obvious).

For example, the material of the light-shielding layer 131 is made of a metal material. For example, the metal material includes silver, aluminum, chromium, copper, molybdenum, titanium, aluminum-neodymium alloy, copper-molybdenum alloy, molybdenum-tantalum alloy, molybdenum-neodymium alloy or any combination thereof.

For example, as illustrated in FIG. 2 and FIG. 3, the pixel region P10 includes an electrode overlapping region 12, and the electrode overlapping region 12 is located on a side of the pixel region P10 close to the transparent region TM10. That is, in one repeating unit C1, the electrode overlapping region 12 is located between the pixel region P10 and the transparent region TM10. An orthographic projection of the electrode overlapping region 12 on the main surface of the base substrate 10 at least partially overlaps with the orthographic projection of the light-shielding layer 131 on the main surface of the base substrate 10; for example, the orthographic projection of the electrode overlapping region 12 on the main surface of the base substrate 10 partially overlaps with the orthographic projection of the light-shielding layer 131 on the main surface of the base substrate 10. The electrode overlapping region 12 includes a first composite hole structure and a first composite connection electrode. The first composite hole structure is configured to expose the light-shielding layer 131. For example, the first composite hole structure includes a first hole FK11 and a second hole FK12. The first composite connection electrode is configured to connect the second electrode 162 and the light-shielding layer 131. For example, the first composite connection electrode includes a first connection electrode FD11 and a second connection electrode FD12. The light-shielding layer 131 is connected with the second electrode 162 through the first composite connection electrode and the first composite hole structure, so as to be multiplexed as the auxiliary electrode of the second electrode 162.

Figure 4:
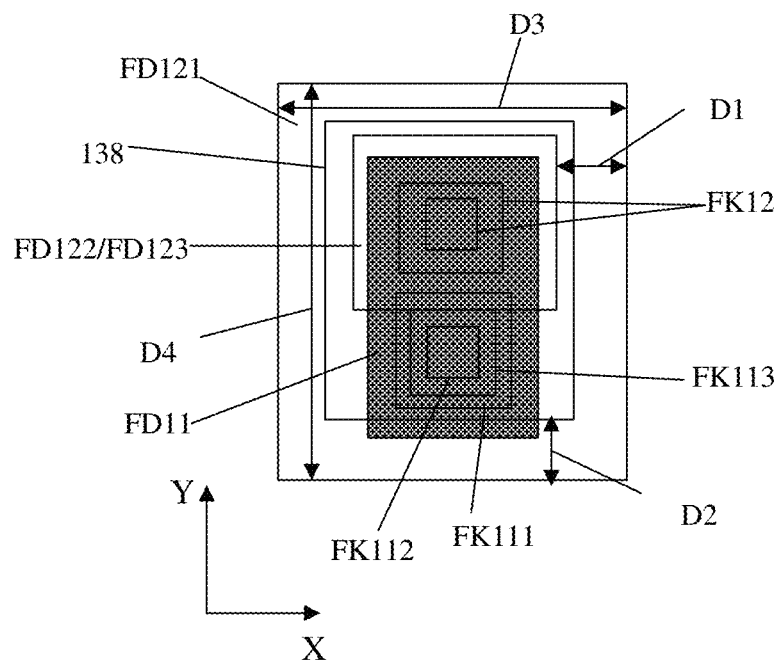
FIG. 4 is a schematic view of a plane layout of an electrode overlapping region in FIG. 3.

FIG. 4 is a schematic view of a plane layout of the electrode overlapping region in FIG. 3.

For example, as illustrated in FIG. 3 and FIG. 4, the first composite connection electrode includes the first connection electrode FD11 and the second connection electrode FD12. The first connection electrode FD11 is located on a side of the second connection electrode FD11 close to the base substrate 11. The first composite hole structure includes the first hole FK11 and the second hole FK12, and the first hole FK11 is located on a side of the second hole FK12 close to the base substrate 10. The first connection electrode FD11 is connected with the light-shielding layer 131 through the first hole FK11, and the second connection electrode FD12 is connected with the first connection electrode FD11 through the second hole FK12. The second connection electrode FK12 is further connected with the second electrode 162. For example, the second connection electrode FK12 is indirectly connected with the second electrode 162. The second connection electrode FK12 is separated from the second electrode 162 by the light-emitting layer 163, that is, the second connection electrode FK12 is (for example, partially) is connected with the second electrode 162 through the light-emitting layer 163.

For example, in other embodiments, the second connection electrode FK12 is directly connected with the second electrode 162.

Figure 8A:
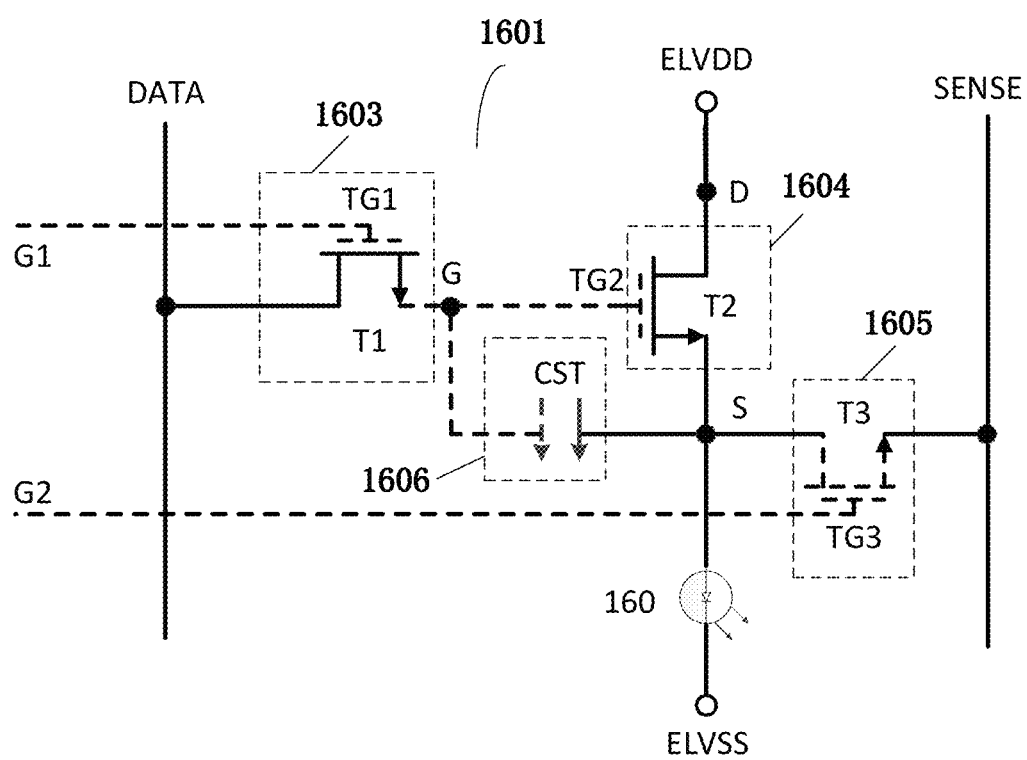
FIG. 8A is a circuit diagram of a sub-pixel driving circuit provided by at least one embodiment of the present disclosure.

FIG. 8A is a circuit diagram of a sub-pixel driving circuit provided by at least one embodiment of the present disclosure.

For example, as illustrated in FIG. 8A, the sub-pixel driving circuit 1601 adopts a pixel circuit having a circuit structure with 3T1C in the art. For example, the sub-pixel driving circuit 1601 includes a data writing transistor T1, a driving transistor T2, a sensing transistor T3, and a storage capacitor CST.

For example, in some embodiments, as illustrated in FIG. 3, the display substrate further includes a first insulating layer 132 (for example, serving as a barrier layer), a second insulating layer 134 (for example, serving as an interlayer insulating layer), a first conductive layer SD, a third insulating layer 136 (for example, serving as a planarization layer), and a first electrode layer AN. The first insulating layer 132 is used to provide a flat surface for forming the sub-pixel driving circuit 1601, and prevents impurities that may exist in the base substrate 10 from diffusing into the sub-pixel driving circuit or the gate driving circuit 13 to affect the performance of the display substrate. The thickness of the first insulating layer 132 is designed to avoid the parasitic capacitance between the light-shielding layer 131 and other layers.

For example, the material of the first insulating layer 132 include inorganic insulating materials such as silicon oxide, silicon nitride, silicon oxynitride, or other suitable materials.

For example, the first insulating layer 132 is located on a side of the light-shielding layer 131 away from the base substrate 10. The second insulating layer 134 is located on a side of the first insulating layer 132 away from the base substrate 10, the first conductive layer SD is located on a side of the second insulating layer 134 away from the base substrate 10, the third insulating layer 136 is located on a side of the first conductive layer SD away from the base substrate 10, and the first electrode layer AN is located on a side of the third insulating layer 136 away from the base substrate 10. For example, the first electrode layer AN is the layer where the first electrode 162 of the light-emitting element 160 is located, and the first conductive layer SD is the layer where a first electrode TSD22 (for example, a source electrode) and a second electrode TSD21 (for example, a drain electrode) of the driving transistor T2 are located.

For example, the materials of the first insulating layer 132 and the second insulating layer 134 include inorganic insulating materials such as silicon oxide, silicon nitride, silicon oxynitride, or other suitable materials.

For example, the material of the first conductive layer SD includes a metal material or an alloy material, such as a metal single-layer or multi-layer structure formed of molybdenum, aluminum, titanium, etc.; for example, the multi-layer structure is a structure in which multiple metal layers are stacked (such as three-layer metal stack of titanium, aluminum and titanium (Ti/Al/Ti)). The embodiments of the present disclosure do not specifically limit the material of each functional layer.

For example, the material of the third insulating layer 136 includes inorganic insulating materials such as silicon oxide, silicon nitride, silicon oxynitride, etc., or includes organic insulating materials such as polyimide, polyphthalimide, polyphthalamide, acrylic resin, benzo cyclobutene or phenolic resin, which are not limited in the embodiments of the present disclosure.

For example, in some embodiments, as illustrated in FIG. 3 and FIG. 4, the first hole FK11 includes a first sub-hole FK111 that penetrates the first insulating layer 132 and a second sub-hole FK112 that penetrates the second insulating layer 134. The second sub-hole FK112 is nested in the first sub-hole FK111, that is, an orthographic projection of the second sub-hole FK112 on the main surface of the base substrate 10 is located in an orthographic projection of the first sub-hole FK111 on the main surface of the base substrate 10. The first sub-hole FK111 and the second sub-hole FK112 are provided to expose the light-shielding layer 131. The first connection electrode FD11 is located on a side of the second insulating layer 134 away from the base substrate 10. The second hole FK12 penetrates the third insulating layer 136 to expose the first connection electrode FD11. The first conductive layer SD includes the first connection electrode FD11. The first electrode layer AN includes the second connection electrode FD12 and the first electrode 161 of the light-emitting element 160. The first electrode 161 and the second connection electrode FD12 are provided in the same layer and with the same material, and the first electrode 161 and the second connection electrode FD12 are spaced apart from each other. That is, although the first electrode 161 and the second connection electrode FD12 are provided in the same layer and with the same material, for example, prepared through the same process, the first electrode 161 and the second connection electrode FD12 are disconnected from each other and are not connected with each other. The second connection electrode FD12 is configured to be connected with the second electrode 162 of the light-emitting element and the first connection electrode FD11. The first electrode 161 and the second connection electrode FD12 are prepared in the same layer, which can reduce the patterning process and the thickness of the display substrate.

For example, in some embodiments, as illustrated in FIG. 3 and FIG. 4, the display substrate further includes a buffer layer 133. The buffer layer 133 is located between the first insulating layer 132 and the second insulating layer 134, and the first hole FK11 further includes a third sub-hole FK113. The third sub-hole FK113 is nested between the first sub-hole FK111 and the second sub-hole FK112. The third sub-hole FK113 penetrates the buffer layer 133 and is provided to expose the light-shielding layer 131. An orthographic projection of the third sub-hole FK113 on the main surface of the base substrate 10 is located in the orthographic projection of the first sub-hole FK111 on the main surface of the base substrate 10. The first hole FK11 is a composite hole formed by the third sub-hole FK113, the first sub-hole FK111 and the second sub-hole FK112.

For example, the material of the buffer layer includes inorganic insulating materials such as silicon oxide, silicon nitride, silicon oxynitride, or other suitable materials.

For example, in other embodiments, after the second insulating layer 134 is formed on the display substrate, the second sub-hole FK112 is firstly formed by etching, and then the third sub-hole FK113 is formed by etching. In this case, the size of the second sub-hole FK112 is substantially the same as the size of the third sub-hole FK113. The second insulating layer 134 is not in contact with the third sub-hole FK113.

For example, as illustrated in FIG. 3 and FIG. 4, the display substrate further includes a passivation layer 135. The passivation layer 135 is located between the third insulating layer 136 and the first conductive layer SD (including first connection electrode FD11). The second hole FK12 further penetrates the passivation layer 135. The passivation layer 135 protects the first conductive layer SD from being corroded by water vapor.

For example, the material of the passivation layer 135 includes organic insulating materials or inorganic insulating materials, for example, silicon nitride material. Because of high dielectric constant and good hydrophobic function, silicon nitride material well protects the sub-pixel driving circuit from being corroded by water vapor.

For example, in some embodiments, as illustrated in FIG. 4, a width of the second sub-hole FK112 and a width of the third sub-hole FK113 in the first direction X is about 3.5-4.5 μm, for example, about 4 μm. For example, a width of the first sub-hole FK111 in the first direction X is about 7.5-8.5 μm, for example, about 8 μm. For example, a width of the second hole FK12 in the first direction X is about 6.5-7.5 μm, for example, about 7 μm. For example, the sizes of the third sub-hole FK113 and the second sub-hole FK112 may be equal or unequal to each other. The sizes of the first sub-hole FK111, the second sub-hole FK112, the third sub-hole FK113, and the second hole FK12 are selected depending on the display substrate during the manufacturing process, and the embodiments of the present disclosure are not limited thereto.

It should be noted that in the embodiments of the present disclosure, "about" means that a value fluctuates within a range of, for example, ±15% or ±5% of the value.

For example, in some embodiments, as illustrated in FIG. 3, the first electrode layer AN includes a first layer AN1, a second layer AN2, and a third layer AN3. The first layer AN1 is located on a side of the third insulating layer 136 away from the base substrate 10, the third layer AN3 is located on a side of the first layer AN1 away from the base substrate 10, and the second layer AN2 is located between the first layer AN1 and the third layer AN3. The first electrode 161 of the light-emitting element 160 has three layers arranged in the same layer as the first layer AN1, the second layer AN2, and the third layer AN3, respectively, and the cross-section of the first electrode 161 is an I-shape. For example, the second electrode 162 is provided in a part or an entirety of the display region 101, so that the second electrode 162 is formed on an entirety of the base substrate 10 during the manufacturing process.

For example, the first electrode 161 of the light-emitting element includes a reflective layer, and the second electrode 162 of the light-emitting element includes a transparent layer or a semi-transparent layer. Thus, the first electrode 161 reflects a light emitted from the light-emitting layer 163, and the light is emitted into the external environment through the second electrode 162, so that the light emission efficiency is provided. In the case where the second electrode 162 includes a semi-transparent layer, some of the light reflected by the first electrode 161 is reflected again by the second electrode 162, so the first electrode 161 and the second electrode 162 form a resonance structure, so that light emission efficiency is further improved.

For example, the material of the first layer AN1 and the second layer AN2 includes at least one transparent conductive oxide material, such as indium tin oxide (ITO), indium zinc oxide (IZO), zinc oxide (ZnO), and the like. For example, the material of the third layer AN3 includes alloy materials, such as AlNd and the like.

For example, the light-emitting layer 163 includes small molecular organic materials or polymer molecular organic materials, includes fluorescent light-emitting materials or phosphorescent light-emitting materials, and emits red light, green light, blue light, or white light; and, as required, the light-emitting layer further includes functional layers such as an electron injection layer, an electron transport layer, a hole injection layer, and a hole transport layer. For QLEDs, the light-emitting layer for example includes quantum dot materials, for example, silicon quantum dots, germanium quantum dots, cadmium sulfide quantum dots, cadmium selenide quantum dots, cadmium telluride quantum dots, zinc selenide quantum dots, lead sulfide quantum dots, lead selenide quantum dots, indium phosphide quantum dots and indium arsenide quantum dots, etc., and the particle size of the quantum dots is 2-20 nm. The embodiments of the present disclosure take the case where the light-emitting layer 163 emits white light as an example.

For example, the second electrode 162 includes various conductive materials. For example, the second electrode 162 includes metal materials such as lithium (Li), aluminum (Al), magnesium (Mg), and silver (Ag). For example, the second electrode 162 adopts a metal having high reflectivity as a reflective layer, such as silver (Ag).

For example, in some embodiments, as illustrated in FIG. 3, the second connection electrode FD12 includes a first sub-electrode layer FD121, a second sub-electrode layer FD122, and a third sub-electrode layer FD123 that are stacked sequentially. The first sub-electrode layer FD121 is located on a side of the third sub-electrode layer FD123 close to the base substrate 10, and the second sub-electrode layer FD122 is located between the first sub-electrode layer FD121 and the third sub-electrode layer FD123. The first sub-electrode layer FD121 and the first layer AN1 of the first electrode layer AN are provided in the same layer and with the same material. The second sub-electrode layer FD122 and the second layer AN2 of the first electrode layer AN are provided in the same layer and with the same material. The third sub-electrode layer FD123 and the third layer AN3 of the first electrode layer AN are provided in the same layer and with the same material. In a direction parallel to the main surface of the base substrate 10, at least one side of the first sub-electrode layer FD121 in a circumferential direction protrudes from the second sub-electrode layer FD122. For example, as illustrated in the drawings, the first sub-electrode layer FD121 protrudes from the second sub-electrode layer FD122 in the circumferential direction. An orthographic projection of the second sub-electrode layer FD122 on the main surface of the base substrate 10 is located in an orthographic projection of the first sub-electrode layer FD121 on the main surface of the base substrate 10. An orthographic projection of the third sub-electrode layer FD123 on the main surface of the base substrate 10 is located in the orthographic projection of the first sub-electrode layer FD121 on the main surface of the base substrate 10, and an area of the orthographic projection of the first sub-electrode layer FD121 on the main surface of the base substrate 10 is larger than an area of the orthographic projection of the third sub-electrode layer FD123 on the main surface of the base substrate 10. That is, the area of the orthographic projection of the first sub-electrode layer FD121 on the main surface of the base substrate 10 is the largest, the area of the orthographic projection of the third sub-electrode layer FD123 on the main surface of the base substrate 10 is the second, and the area of the orthographic projection of the second sub-electrode layer FD122 on the main surface of the base substrate is the smallest. Thus, the portion of the first sub-electrode layer FD121 protruding from the second sub-electrode layer FD122 is used for being connected with the second electrode 162.

For example, in some embodiments, as illustrated in FIG. 3, the area of the orthographic projection of the second sub-electrode layer FD122 on the main surface of the base substrate 10 is smaller than the area of the orthographic projection of the first sub-electrode layer FD121 on the main surface of the base substrate 10 and the area of the orthographic projection of the third sub-electrode layer FD123 on the main surface of the base substrate 10, respectively. The cross-sections of the first sub-electrode layer FD121, the second sub-electrode layer FD122, and the third sub-electrode layer FD123 constitute an I-shape, and the first sub-electrode layer FD121 is connected with the first connection electrode FD11 through the second hole FK12.

For example, in some embodiments, as illustrated in FIG. 4, a width D3 of the first sub-electrode layer FD121 in the first direction X is about 28-30 μm, for example, about 29 μm. A length D4 of the first sub-electrode layer FD121 in the second direction Y is about 30-31 μm, for example, about 31.5 μm. A distance D1 between an edge of the third sub-electrode layer FD123 (or the second sub-electrode layer FD122) and an edge of the first sub-electrode layer FD121 in the first direction X is about 5.5-6.5 μm, for example, about 6 μm.

For example, in some embodiments, the display substrate 10 further includes a pixel defining layer 138. The pixel defining layer 138 is located on a side of the first electrode 161 away from the base substrate 10. The pixel defining layer 138 includes a plurality of openings, and parts of the plurality of openings define sub-pixels and correspond to the light-emitting regions of the light-emitting elements 160. For example, the light-emitting layer 163 is also formed on an entirety of the base substrate 10 on a side of the second electrode 162 close to the base substrate 10. In the electrode overlapping region 12, the pixel defining layer 138 also has an opening, and the pixel defining layer 138 partially covers the portion of the first sub-electrode layer FD121 protruding from the second sub-electrode layer FD122. For example, the pixel defining layer 138 extends to the portion of the first sub-electrode layer FD121 protruding from the second sub-electrode layer FD122 and covers the edge of the first sub-electrode layer FD121. In this way, the pixel defining layer 138 prevents the light-emitting layer 163 from discharging due to burrs at the edge of the first sub-electrode layer FD121 and avoids corresponding process defects.

For example, in some embodiments, as illustrated in FIG. 4, a distance D2 between an edge of the pixel defining layer 138 and an edge of the first sub-electrode layer FD121 in the second direction Y is about 2.5-3.5 μm, for example, about 3 μm.

For example, in some embodiments, as illustrated in FIG. 3, the light-emitting layer 163 of the light-emitting element 160 is stacked on a side of the pixel defining layer 138 away from the base substrate 10. The light-emitting layer 163 includes a first portion 1631 and a second portion 1632 which are located in the electrode overlapping region 12. The first portion 1631 covers at least part of the portion of the first sub-electrode layer FD121 protruding from the second sub-electrode layer FD122, and the first portion 1631 is in contact with the first sub-electrode layer FD121. The second portion 1632 is located on a side of the third sub-electrode layer FD123 away from the base substrate 10.

For example, in some embodiments, as illustrated in FIG. 3, the second electrode 162 of the light-emitting element 160 includes a first electrode portion 1621 and a second electrode portion 1622 which are located in the electrode overlapping region 12. The first electrode portion 1621 extends to the portion of the first sub-electrode layer FD121 protruding from the second sub-electrode layer FD122, and the first electrode portion 1621 is in contact with the first sub-electrode layer FD121 and the second sub-electrode layer FD122. The second electrode portion FD122 is located on a side of the second portion 1632 of the light-emitting layer 163 away from the base substrate 10. An orthographic projection of the first portion 1631 of the light-emitting layer 163 on the main surface of the base substrate 10 overlaps with at least part of an orthographic projection of the first electrode portion 1621 on the main surface of the base substrate 10. That is, in the region of the first sub-electrode layer FD121 protruding from the second sub-electrode layer FD122, the first electrode portion 1621 is in contact with the first portion 1631 of the light-emitting layer 163, an upper surface of the first sub-electrode layer FD121 (parallel to the main surface of the base substrate 10), and a side surface of the second sub-electrode layer FD122 (perpendicular to the main surface of the base substrate 10).

For example, in some embodiments, the display substrate 10 further includes a semiconductor layer ACT, a fourth insulating layer 137 (for example, serving as a gate insulating layer), and a second conductive layer GATE. The semiconductor layer ACT is located on the side of the buffer layer 133 away from the base substrate 10. The fourth insulating layer 137 is located on a side of the semiconductor layer ACT away from the base substrate 10. The second conductive layer GATE is located between the second insulating layer 134 and the fourth insulating layer 137. The semiconductor layer ACT includes an active layer TA2 of the driving transistor T2. The second conductive layer GATE includes a gate electrode TG2 of the driving transistor T2, and the first conductive layer SD includes a first electrode TSD21 and a second electrode TSD22 of the driving transistor T2. The active layer TA2 includes a source region corresponding to the first electrode TSD21 and a drain region corresponding to the second electrode TSD22. The semiconductor layer ACT further includes a first electrode plate CST1 of the storage capacitor CST, and the first conductive layer SD further includes a second electrode plate CST2 of the storage capacitor CST. The second insulating layer 134 is provided between the first electrode plate CST1 and the second electrode plate CST2. For example, the second electrode plate CST2 is connected with the first electrode TSD21 of the driving transistor T2. For example, the first electrode 161 of the light-emitting element 160 is connected with the first conductive layer through a via hole penetrating the passivation layer 135 and the third insulating layer 136. For example, a portion of the first electrode 161 of the light-emitting element 160 which is in the same layer as the first sub-layer AN1 of the first electrode layer AN is connected with the first electrode TSD21 of the driving transistor T2 through the via hole penetrating the passivation layer 135 and the third insulating layer 136. For example, a portion of the first electrode 161 of the light-emitting element 160 which is in the same layer as the first sublayer AN1 of the first electrode layer AN is connected with the second electrode plate CST2 so as to be connected with the first electrode TSD21 of the driving transistor T2.

For example, in other embodiments, the portion of the first electrode 161 of the light-emitting element 160 which is in the same layer as the first sub-layer AN1 of the first electrode layer AN is directly connected with the first electrode TSD21 of the driving transistor T2. That is, in the cross-sectional view perpendicular to the main surface of the base substrate 10, the first electrode TSD21 of the driving transistor T2 is spaced apart from the first electrode plate CST1 of the storage capacitor CST.

It should be noted that, the cross-sectional structure of other transistor of the sub-pixel driving circuit 160, such as the data writing transistor T1 and the sensing transistor T3 may be the same as the cross-sectional structure of the driving transistor T2, which will not be repeated here.

It should be noted that in the embodiments of the present disclosure, a first electrode represents a source electrode of a transistor, and a second electrode represents a drain electrode of the transistor; or, the first electrode represents the source electrode of the transistor, and the second electrode represents the drain electrode of the transistor. The embodiments of the present disclosure do not specifically limit.

For example, the material of the semiconductor layer ACT includes oxide semiconductor, organic semiconductor or amorphous silicon, polysilicon, etc.; for example, the oxide semiconductor includes a metal oxide semiconductor (such as indium gallium zinc oxide (IGZO)), and the polysilicon includes low-temperature polysilicon or high-temperature polysilicon, etc., which are not limited in the embodiments of the present disclosure. It should be noted that, the source region and the drain region may be regions doped with n-type impurities or p-type impurities, which is not limited in the embodiments of the present disclosure.

For example, the material of the fourth insulating layer 137 includes inorganic insulating materials such as silicon oxide, silicon nitride, silicon oxynitride, or other suitable materials.

For example, the material of the second conductive layer GATE includes a metal material or an alloy material, such as a metal single-layer or multi-layer structure formed by molybdenum, aluminum, and titanium. For example, the multi-layer structure is a structure in which multiple metal layers are stacked (such as three-layer metal stack of titanium, aluminum and titanium (Ti/Al/Ti)).

For example, in some embodiments, the display substrate 10 further includes an encapsulation layer 139. The encapsulation layer 139 is provided on a side of the light-emitting element 160 away from the base substrate 10. The encapsulation layer 139 seals the light-emitting element 160, so that the deterioration of the light-emitting element 160 caused by moisture and/or oxygen included in the environment is reduced or prevented. The encapsulation layer 139 may be a single-layer structure or a composite layer structure, and the composite layer structure includes a stacked structure of an inorganic layer and an organic layer. The encapsulation layer 139 includes at least one encapsulation sub-layer. For example, the encapsulation layer 139 includes a first inorganic encapsulation layer, a first organic encapsulation layer, and a second inorganic encapsulation layer that are sequentially arranged.

For example, the material of the encapsulation layer 139 includes insulating materials such as silicon nitride, silicon oxide, silicon oxynitride, polymer resin, and the like. Inorganic materials such as silicon nitride, silicon oxide, and silicon oxynitride have high density and prevents the intrusion of water, oxygen, etc. The material of the organic encapsulation layer for example is a polymer material containing a desiccant or a polymer material that blocks water vapor, etc. For example, the polymer resin is used to planarize the surface of the display substrate, and relieves the stress of the first inorganic encapsulation layer and the second inorganic encapsulation layer, and also includes water-absorbing materials such as desiccant to absorb substances such as water and oxygen that have entered.

For example, in some embodiments, as illustrated in FIG. 3, the display substrate 1 further includes a filter layer LG and a black matrix BM. The filter layer LG and the black matrix BM are located on the side of the light-emitting element 160 away from the base substrate 10, that is, they are provided on the encapsulation layer 139. The filter layer LG and the black matrix BM for example are partially stacked, and in the stack region of the filter layer LG and the black matrix BM, the black matrix BM is located on a side of the filter layer LG close to the base substrate 10.

Figure 6:
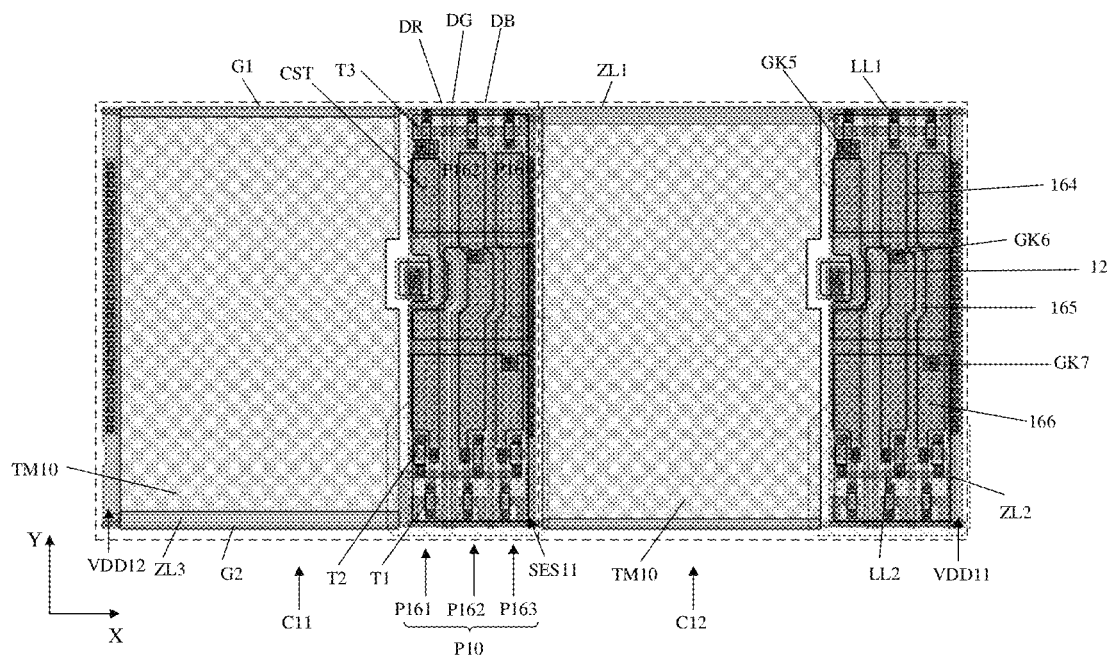
FIG. 6 is a schematic view of a layout of a sub-pixel driving circuit and a light-emitting element of a display substrate provided by at least one embodiment of the present disclosure.
Figure 7:
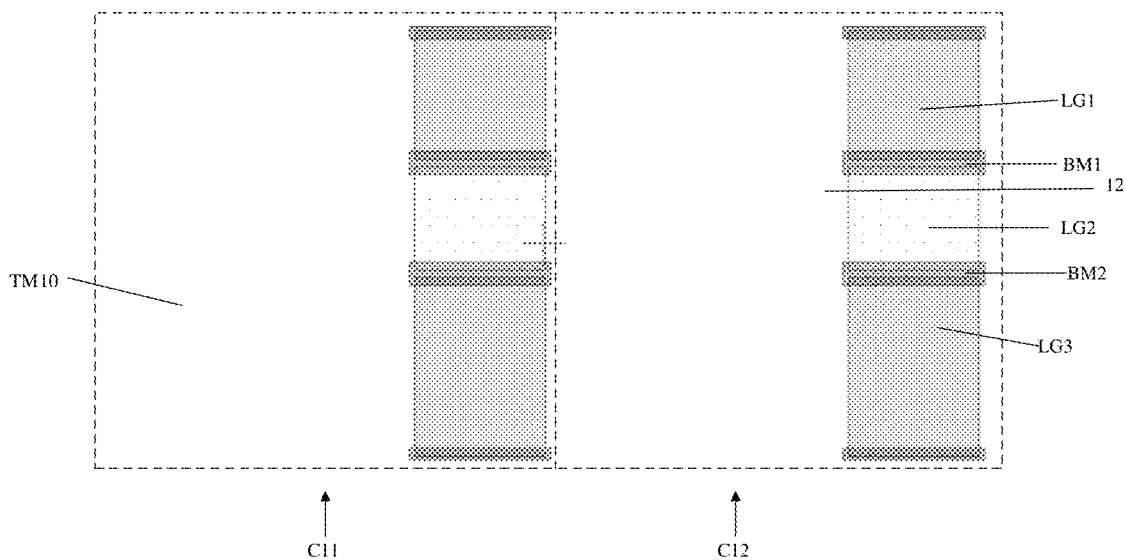
FIG. 7 is a schematic view of a layout of a black matrix and a filter layer of a display substrate provided by at least one embodiment of the present disclosure.

FIG. 6 is a schematic view of a layout of a sub-pixel driving circuit and a light-emitting element of a display substrate provided by at least one embodiment of the present disclosure. FIG. 7 is a schematic view of a layout of a black matrix and a filter layer of a display substrate provided by at least one embodiment of the present disclosure.

For example, in some embodiments, as illustrated in FIG. 6 and FIG. 7, in each pixel region P10, the black matrix BM includes a plurality of light-shielding bars extending along the first direction X (for example, BM1/BM2 illustrated in FIG. 7). The filter layer LG includes a first sub-pixel filter region LG1, a second sub-pixel filter region LG2, and a third sub-pixel filter region LG3. The first sub-pixel filter region LG1, the second sub-pixel filter region LG2, and the third sub-pixel filter region LG3 are arranged to be spaced apart from each other along the second direction Y. At least part of orthographic projections of the plurality of light-shielding bars on the main surface of the base substrate 10 respectively overlap with an interval between the first sub-pixel filter region LG1 and the second sub-pixel filter region LG2 in the second direction Y and an interval between the second sub-pixel filter region LG2 and the third sub-pixel filter region LG3 in the second direction Y. For example, at least part of an orthographic projection of the light-shielding bar BM1 of the plurality of light-shielding bars on the main surface of the base substrate 10 overlaps with the interval between the first sub-pixel filter region LG1 and the second sub-pixel filter region LG2 in the second direction Y. For example, at least part of an orthographic projection of the light-shielding bar BM2 of the plurality of light-shielding bars on the main surface of the base substrate 10 overlaps the interval between the second sub-pixel filter region LG2 and the third sub-pixel filter region LG3 in the second direction Y. For example, the first sub-pixel filter region LG1, the second sub-pixel filter region LG2, and the third sub-pixel filter region LG3 respectively correspond to light-emitting elements of sub-pixels in the pixel region P10. Except for the plurality of light-shielding bars, the black matrix BM does not include other light-shielding bars which do not extend along the first direction X on the side of the filter layer LG close to the transparent region TM10. In other words, the black matrix BM does not include light-shielding bars extending in other directions between the transparent region TM10 and the pixel region P10, and the black matrix BM only includes the light-shielding bars extending in the first direction as illustrated in FIG. 7, which are provided at the intervals of the first sub-pixel filter region LG1, the second sub-pixel filter region LG2, and the third sub-pixel filter region LG3. Thus, the area of the transparent region TM10 can be increased to increase the light transmittance of the display substrate.

For example, the included angle between the first direction X and the second direction Y in the present disclosure is between 70° and 90°, and includes 70° and 90°. For example, the included angle between the first direction X and the second direction Y is 70°, 80°, etc., which can be set according to actual conditions, and the embodiments of the present disclosure do not limit this. For example, the included angle between the first direction X and the second direction Y is 75°, 85°, and so on.

For example, the material of the filter layer includes a resin material doped with a colorant, for example, a dye or a pigment is used as the colorant, so that the resin material, such as a polymer resin material, has a color. For example, the material of the black matrix BM includes a black resin material that does not transmit light.

For example, in some embodiments, the first sub-pixel filter region LG1, the second sub-pixel filter region LG2, and the third sub-pixel filter region LG3 are respectively a red light region, a green light region, and a blue light region, that is, the second sub-pixel filter region LG2, and the third sub-pixel filter region LG3 respectively transmits a red light, a green light and a blue light. The order of the light transmitted by the first sub-pixel filter region LG1, the second sub-pixel filter region LG2, and the third sub-pixel filter region LG3 can be interchanged, and the embodiments of the present disclosure are not limited thereto.

For example, in some embodiments, as illustrated in FIG. 2, in the first direction X, on the side of the pixel region P10 close to the transparent region TM10, orthographic projections of the first sub-pixel filter region LG1, the second sub-pixel filter region LG2, and the third sub-pixel filter region LG3 on the main surface of the base substrate 10 partially overlap with an orthographic projection of the pixel defining layer 138 on the main surface of the base substrate 10. That is, in the direction perpendicular to the main surface of the base substrate 10, on the side close to the transparent region TM10, edges of the first sub-pixel filter region LG1, the second sub-pixel filter region LG2, and the third sub-pixel filter region LG3 that extend beyond the pixel defining layer 138 extend above the pixel defining layer 138. As illustrated in FIG. 3, a size of an overlapping portion between the orthographic projection of the first sub-pixel filter region LG1, the second sub-pixel filter region LG2, or the third sub-pixel filter region LG3 on the main surface of the base substrate and the orthographic projection of the pixel defining layer 138 on the main surface of the base substrate 10 is D5. Therefore, under the premise of ensuring that the transparent region is not occupied, it is possible to reduce the light leakage of the light-emitting region of the light-emitting element under different angles, so as to reduce the color attenuation of the display substrate.

Figure 5:
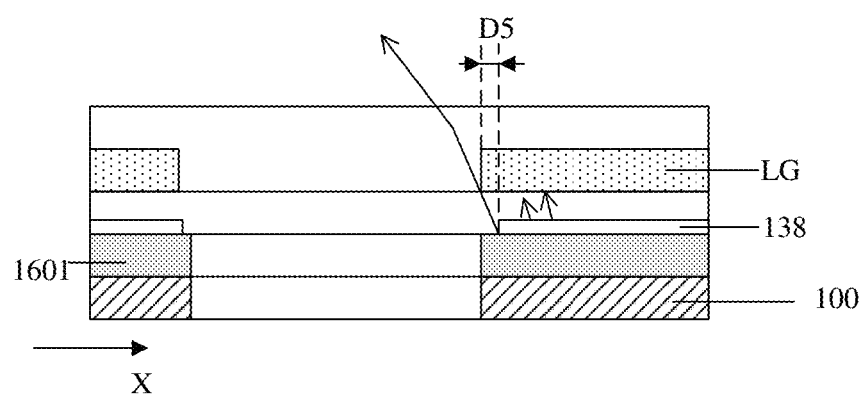
FIG. 5 is a schematic view of an optical simulation of a display substrate provided by at least one embodiment of the present disclosure.

FIG. 5 is a schematic view of an optical simulation of a display substrate provided by at least one embodiment of the present disclosure.

For example, in some embodiments, an overlapping portion of the first sub-pixel filter region LG1 and the pixel defining layer 138 in the direction perpendicular to the base substrate 10, an overlapping portion of the second sub-pixel filter region LG2 and the pixel defining layer 138 in the direction perpendicular to the base substrate 10, and an overlapping portion of the third sub-pixel filter region LG3 and the pixel defining layer 138 in the direction perpendicular to the base substrate 10 each has a size range along the first direction X, for example, about 5 μm to 7 μm, for example, about 6 μm, so that a better display effect can be achieved.

For example, as illustrated in FIG. 5, taking the filter region exceeding the pixel defining layer 138 in the first direction X as an example, an optical simulation in the the first direction X is performed to select a suitable value range for the filter region exceeding the pixel defining layer 138. In FIG. 5, a size range of the length D5 (also illustrated in FIG. 3) of the filter layer that exceeds the pixel defining layer 138 in the first direction X is, for example, about 5 μm to 7 μm, for example about 6 μm. In this case, the effect of preventing light leakage is better, which can meet the requirements of display effect. When the value of the length D5 is larger, the effect of preventing light leakage is better. If the design size allows, a larger length D5 can be selected. It should be noted that the pixel defining layer 138 in FIG. 5 shows an opening region (that is, the pixel defining layer 138 is shown in reverse, and the marked region is a cut-out region).

For example, in some embodiments, as illustrated in FIG. 3, the display substrate further includes a light-transmitting layer 1310 and a protective layer 1311. The light-transmitting layer 1310 is provided on a side of the filter layer LG away from the base substrate 10. The protective layer 1311 is provided on a side of the light-transmitting layer 1310 away from the base substrate 10. For example, the protective layer 1311 is used as a cover plate, and the material of the protective layer 1311 for example includes a flexible material, such as colorless polyimide (CPI), polyethylene terephthalate (PET), cycio olefin polymer (COP), etc. For example, the light-transmitting layer 1310 is an optical adhesive layer, which plays a role of light-transmitting or bonding. For example, the material of the light-transmitting layer 1310 includes a transparent insulating material, for example, the transparent insulating material is a transparent organic material such as polyimide, resin, a substrate-free double-sided transparent adhesive (OCA, Optically Clear Adhesive), etc.

Figure 8B:
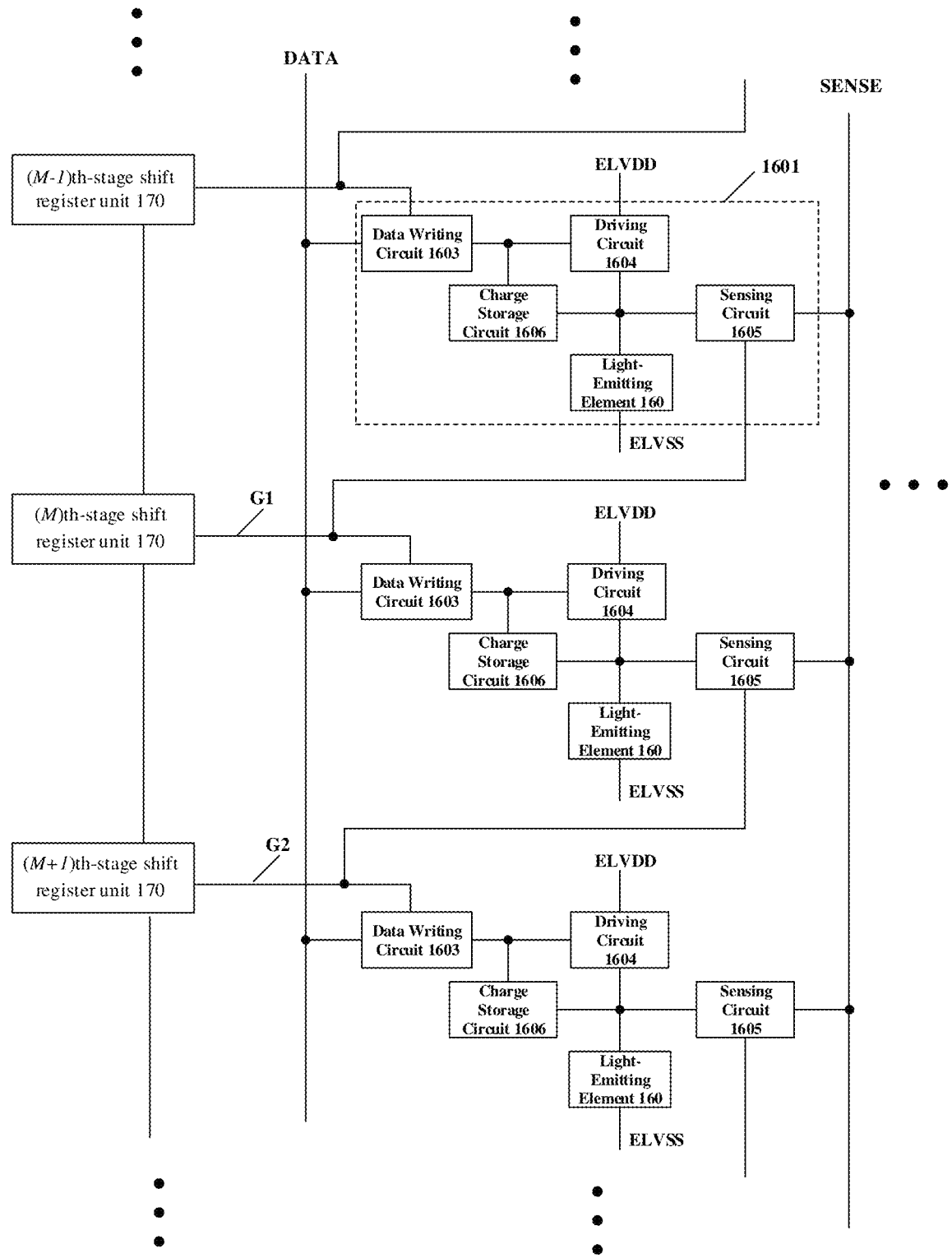
FIG. 8B is a schematic view of the connection between a sub-pixel driving circuit and a register unit circuit provided by at least one embodiment of the present disclosure.

For example, in some embodiments, as illustrated in FIG. 1, the gate driving circuit 13 is configured to output a gate scanning signal sequentially through the gate line G10 to drive the sub-pixels of the pixel regions P10 of each row of the repeating units C1 respectively extending along the first direction X to work. The plurality of repeating units C1 are arranged in N rows respectively extending along the first direction, the gate driving circuit 13 includes N cascaded shift register units 170 (as illustrated in FIG. 8B), and an (n)th-stage shift register unit 170 is connected with sub-pixel driving circuits 1601 of the pixel regions P10 of an (n)th row of repeating units C1, where 1≤n≤N, and N is an integer greater than or equal to 2.

For example, as illustrated in FIG. 2, the plurality of sub-pixel driving circuits of the pixel region P10 of each repeating unit C1 are arranged along the first direction X. The plurality of sub-pixel driving circuits are respectively connected with different light-emitting elements.

As illustrated in FIG. 8A, the sub-pixel driving circuit 1601 of each of the plurality of sub-pixels includes a data writing circuit 1603, a driving circuit 1604, a charge storage circuit 1606, and a sensing circuit 1605. The driving circuit 1604 is connected with a first node G, a second node S, and a third node D. The third node D is further connected with a first power supply voltage terminal ELVDD. For example, the first power supply voltage terminal ELVDD is connected with a power supply line VDD10 that provides a first power supply voltage. The driving circuit 1604 is configured to control a driving current flowing through the light-emitting element 160 under the control of a level of the first node G. The data writing circuit 1603 is connected with the first node G, and is configured to receive a gate scanning signal (for example, provided by the gate driving circuit through the gate line G10) as a scanning driving signal and write a data signal to the first node G in response to the scanning driving signal. The charge storage circuit 1606 is connected with the first node G and the second node S, and is configured to store the data signal that is written and a reference voltage signal. The sensing circuit 1605 is connected with the second node S, and is configured to receive the gate scanning signal as a sensing driving signal and write the reference voltage signal to the driving circuit 1604 or read a sensing voltage signal from the driving circuit 1604 in response to the sensing driving signal. The light-emitting element 160 (for example, the first electrode 161 of the light-emitting element 160) is connected with the second node S and a second power supply voltage terminal ELVSS, and is configured to receive a second power supply voltage through the second power supply voltage terminal ELVSS and emit light under the driving of the driving current. For example, the second power supply voltage terminal ELVSS is connected with a power supply line ELVSS (not illustrated in the figure), and the power supply line ELVSS is configured to provide the second power supply voltage.

For example, in the embodiments of the present disclosure, the power supply line ELVSS is configured to be routed around the display region 101, and the second electrode 1602 of the light-emitting element 160 is provided on an entire surface of the base substrate 10, and is connected with the power supply line ELVSS to receive the second power supply voltage.

For example, as illustrated in FIG. 8A, the data writing circuit 1603 is implemented as a data writing transistor T1, the driving circuit 1604 is implemented as a driving transistor T2, the charge storage circuit 1606 is implemented as a storage capacitor CST, and the sensing circuit 1605 is implemented as a sensing transistor T3. The plurality of gate lines G10 in FIG. 1 includes a first gate line G1 and a second gate line G2.

A first electrode of the data writing transistor T1 is connected with one of a plurality of data lines DATA so as to receive a data signal, and a second electrode of the data writing transistor T1 is connected with the first node G (that is, connected with the gate electrode TG2 of the driving transistor T2). A gate electrode TG1 of the data writing transistor T1 is connected with the first gate line G1 (that is, a gate line connected with an output terminal of a shift register unit) of the plurality of gate lines so as to receive the scanning driving signal.

A first electrode of the driving transistor T2 is connected with one second power supply voltage terminal ELVDD and is configured to receive the first power supply voltage. A second electrode of the driving transistor T2 is connected with the second node S (that is, connected with a first electrode of the sensing transistor T3).

A gate electrode G221 of the sensing transistor T22 is configured to receive the sensing driving signal, for example, the gate electrode G221 of the sensing transistor T22 is connected with the second gate line G2 of the plurality of gate lines (that is, the second gate line G2 is a gate line connected with an output terminal of a shift register unit which is located in a row different from the sensing transistor T22) so as to receive the sensing driving signal. A first electrode of the sensing transistor T2 is connected with the second node S, and a second electrode of the sensing transistor T2 is connected with a sensing signal line SENSE (one of the sensing signal lines SES10 in FIG. 1), and is configured to receive the reference voltage signal or output the sensing voltage signal.

A first electrode (for example, the first electrode 161) of the light-emitting element 160 is connected with the second node S, that is, connected with the second electrode of the driving transistor T2 and the first electrode of the sensing transistor T3, so as to receive the driving current of the driving transistor T2. A second electrode (for example, the second electrode 162) of the light-emitting element 160 is configured to be connected with the second power supply voltage terminal ELVSS to receive the second power supply voltage. For example, in some embodiments, the second electrode of the light-emitting element 160 is configured to be grounded, and in this case, the second driving voltage is 0V. For example, the first power supply voltage is a high-level voltage (for example, 5V, 10V or other suitable voltages), and the second power supply voltage is a low-level voltage (for example, 0V, −5V, −10V or other suitable voltages). When the driving transistors T2 are turned on (or partially turned on), the first power supply voltage and the second power supply voltage can be regarded as a power supply, and the power supply is used to generate the driving current for driving the light-emitting element 160.

It should be noted that the light-emitting element 160 is, for example, an organic light-emitting diode (OLED) or a quantum dot light-emitting diode (QLED).

For example, the above-mentioned transistors are all described by taking N-type transistors as an example, that is, each transistor is turned on when the gate electrode is connected with a high level (a turn-on level), and is turned off when the gate electrode is connected with a low level (a turn-off level). It should be noted that the present disclosure includes but is not limited to this. For example, one or more transistors in the shift register unit provided by the embodiments of the present disclosure are P-type transistors. In this case, the first electrode is a source electrode and the second electrode is a drain electrode, and each electrode of the transistor of selected type is correspondingly connected with reference to each electrode of the corresponding transistor employed in examples of the embodiments of the present disclosure.

For example, FIG. 8B is a schematic view of the connection between a sub-pixel driving circuit and a register unit circuit provided by at least one embodiment of the present disclosure. As illustrated in FIG. 8B, the first gate line G1 is connected with data writing circuits 1603 of a plurality of sub-pixel driving circuits 1601 of pixel regions P10 of a (M)th line (for example, (M)th row) of repeating units C1 extending in the first direction X, sensing circuits 1605 of a plurality of sub-pixel driving circuits 1601 of pixel regions P10 of a (M−1)th line (for example, (M−1)th row) of repeating units C1 extending in the first direction X, and an output terminal of a (M)th-stage shift register unit 170, so that a gate scanning signal output from the output terminal of the (M)th-stage shift register unit 170 is outputted to the data writing circuits 1603 of the plurality of sub-pixel driving circuits 1601 of the pixel regions P10 of the (M)th line of repeating units C1 as a scanning driving signal, and is outputted to the sensing circuits 1605 of the plurality of sub-pixel driving circuits 1601 of pixel regions P10 of the (M−1)th line of repeating units C1 as a sensing driving signal. The second gate line G2 is connected with sensing circuits 1605 of the plurality of sub-pixel driving circuits 1601 of the pixel regions P10 of the (M)th line of repeating units C1 extending in the first direction X, data writing circuits 1603 of a plurality of sub-pixel driving circuits 1601 of pixel regions P10 of a (M+1)th line (for example, (M+1)th row) of repeating units C1 extending in the first direction X, and an output terminal of a (M+1)th-stage shift register unit 170, so that a gate scanning signal output from the output terminal of the (M+1)th-stage shift register unit 170 is outputted to the data writing circuits 1603 of the plurality of sub-pixel driving circuits 1601 of the pixel regions P10 of the (M+1)th line of repeating units C1 as a scanning driving signal, and is outputted to the sensing circuits 1605 of the plurality of sub-pixel driving circuits 1601 of the pixel regions P10 of the (M)th line of repeating units C1 as a sensing driving signal. Where 1<M<N, M is an odd number greater than 1.

It should be noted that, in the embodiments of the present disclosure, the (M)th row extending in the first direction X represents a (M)th row extending in a horizontal direction, and a (M)th column extending in the second direction Y represents a (M)th column extending in a longitudinal direction.

Figure 9A:
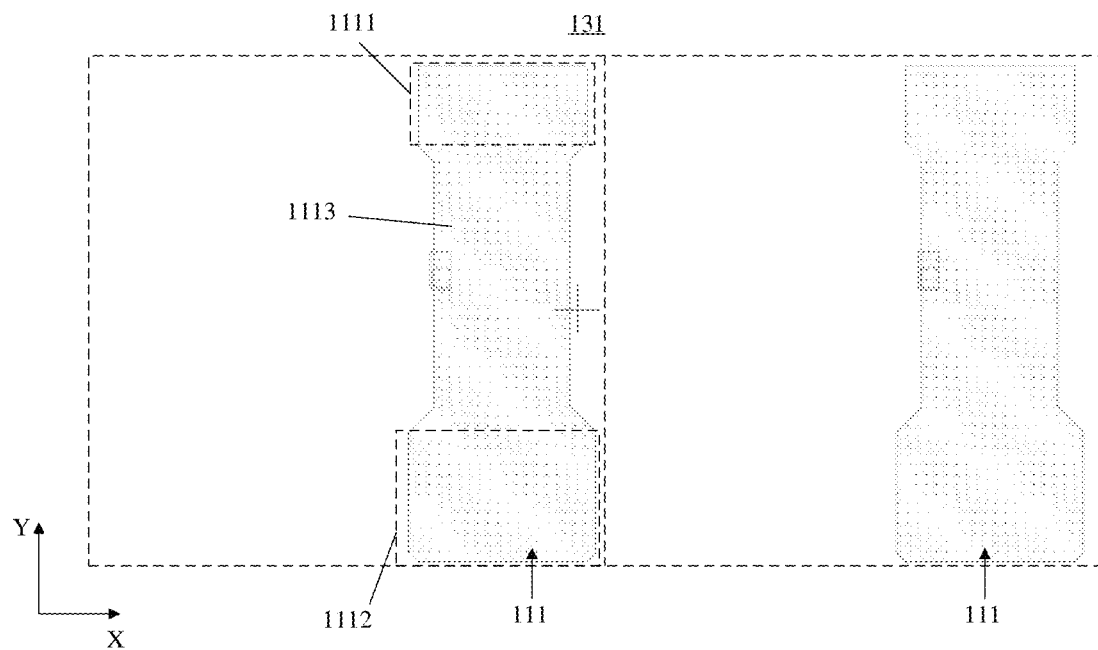
FIG. 9A is a plan view of a light-shielding layer provided by at least one embodiment of the present disclosure.

FIG. 9A is a plan view of a light-shielding layer provided by at least one embodiment of the present disclosure.

For example, in some embodiments, in conjunction with FIG. 9A and FIG. 6, in each pixel region P10, the light-shielding layer 131 includes a light-shielding electrode 111, and the light-shielding electrode 111 extends along the second direction Y (for example, a length of the light-shielding electrode 111 in the second direction Y is larger). An orthographic projection of the light-shielding electrode 111 on the main surface of the base substrate 10 at least partially, for example partially, overlaps with an orthographic projection of the plurality of sub-pixel driving circuits 1601 (for example, the first sub-pixel driving circuit P161, the second sub-pixel driving circuit P162, or the third sub-pixel driving circuit P163) in each pixel region P10 on the main surface of the base substrate 10, so that the external light can be blocked from irradiating onto the sub-pixel driving circuits, especially onto the active layer of the transistor, so as to avoid the generation of dark current.

For example, as illustrated in FIG. 9A, the light-shielding electrode 111 includes a first end portion 1111, a middle recess portion 1113, and a second end portion 1112 arranged in the second direction Y, and the middle recess portion 1113 is located between the first end portion 1111 and the second end portion 1112. A width of the first end portion 1111 in the first direction X and a width of the second end portion 1112 in the first direction X are both greater than a width of the middle recess portion 1113 in the first direction X. With reference to FIG. 6, orthographic projections of the first end portion 1111 and the second end portion 1112 on the main surface of the base substrate 10 overlap with orthographic projections of active layers of the data writing transistor T1, the driving transistor T2, and the sensing transistor T3 of the sub-pixel driving circuit 1601 on the main surface of the base substrate 10. The electrode overlapping region 12 is located between the middle recess portion 1113 and the transparent region TM10. The light-shielding electrode 111 is provided in a shape with a narrow middle portion and two wide end portions, which can reduce the area occupied by the light-shielding electrode 111 and increase the area of the transparent region.

For example, as illustrated in FIG. 6, in the second direction Y, the sensing transistor T3 is located at an upper side (for example, an upper side of the storage capacitor CST), and the driving transistor T2 and the data writing transistor T1 are located on a side of the storage capacitor CST away from the sensing transistor T3. The orthographic projections of the active layers of the data writing transistor T1 and the driving transistor T2 on the main surface of the base substrate 10 overlap with the orthographic projection of the second end portion 1112 of the light-shielding electrode 111 on the main surface of the base substrate 10. The orthographic projection of the active layer of the sensing transistor T3 on the main surface of the base substrate 10 overlaps with the orthographic projection of the first end portion 1111 of the light-shielding electrode 111 on the main surface of the base substrate 10. In this way, the light-shielding layer can block external light from irradiating onto the active layer of the data writing transistor T1, the driving transistor T2, and the sensing transistor T3, so as to avoid the generation of dark current.

For example, in some embodiments, as illustrated in FIG. 6 and FIG. 7, each of the first electrode plate CST1 and the second electrode plate CST2 of the storage capacitor CST of the sub-pixel driving circuit 1601 (for example, the first sub-pixel driving circuit P161, the second sub-pixel driving circuit P162, or the third sub-pixel driving circuit P163) of the pixel region P10 include a strip extending in the second direction Y. In each repeating unit C1, the first sub-pixel filter region LG1, the second sub-pixel filter region LG2, and the third sub-pixel filter region LG3 are sequentially arranged along the second direction Y, and the second sub-pixel filter region LG2 is located between the first sub-pixel filter region LG1 and the third sub-pixel filter region LG3. An orthographic projection of the first sub-pixel filter region LG1 on the main surface of the base substrate 10 overlaps with an orthographic projection of at least part (for example, a part close to the storage capacitor CST) of the sensing transistor T3 of the sub-pixel driving circuits of the plurality of sub-pixels in the pixel region P10 on the main surface of the base substrate 10, and further overlaps with an orthographic projection of a part (for example, if the strip-shaped storage capacitor CST is divided into three parts in the second direction Y, the part is the upper part of the storage capacitor CST) of the storage capacitor CST close to the sensing transistor T3 on the main surface of the base substrate 10. An orthographic projection of the third sub-pixel filter region LG3 on the main surface of the base substrate 10 overlaps with an orthographic projection of at least part (for example, a part close to the storage capacitor CST) of the data writing transistor and the driving transistor of the sub-pixel driving circuits of the plurality of sub-pixels in the pixel region P10 on the main surface of the base substrate 10, and further overlaps with an orthographic projection of a part (for example, the part of the storage capacitor CST located at a lower side) of the storage capacitor CST close to the driving transistor T2 on the main surface of the base substrate 10. An orthographic projection of the second sub-pixel filter region LG2 on the main surface of the base substrate 10 overlaps with an orthographic projection of a part (for example, a middle part of the storage capacitor CST), which is in middle of the storage capacitor CST in the second direction, of the storage capacitor CST of the sub-pixel driving circuits of the plurality of sub-pixels in the pixel region P10 on the main surface of the base substrate 10. The design of the strip storage capacitor CST and the square-like filter region can increase the area of the transparent region of the display substrate and improve the display effect.

For example, in other embodiments, the first sub-pixel filter region LG1, the second sub-pixel filter region LG2, and the third sub-pixel filter region LG3 are designed as strips extending along the second direction Y. The embodiments of the present disclosure are not limited thereto.

For example, at least one embodiment of the present disclosure further provides a display substrate, which includes a base substrate and a plurality of sensing signal lines. The plurality of sensing signal lines are arranged on the base substrate and extend along a second direction different from a first direction, and two lines of repeating units respectively extending along the second direction are arranged between adjacent two of the plurality of sensing signal lines. Each of the plurality of sensing signal lines is simultaneously connected with the sub-pixel driving circuits of a plurality of sub-pixels of two lines of repeating units which are adjacent to the each of the plurality of sensing signal lines and respectively extend along the second direction, and is configured to provide a reference voltage signal. As a result, the space occupied by the signal lines is reduced, the area of the transparent region is increased, and the light transmittance is improved.

For example, in some embodiments, as illustrated in FIG. 1, a plurality of sensing signal lines SES10 are provided on the base substrate 10 and extend along the second direction Y. The plurality of sensing signal lines SES10 extend to the bonding region 103, and for example, are further connected with contact pads (not illustrated in the figure) of the bonding region 103 to receive electrical signals provided by an external driving circuit (such as a chip). Two lines (for example, two columns) of repeating units C1 respectively extending along the second direction Y are arranged between adjacent two of the plurality of sensing signal lines SES10. Each of the plurality of sensing signal lines SES10 is simultaneously connected with sub-pixel driving circuits of a plurality of sub-pixels of two lines (for example, two columns) of repeating units C10 which are adjacent to the each of the plurality of sensing signal lines SES10 and respectively extend along the second direction Y, and is configured to provide the reference voltage signal. That is, every adjacent two of the plurality of sensing signal lines SES10 are separated from each other by two repeating units C1 provided in the same row. Each of the plurality of sensing signal lines SES10 is connected with the pixel regions P10 of two repeating units C1 provided in the same row and on both sides of the each of the plurality of sensing signal lines SES10. Thus, the sub-pixel driving circuits of the plurality of sub-pixels in the pixel regions P10 of the two repeating units C1 share one sensing signal line SES10, thereby reducing the total number of the sensing signal lines and the space occupied by the lines, thereby increasing the area of the transparent region.

For example, in some embodiments, as illustrated in FIG. 1, a plurality of power supply lines VDD10 are provided on the base substrate 10 and extend along the second direction Y. In the first direction X, the plurality of power supply lines VDD10 and the plurality of sensing signal lines SES10 are alternately arranged, and one line (for example, one column) of repeating units C1 extending along the second direction Y is arranged between each of the plurality of sensing signal lines SES10 and the power supply line VDD10 adjacent to the each of the plurality of sensing signal lines SES10. That is, the plurality of power supply lines VDD10 and the plurality of sensing signal lines SES10 define a plurality of spaces, in each of which one line (for example, one column) of repeating units C1 extending along the second direction Y is provided. One line (for example, one column) of repeating units C1 extending along the second direction Y is provided between each of the plurality of power supply lines VDD10 and the sensing signal line SES10 adjacent to the each of the plurality of power supply lines VDD10. Two lines (for example, two columns) of repeating units C1 respectively extending along the second direction Y are arranged between adjacent two of the plurality of power supply lines VDD10. Each of the plurality of power supply lines VDD10 is simultaneously connected with the sub-pixel driving circuits of a plurality of sub-pixels of two lines (for example, two columns) of repeating units C10 which are adjacent to the each of the plurality of power supply lines VDD10 and respectively extend along the second direction Y, and is configured to provide the first power supply voltage. That is, every adjacent two of the plurality of power supply lines VDD10 are separated from each other by two repeating units C1 provided in the same row. Each of the plurality of power supply lines VDD10 is connected with the pixel regions P10 of the two repeating units C1 provided in the same row and on both sides of the each of the plurality of power supply lines VDD10. Thus, the sub-pixel driving circuits of the plurality of sub-pixels in the pixel regions P10 of the two repeating units C1 share one power supply line VDD10, thereby reducing the total number of the power supply lines and the space occupied by the lines, thereby increasing the area of the transparent region.

Figure 9B:
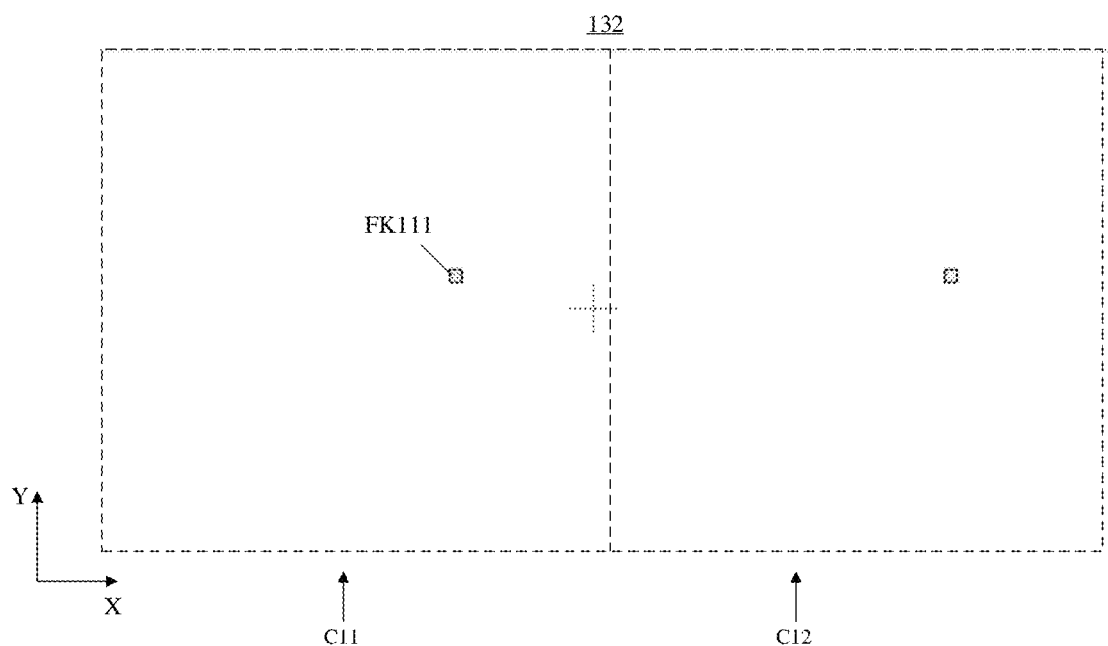
FIG. 9B is a plan view of a first insulating layer provided by at least one embodiment of the present disclosure.
Figure 9C:
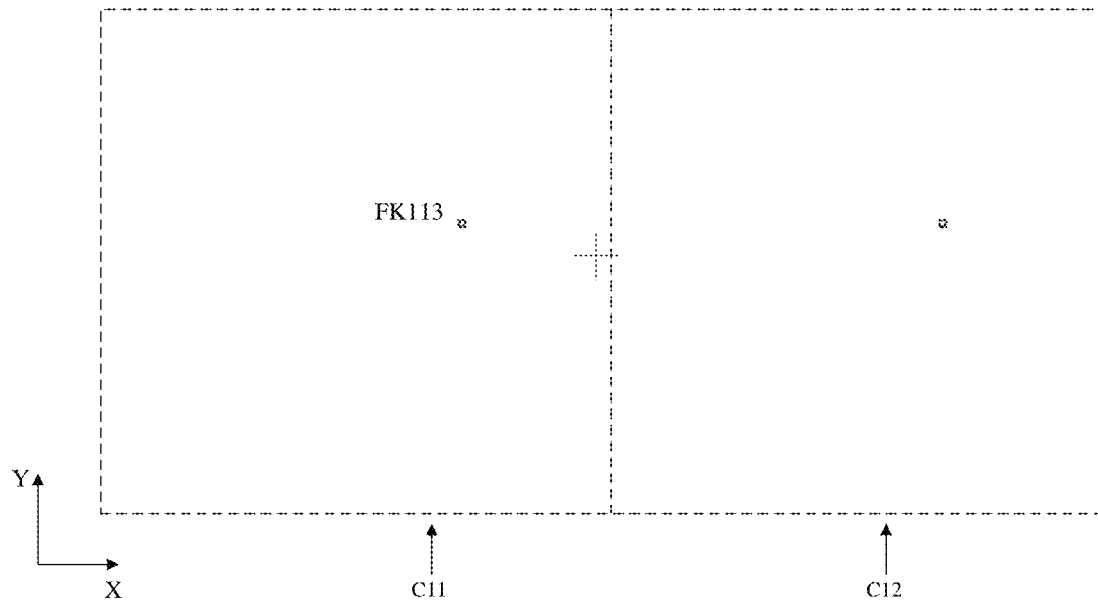
FIG. 9C is a plan view of a buffer layer provided by at least one embodiment of the present disclosure.
Figure 9D:
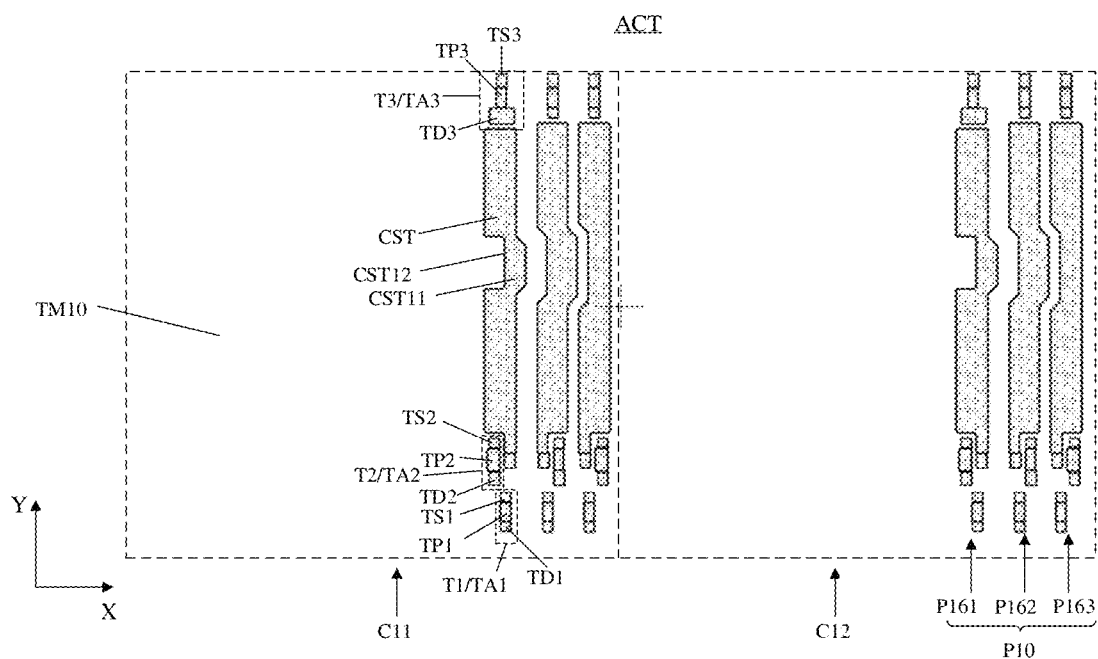
FIG. 9D is a plan view of a semiconductor layer provided by at least one embodiment of the present disclosure.
Figure 9E:
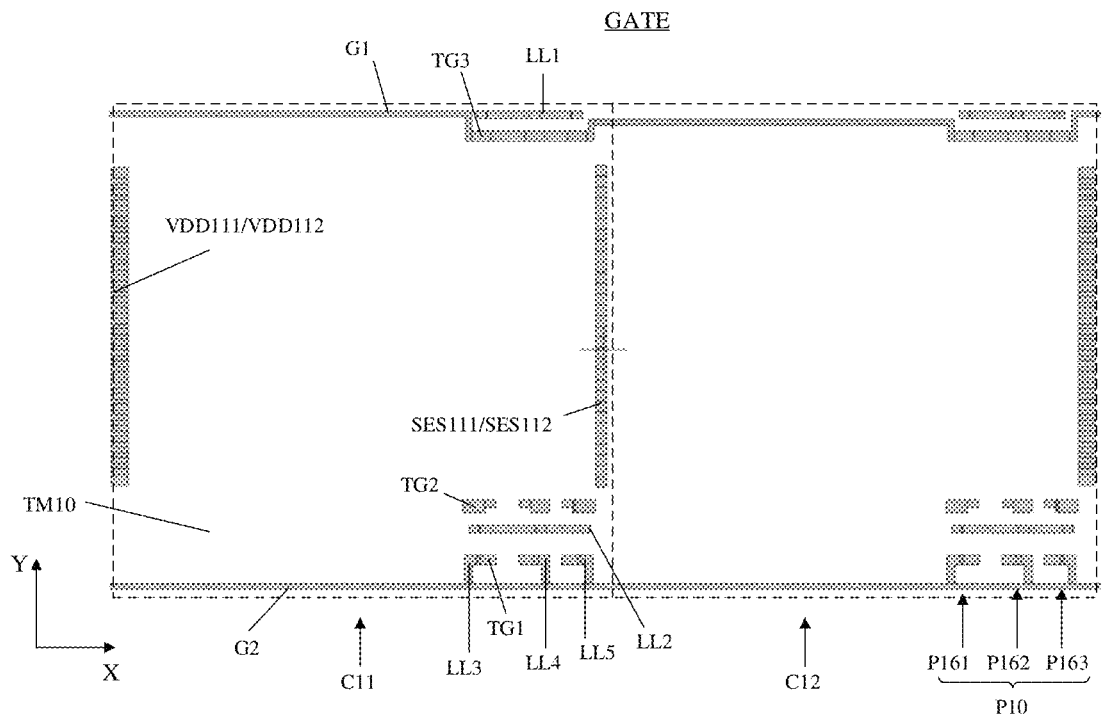
FIG. 9E is a layout diagram of a second conductive layer provided by at least one embodiment of the present disclosure.
Figure 9F:
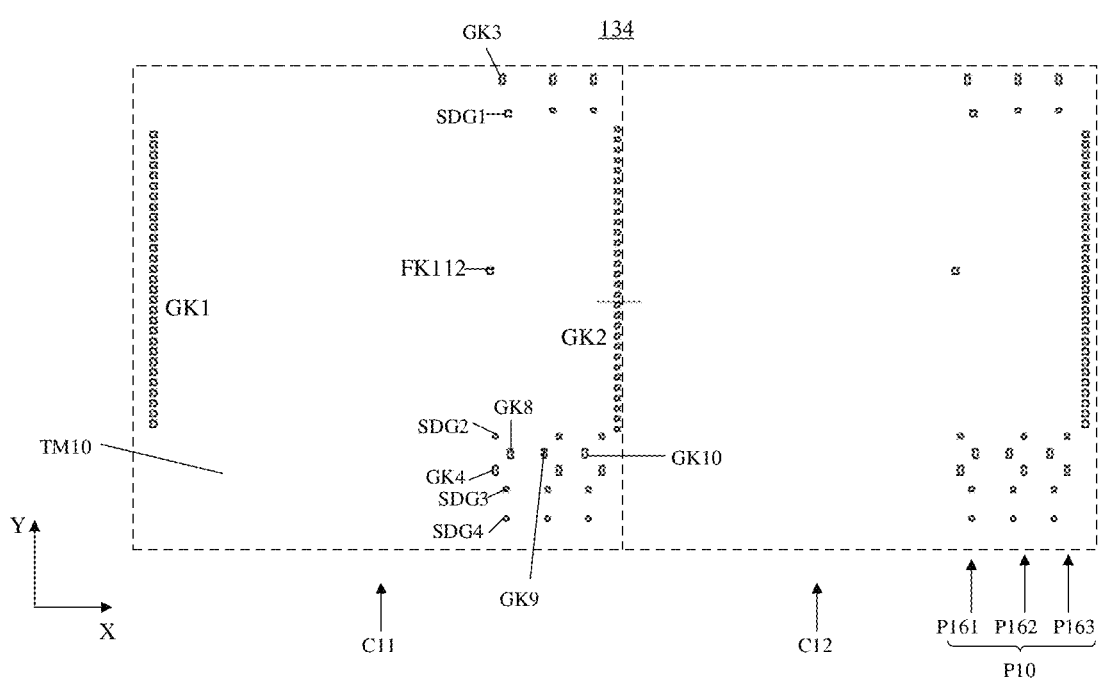
FIG. 9F is a plan view of an interlayer insulating layer provided by at least one embodiment of the present disclosure.
Figure 9G:
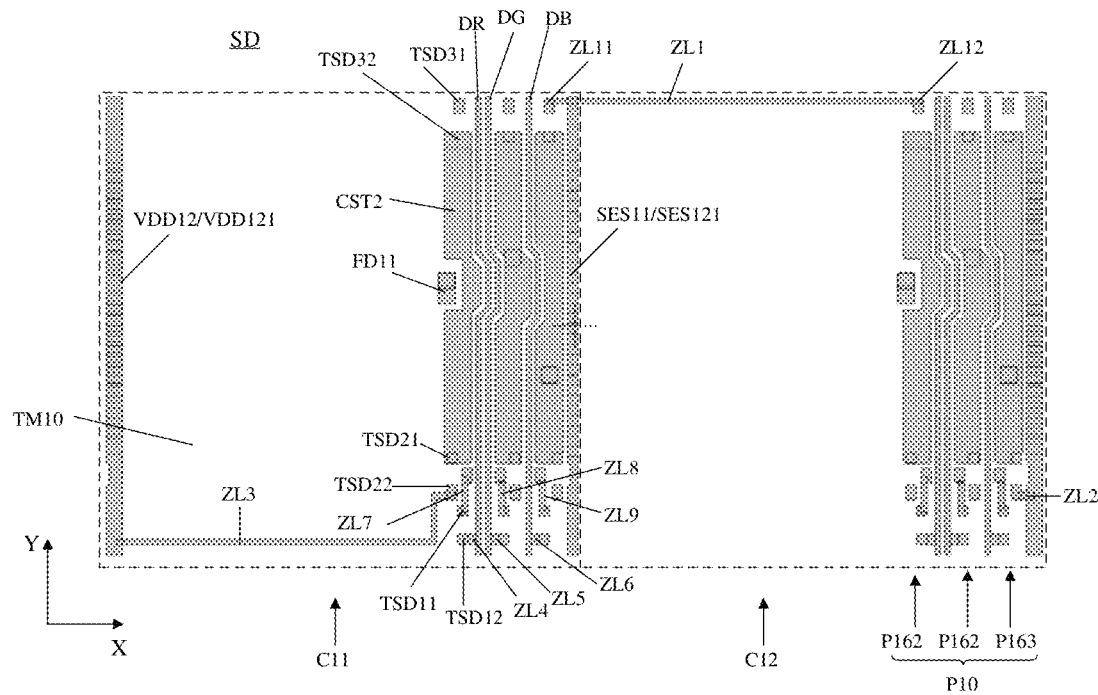
FIG. 9G is a plan view of a first conductive layer provided by at least one embodiment of the present disclosure.
Figure 10:
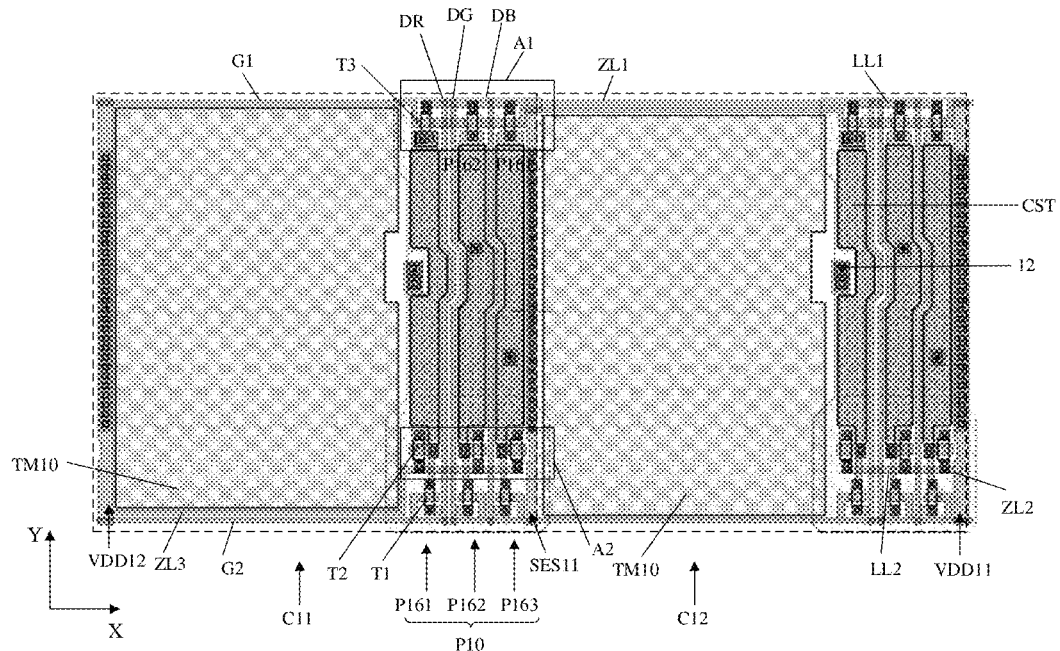
FIG. 10 is a layout diagram obtained by stacking FIG. 9A to FIG. 9G.

FIG. 9B is a plan view of a first insulating layer provided by at least one embodiment of the present disclosure. FIG. 9C is a plan view of a buffer layer provided by at least one embodiment of the present disclosure. FIG. 9D is a plan view of a semiconductor layer provided by at least one embodiment of the present disclosure. FIG. 9E is a layout diagram of a second conductive layer provided by at least one embodiment of the present disclosure. FIG. 9F is a plan view of an interlayer insulating layer provided by at least one embodiment of the present disclosure. FIG. 9G is a plan view of a first conductive layer provided by at least one embodiment of the present disclosure. FIG. 10 is a layout diagram obtained by stacking FIG. 9A to FIG. 9G. The structure of the sub-pixel driving circuits 1601 of the plurality of sub-pixels in the pixel region is described in detail below in conjunction with FIG. 9B-FIG. 9G and FIG. 10. It should be noted that the structure of one sub-pixel driving circuit 1601 in FIG. 9B-FIG. 9G and FIG. 10 will be taken as an example for introduction, and the structure of other sub-pixel driving circuit is the same and will not be repeated.

For example, in some embodiments, as illustrated in FIG. 2 and FIG. 6, the display region 101 includes a first repeating unit C11 and a second repeating unit C12 that are adjacently arranged along the first direction. A sensing signal line SES11 is arranged between a pixel region of the first repeating unit C11 and a transparent region TM10 of the second repeating unit C12, and the sensing signal line SES11 is connected with a plurality of sub-pixel driving circuits of the pixel regions P10 of the first repeating unit C11 and the second repeating unit C12. That is, the plurality of sub-pixel driving circuits of the pixel regions P10 of the first repeating unit C11 and the second repeating unit C12 share one sensing signal line. A power supply line VDD11 is arranged on a side of a pixel region P10 of the second repeating unit C12 away from the transparent region TM10 of the second repeating unit C12, and the power supply line VDD11 is connected with the plurality of sub-pixel driving circuits of the pixel region P10 of the second repeating unit C12. Another power supply line VDD12 is arranged on a side of a transparent region TM10 of the first repeating unit C11 away from the pixel region P10 of the first repeating unit C11, and the power supply line VDD12 is connected with the plurality of sub-pixel driving circuits of the pixel region P10 of the first repeating unit C11. In the repeating units as illustrated in FIG. 2 and FIG. 6, if another repeating unit is drawn on a left side of the first repeating unit C11, that is, on a side of the power supply line VDD12 away from the first repeating unit C11, sub-pixels in a pixel region of the another repeating unit are further connected with the power supply line VDD12. Similarly, in the repeating units as illustrated in FIG. 2 and FIG. 6, if another repeating unit is drawn on a right side of the second repeating unit C12, that is, on a side of the power supply line VDD11 away from the second repeating unit C12, sub-pixels in a pixel region of the another repeating unit are further connected with the power supply line VDD11. That is, each power supply line is connected with pixel regions of two repeating units adjacent to each other. In the embodiments of the present disclosure, the structure illustrated in FIG. 2 and FIG. 6 is used for introduction, and the structure of other parts are similar and will not be illustrated and described in detail.

For example, in some embodiments, as illustrated in FIG. 2 and FIG. 6, the plurality of sub-pixel driving circuits in the pixel region P10 of the first repeating unit C11 and the plurality of sub-pixel driving circuits in the pixel region P10 of the second repeating unit C12 respectively include a first sub-pixel driving circuit P161, a second sub-pixel driving circuit, and a third sub-pixel driving circuit P163 that are arranged in the first direction X. The second sub-pixel driving circuit P162 is located between the first sub-pixel driving circuit P161 and the third sub-pixel driving circuit P163. Each of the orthographic projections of the first sub-pixel driving circuit P161, the second sub-pixel driving circuit P162, and the third sub-pixel driving circuit P163 on the main surface of the base substrate 10 extends along the second direction Y. The first sub-pixel driving circuit P161 is mirror-symmetrical to the second sub-pixel driving circuit P162 or the third sub-pixel driving circuit P163.

It should be noted that, in the embodiments of the present disclosure, the components with the same structure in the first sub-pixel driving circuit P161, the second sub-pixel driving circuit P162, and the third sub-pixel driving circuit P163 are introduced by taking one sub-pixel driving circuit as an example, and other sub-pixel driving circuits are not described in detail.

For example, as illustrated in FIG. 9B, the first sub-hole FK111 located in the electrode overlapping region 12 is provided in the first insulating layer 132 to expose the light-shielding layer 131 as illustrated in FIG. 9A, such as the middle recess portion 1113 of the light-shielding layer 131.

For example, as illustrated in FIG. 9C, the third sub-hole FK113 located in the electrode overlapping region 12 is provided in the buffer layer 133 to expose the light-shielding layer 131 as illustrated in FIG. 9A, such as the middle recess portion 1113 of the light-shielding layer 131. The third sub-hole FK113 is nested in the first sub-hole FK111.

For example, in some embodiments, as illustrated in FIG. 6 and FIG. 9D, each of orthographic projections of the data writing transistor T1, the driving transistor T2, and the sensing transistor T3 of the sub-pixel driving circuit on the base substrate 10 extends along the second direction Y. In FIG. 6, the semiconductor layer ACT includes an active layer TA1 of the data writing transistor T1 of the sub-pixel driving circuit, an active layer TA2 of the driving transistor T2 of the sub-pixel driving circuit, and an active layer TA3 of the sensing transistor T3 of the sub-pixel driving circuit. Each of the active layer TA1 of the data writing transistor T1 of the sub-pixel driving circuit, the active layer TA2 of the driving transistor T2 of the sub-pixel driving circuit, and the active layer TA3 of the sensing transistor T3 of the sub-pixel driving circuit extends along the second direction Y. For example, the base substrate 10 is a flexible substrate. Therefore, when the display substrate is bent, it can be ensured that the electrical performance of each transistor of the sub-pixel driving circuit is not affected, and the display stability of the display substrate can be ensured.

For example, each of the active layer TA1 of the data writing transistor T1, the active layer TA2 of the driving transistor T2, and the active layer TA3 of the sensing transistor T3 is not parallel to the second direction Y, for example, intersects the second direction Y at a certain angle. For example, the certain angle is less than or equal to 20°.

For example, as illustrated in FIG. 9D, taking the first sub-pixel driving circuit P161 as an example, the structure of the active layer of each transistor and the storage capacitor of the sub-pixel driving circuit are described in detail. For example, the semiconductor layer ACT further includes the first electrode plate CST1 of the storage capacitor of the first sub-pixel driving circuit P161. The active layer TA3 of the sensing transistor T3 is located on an upper side of the first electrode plate CST1 of the storage capacitor, the active layer TA2 of the driving transistor T2 and the active layer TA1 of the data writing transistor T1 are located on a side of the first electrode plate CST1 of the storage capacitor away from the sensing transistor T3, and the active layer TA2 of the driving transistor T2 is located between the sensing transistor T3 and the data writing transistor Ti. The first electrode plate CST1 of the storage capacitor CST is connected with and is integral with the active layer TA2 of the driving transistor T2. The first electrode plate CST1 of the storage capacitor is a strip extending along the second direction Y. A position of the first electrode plate CST1 of the storage capacitor corresponding to the electrode overlapping region 12 is provided with a convex portion CST11 protruding to the side away from the transparent region TM10, the convex portion has a notch CST12, and the notch CST12 surrounds the electrode overlapping region 12 to leave a space for the electrode overlapping region 12. That is, the electrode overlapping region 12 occupies a part of the space of the first electrode plate CST1, thereby reducing the space occupied by the electrode overlapping region 12 in the transparent region TM10 and increasing the area of the transparent region. For example, as illustrated in FIG. 9D, the first electrode plate CST1 of the storage capacitor of the second sub-pixel driving circuit P162 has a shape slightly different from the first electrode plate CST1 of the storage capacitor of the first sub-pixel driving circuit P161. A portion of the first electrode plate CST1 of the storage capacitor of the second sub-pixel driving circuit P162 corresponding to the convex portion CST11 is bent to leave a wiring space between the first sub-pixel driving circuit P161 and the second sub-pixel driving circuit P162. The first electrode plate CST1 of the storage capacitor of the third sub-pixel driving circuit P163 has a shape slightly different from the first electrode plates CST1 of the storage capacitors of the first sub-pixel driving circuit P161 and the second sub-pixel driving circuit P162. A portion of the first electrode plate CST1 of the storage capacitor of the third sub-pixel driving circuit P163 corresponding to the convex portion CST11 is recessed to the right side (in a direction away from the second sub-pixel driving circuit P162) at an edge close to the second sub-pixel driving circuit P162 to leave a wiring space between the second sub-pixel driving circuit P162 and the third sub-pixel driving circuit P163. That is, a structure similar to the notch CST12 surrounding the electrode overlapping region 12 may be correspondingly provided in the first electrode plate CST1 of the storage capacitor of the second sub-pixel driving circuit P162 and in the first electrode plate CST1 of the storage capacitor of the third sub-pixel driving circuit P163.

For example, as illustrated in FIG. 9D, the active layer TA3 of the sensing transistor T3 includes a source region TS3, a channel region TP3, and a drain region TD3. For example, the active layer TA2 of the driving transistor T2 includes a source region TS2, a channel region TP2, and a drain region TD2. For example, the active layer TA1 of the data writing transistor T1 includes a source region TS1, a channel region TP1, and a drain region TD1.

For example, as illustrated in FIG. 9E, the second conductive layer GATE includes the gate electrode TG1 of the data writing transistor T1, the gate electrode TG2 of the driving transistor T2, and the gate electrode TG3 of the sensing transistor T3. An orthographic projection of the channel region TP3 on the base substrate at least partially overlaps with an orthographic projection of the gate electrode TG3 on the base substrate. An orthographic projection of the channel region TP1 on the base substrate at least partially overlaps with an orthographic projection of the gate electrode TG1 on the base substrate. An orthographic projection of the channel region TP2 on the base substrate at least partially overlaps with the orthographic projection of the gate electrode TG2 on the base substrate.

For example, as illustrated in FIG. 9G, the first conductive layer SD includes the first electrode TSD11 and the second electrode TSD12 of the data writing transistor Ti, the first electrode TSD21 and the second electrode TSD22 of the driving transistor T2, the first electrode TSD31 and the second electrode TSD32 of the sensing transistor T3, and the second electrode plate CST2 of the storage capacitor CST. In conjunction with FIG. 9D, orthographic projections of the first electrode TSD11 and the second electrode TSD12 of the data writing transistor T1 on the base substrate 10 respectively overlap with orthographic projections of the source region TS1 and the drain region TD1 of the data writing transistor T1 on the base substrate 10. Orthographic projections of the first electrode TSD21 and the second electrode TSD22 of the driving transistor T2 on the base substrate 10 respectively overlap with orthographic projections of the source region TS2 and the drain region TD2 of the driving transistor T2 on the base substrate 10. Orthographic projections of the first electrode TSD31 and the second electrode TSD32 of the sensing transistor T3 on the base substrate 10 respectively overlap with orthographic projections of the source region TS3 and the drain region TD3 of the sensing transistor T3 on the base substrate 10. The second insulating layer 134 is provided between the second electrode plate CST2 of the storage capacitor CST and the first electrode plate CST1 of the storage capacitor to achieve a capacitor function. As illustrated in FIG. 9F, the first electrode TSD31 of the sensing transistor T3 is connected with the source region TS3 through a third via GK3, and the second electrode TSD32 of the sensing transistor T3 is connected with the drain region TD3 through a first source-drain via SDG1 (for example, penetrating through the second insulating layer 134). The first electrode TSD21 of the driving transistor T2 is connected with the source region TS2 through a second source-drain via SDG2 (for example, penetrating through the second insulating layer 134), and the second electrode TSD22 of the driving transistor T2 is connected with the drain region TD2 through a fourth via GK3. The first electrode TD11 of the data writing transistor T1 is connected with the source region TS1 through a third source-drain via SDG3 (for example, penetrating through the second insulating layer 134), and the second electrode TD12 of the data writing transistor T1 is connected with the drain region TD1 through a fourth source-drain via SDG4 (for example, penetrating through the second insulating layer 134). Among them, the structure of the third via GK3 and the fourth via GK3 will be described in detail later.

It should be noted that the first source-drain via SDG1, the second source-drain via SDG2, the third source-drain via SDG3, and the fourth source-drain via SDG4 may be arranged to pass through the second insulating layer 134 and the fourth insulating layer 137.

For example, the size range of each of the first source-drain via SDG1, the second source-drain via SDG2, the third source-drain via SDG3, and the fourth source-drain via SDG4 is about 2-4 μm, for example, about 3 μm. The sizes of the first source-drain via SDG1, the second source-drain via SDG2, the third source-drain via SDG3, and the fourth source-drain via SDG4 are selected depending on the display substrate during the manufacturing process.

It should be noted that the second insulating layer 134 and the fourth insulating layer 137 for example are provided between the second electrode plate CST2 and the first electrode plate CST1 of the storage capacitor CST, and the embodiments of the present disclosure are not limited thereto.

For example, as illustrated in FIG. 9F, the second insulating layer 134 further includes the second sub-hole FK112 located in the electrode overlapping region 12.

For example, as illustrated in FIG. 9G, the first conductive layer SD further includes the first connection electrode FD11 located in the electrode overlapping region 12.

For example, in some embodiments, as illustrated in FIG. 9G, an end of the second electrode plate CST2 of the storage capacitor CST close to the second electrode TSD32 of the sensing transistor T3 is connected with the second electrode TSD2 of the sensing transistor T3, and the second electrode plate CST2 of the storage capacitor CST and the second electrode TSD32 of the sensing transistor T3 are integral with each other. For example, the first electrode TSD21 of the driving transistor T2 is connected with an end of the first electrode plate CST1 of the storage capacitor CST away from the sensing transistor T3, and the first electrode TSD21 of the driving transistor T2 and the first electrode plate CST1 of the storage capacitor CST are integral with each other to reduce the occupied space.

For example, as illustrated in FIG. 9E, FIG. 9G, and FIG. 10, each of the plurality of power supply lines, such as the power supply line VDD11 or the power supply line VDD12, includes a first sub-line VDD111 located in the second conductive layer GATE and a second sub-line VDD121 located in the first conductive layer SD. The first sub-line VDD111 includes a plurality of first wiring segments VDD112 arranged along the second direction Y, the plurality of first wiring segments VDD112 are located in each of the repeating units C1, and the second sub-line VDD121 passes through the display region 101 along the second direction Y. That is, the power supply line is a double-layered line, two layers thereof are respectively provided in the first conductive layer SD and the second conductive layer GATE. Each first wiring segment VDD112 of each first sub-line VDD111 in the second conductive layer GATE is located in one of the repeating units C1, and the second sub-line VDD121 in the first conductive layer SD extends along the second direction Y and passes through one line (for example, one column) of repeating units C1 in the second direction Y, that is, the second sub-line VDD121 is arranged continuously along the second direction Y in the display region. The second sub-line VDD121 is stacked on a side of the first sub-line VDD111 away from the base substrate 10, and is connected with the first sub-line VDD111 through at least one first via GK1 (as illustrated in FIG. 9F) penetrating through the second insulating layer 124. In conjunction with FIG. 9F, a plurality of first vias GK1 are arranged along the second direction Y for connecting the second sub-line VDD121 and the first sub-line VDD111. As a result, the wiring resistance of the power supply line can be reduced.

For example, as illustrated in FIG. 9E, FIG. 9G, and FIG. 10, each of the plurality of sensing signal lines, such as the sensing line SES11, includes a third sub-line SES111 located in the second conductive layer GATE and a fourth sub-line SES121 located in the first conductive layer SD. The third sub-line SES111 include a plurality of second wiring segments SES112 arranged along the second direction Y, the plurality of second wiring segments SES112 are located in each of the repeating units, and the fourth sub-line SES121 passes through the display region 101 along the second direction Y. That is, the sensing signal line is a double-layered line, two layers thereof are respectively provided in the first conductive layer SD and the second conductive layer GATE. Each second wiring segment SES112 of the third sub-line SES111 in the second conductive layer GATE is located in one of the repeating units C1, and the fourth sub-line SES121 in the first conductive layer SD extends along the second direction Y and passes through one line (for example, one column) of repeating units C1 in the second direction Y, that is, the fourth sub-line SES121 is arranged continuously along the second direction Y in the display region. The fourth sub-line SES121 is stacked on a side of the third sub-line SES111 away from the base substrate 10, and is connected with the third sub-line SES111 through at least one second via GK2 (as illustrated in FIG. 9F) penetrating through the second insulating layer 124. In conjunction with FIG. 9F, the plurality of second vias GK2 are arranged along the second direction Y for connecting the fourth sub-line SES121 and the third sub-line SES111. As a result, the wiring resistance of the sensing signal line can be reduced.

For example, in some embodiments, as illustrated in FIG. 9G and FIG. 10, the first conductive layer SD includes a first transition electrode ZL1 extending along the first direction X. A first terminal ZL11 of the first transition electrode ZL1 is connected with the first electrode TSD31 of the sensing transistor T3 of the third sub-pixel driving circuit P163 of the first repeating unit C11. A second terminal ZL12 of the first transition electrode ZL1 is connected with the first electrode TSD31 of the sensing transistor T3 of the first sub-pixel driving circuit P161 of the second repeating unit C12, and the first transition electrode ZL1 intersects with the sensing signal line SES11 so as to be connected with the sensing signal line SES11. That is, the sensing signal line SES11 simultaneously provides the reference voltage signal to the first repeating unit C11 and the second repeating unit C12 through the first transition electrode ZL1.

Figure 11A:
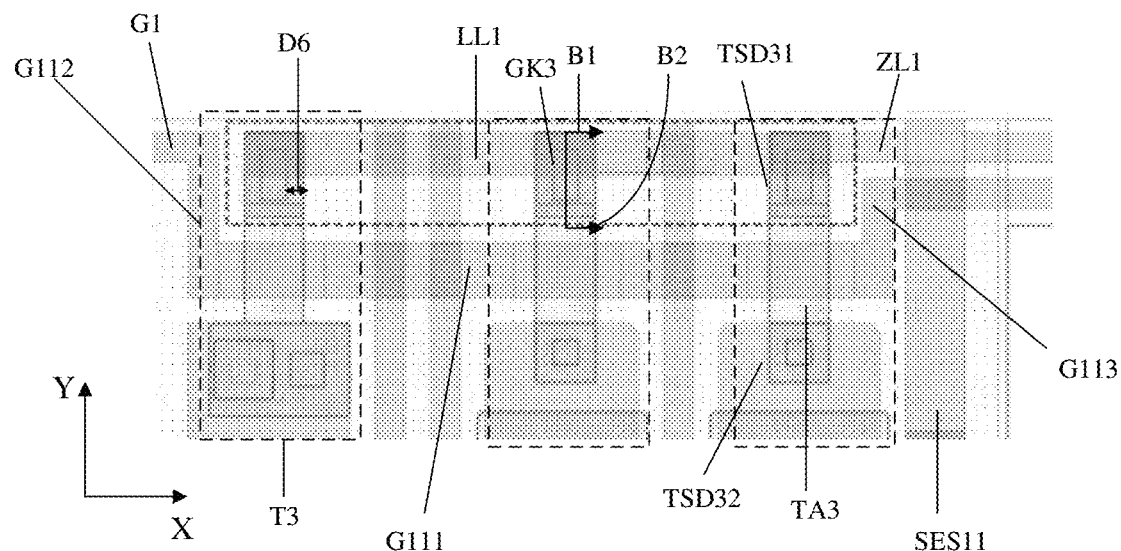
FIG. 11A is an enlarged view of a region A1 in FIG. 10.

FIG. 11A is an enlarged view of region A1 in FIG. 10.

For example, in some embodiments, as illustrated in FIG. 9E and FIG. 11A, the second conductive layer GATE includes a first connection line LL1 extending along the first direction X, and the first connection line LL1 is connected with the first electrodes TSD31 of the sensing transistors T3 of the first sub-pixel driving circuit P161, the second sub-pixel driving circuit P162, and the third sub-pixel driving circuit P163 of the first repeating unit C11 or the second repeating unit C12 through at least part (for example, part) of the third via GK3. That is, the first connection line LL1 is provided in the pixel region of each repeating unit, so that the first electrodes TSD31 of the sensing transistors T3 of the plurality of sub-pixel driving circuits in the pixel region of each repeating unit receive the reference voltage signal provided by the sensing signal line SES11. At least part (for example, part) of each of orthographic projections of the first electrodes TSD31 of the sensing transistors T3 of the first sub-pixel driving circuit P161, the second sub-pixel driving circuit P162, and the third sub-pixel driving circuit P163 on the main surface of the base substrate 10 overlaps with an orthographic projection of the first connection line LL1 on the main surface of the base substrate 10.

For example, the first connection line LL1 is not parallel to the first direction X, for example, intersects the first direction X at a certain angle; for example, the certain angle is less than or equal to 20°.

Figure 11B:
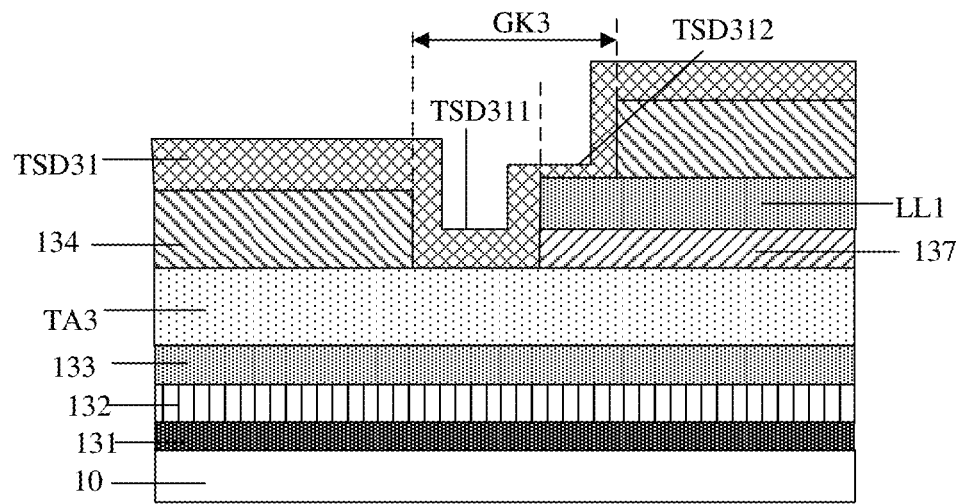
FIG. 11B is a schematic cross-sectional view along the line B1-B2 in FIG. 11A.

FIG. 11B is a schematic cross-sectional view along the line B1-B2 in FIG. 11A.

As illustrated in FIG. 11B, a part of the orthographic projection of the first electrode TSD31 on the main surface of the base substrate 10 overlaps with the orthographic projection of the first connection line LL1 on the main surface of the base substrate 10. The first electrode TSD31 of the sensing transistor T3 includes a first sub-portion TSD311 and a second sub-portion TSD312 connected with each other along the second direction Y. An orthographic projection of the third via GK3 on the base substrate 10 overlaps with orthographic projections of the first sub-portion TSD311 and the second sub-portion TSD312 of the first electrode TSD31 on the base substrate 10. A part of the third via GK3, such as a part overlapping with the orthographic projection of the first sub-portion TSD311 on the base substrate 10, is configured to penetrate through the second insulating layer 134 and the fourth insulating layer 137 to expose the active layer TA3 (for example, the source region TS3) of the sensing transistor T3. Another part of the third via GK3, such as a part overlapping with the ortho-graphic projection of the second sub-portion TSD312 on the base substrate 10, is configured to penetrate through the second insulating layer 134 to expose the first connection line LL1. The first sub-portion TSD311 is in contact with and connected with the active layer TA3 of the sensing transistor T3, and the second sub-portion TSD312 is in contact with and connected with the first connection line LL1. The cross-sectional structure of the third via GK3 for example is referred to as a semi-buried via, so that the wiring space can be reduced to leave space for the transparent region.

For example, as illustrated in FIG. 11A, a width of the third via GK3 in the first direction X is, for example, about 2-4 μm, for example, about 3 μm. A length of the third via GK3 in the second direction Y is, for example, about 5-7 μm, for example, about 6 μm.

For example, in some embodiments, as illustrated in FIG. 9G and FIG. 10, the first conductive layer SD further includes a second transition electrode ZL2 and a third transition electrode ZL3, and each of the second transition electrode ZL2 and the third transition electrode ZL3 includes the third node D (as illustrated in FIG. 8A). The second electrode TSD22 of the driving transistor T2 is located on the side of the driving transistor T2 away from the storage capacitor CST. One end of the second transition electrode ZL2 is connected with the second electrode TSD22 of the driving transistor T2 of the third sub-pixel driving circuit P163 of the second repeating unit C12, and the other end of the second transition electrode ZL2 is connected with the power supply line VDD11 close to the third sub-pixel driving circuit P163 of the second repeating unit C12 to provide the first power supply voltage. The second transition electrode ZL2 extends along the first direction X. One end of the third transition electrode ZL3 is connected with the second electrode TSD22 of the driving transistor T2 of the first sub-pixel driving circuit P161 of the first repeating unit C11, and the other end of the third transition electrode ZL3 is connected with the power supply line VDD12 close to the transparent region TM10 of the first repeating unit C11 to provide the first power supply voltage. The third transition electrode ZL3 is routed on a lower side (a side close to the data writing transistor T1) of the transparent region TM10, and is bent and routed to a side close to the driving transistor T2 at a boundary between the transparent region TM10 and the pixel region P10 to reduce the wiring space. That is, each of the power supply line VDD11 and the power supply line VDD12 is connected with the second transition electrode ZL2 and the third transition electrode ZL3 to be connected with sub-pixel driving circuits on both sides of the power supply line VDD11 or the power supply line VDD12, and the structure of the other side of the power supply line VDD11 and the structure of the other side of the power supply line VDD12 will not be repeated here.

Figure 11C:
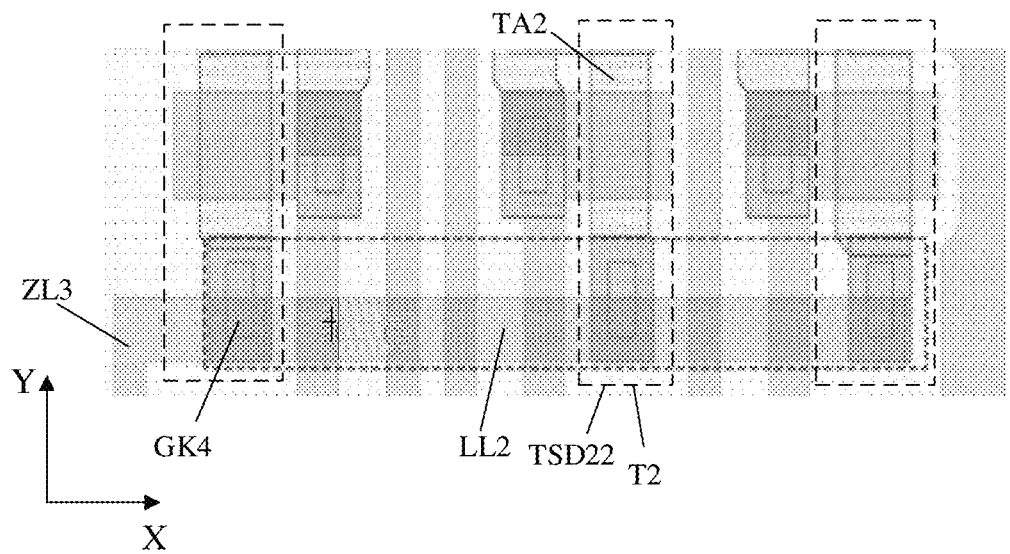
FIG. 11C is an enlarged view of a region A2 in FIG. 10.

FIG. 11C is an enlarged view of region A2 in FIG. 10.

For example, in some embodiments, as illustrated in FIG. 9G and FIG. 11C, the second conductive layer GATE includes a second connection line LL2 extending along the first direction X, and the second connection line LL2 is connected with the second electrodes TSD22 of the driving transistors T2 of the first sub-pixel driving circuit P161, the second sub-pixel driving circuit P162, and the third sub-pixel driving circuit P163 of the first repeating unit C11 or the second repeating unit C12 through at least part (for example, part) of the fourth via GK4. That is, the plurality of sub-pixel driving circuits in the pixel region are all connected with the power supply line through the second connection line LL2. A part of each of orthographic projections of the second electrodes TSD22 of the driving transistors T2 of the first sub-pixel driving circuit P161, the second sub-pixel driving circuit P162, and the third sub-pixel driving circuit P163 on the main surface of the base substrate 10 overlaps with an orthographic projection of the second connection line LL2 on the main surface of the base substrate 10. The cross-sectional structure of the fourth via GK4 is similar to that of the third via GK3, which will not be described in detail here.

For example, the second connection line LL2 is not parallel to the first direction X, for example, intersects the first direction X at a certain angle; for example, the certain angle is less than or equal to 20°.

For example, in some embodiments, as illustrated in FIG. 9G and FIG. 10, the display substrate 1 further includes a plurality of data lines, each of the plurality of data lines extends along the second direction Y, and the plurality of data lines include a first data line DR, a second data line DG, and a third data line DB located in each repeating unit. The first data line DR and the second data line DB are located between the first sub-pixel driving circuit P161 and the second sub-pixel drive circuit P162, and the third data line DB is located between the second sub-pixel driving circuit P162 and the third sub-pixel driving circuit P163. The first data line DR, the second data line DG, and the third data line DB are bent at the position corresponding to the electrode overlapping region 12. The first data line DR, the second data line DG, and the third data line DB are electrically connected with the first sub-pixel driving circuit P161, the second sub-pixel driving circuit P162, and the third sub-pixel driving circuit P163, respectively, to provide data signals, respectively. The first conductive layer further includes a fourth transition electrode ZL4, a fifth transition electrode ZL5, and a sixth transition electrode ZL6 arranged along the first direction X. The fourth transition electrode ZL4 is connected with the first data line DR and the second electrode TSD12 of the data writing transistor T1 of the first sub-pixel driving circuit P161, the fifth transition electrode ZL5 is connected with the second data line DG and the second electrode TSD12 of the data writing transistor T1 of the second sub-pixel driving circuit P162, and the sixth transition electrode ZL6 is connected with the third data line DB and the second electrode TSD12 of the data writing transistor T1 of the third sub-pixel driving circuit P163.

For example, the fourth transition electrode ZL4, the fifth transition electrode ZL5, and the sixth transition electrode ZL6 are not parallel to the first direction X, for example, intersect the first direction X at a certain angle; for example, the certain angle is less than or equal to 20°.

For example, as illustrated in FIG. 9G and FIG. 10, the combination of the second electrode TSD12 of the data writing transistor T1 of the first sub-pixel driving circuit P161 and the fourth transition electrode ZL4 and the combination of the second electrode TSD12 of the data writing transistor T1 of the second sub-pixel driving circuit P162 and the fifth transition electrode ZL5 are mirror symmetrical to each other.

For example, in some embodiments, as illustrated in FIG. 9E and FIG. 11A, the first gate line G1 and the second gate line G2 are located in the second conductive layer GATE, the first gate line G1 is close to the sensing transistors T3 of the first repeating unit C11 and the second repeating unit C12, and the second gate line G2 is close to the data writing transistors T1 of the first repeating unit C11 and the second repeating unit C12. The first gate line G1 includes a fold line portion, and the fold line portion includes a first fold line portion G111 extending along the first direction X, and a second fold line portion G112 and a third fold line portion G113 that are respectively connected with two ends of the first fold line portion G111 and extend along the second direction Y. The first fold line portion G111, the second fold line portion G112, and the third fold line portion G113 bypass the first connection line ZL1. An orthographic projection of the first fold line portion G111 on the main surface of the base substrate 10 overlaps with orthographic projections of the active layers TA3 of the sensing transistors T3 of the first sub-pixel driving circuit P161, the second sub-pixel driving circuit P162, and the third sub-pixel driving circuit P163 on the main surface of the base substrate 10, and the overlapping portions respectively form the gate electrodes TG3 of the sensing transistors T3.

For example, as illustrated in FIG. 9G and FIG. 10, the second conductive layer GATE further includes a third connection line LL3, a fourth connection line LL4, and a fifth connection line LL5. Each of the third connection line LL3, the fourth connection line LL4, and the fifth connection line LL5 is substantially "L" shaped fold line, the fourth connection line LL4 and the fifth connection line LL5 have the same bending direction (for example, toward the first sub-pixel driving circuit P161), and a bending direction (for example, toward the second sub-pixel driving circuit P162) of the third connection line LL3 is opposite to a bending direction of the fourth connection line LL4 and the fifth connection line LL5. The third connection line LL3 is connected with the second gate line G2 and the gate electrode TG1 of the data writing transistor T1 of the first sub-pixel driving circuit P161. The fourth connection line LL4 is connected with the second gate line G2 and the gate electrode TG1 of the data writing transistor T1 of the second sub-pixel driving circuit P162. The fifth connection line LL5 is connected with the second gate line G2 and the gate electrode TG1 of the data writing transistor T1 of the third sub-pixel driving circuit P163.

For example, in some embodiments, as illustrated in FIG. 9G and FIG. 10, the first conductive layer SD further includes a seventh transition electrode ZL7, an eighth transition electrode ZL8, and a ninth transition electrode ZL9 respectively extending along the second direction Y. Orthographic projections of the seventh transition electrode ZL7, the eighth transition electrode ZL8, and the ninth transition electrode ZL9 on the main surface of the base substrate 10 do not overlap with an orthographic projection of the second connection line ZL2 on the main surface of the base substrate 10. A first end (an upper end) of the seventh transition electrode ZL7 is connected with the gate electrode TG2 of the driving transistor T2 of the first sub-pixel driving circuit P161 through at least part (for example, part) of an eighth via GK8 penetrating through the second insulating layer 134, and a second end (a lower end) of the seventh transition electrode ZL7 is connected with the first electrode TSD11 of the data writing transistor T1 of the first sub-pixel driving circuit P161. A first end (an upper end) of the eighth transition electrode ZL8 is connected with the gate electrode TG2 of the driving transistor T2 of the second sub-pixel driving circuit P162 through at least part (for example, part) of a ninth via GK9 penetrating through the second insulating layer 134, and a second end (a lower end) of the eighth transition electrode ZL8 is connected with the first electrode TSD11 of the data writing transistor T1 of the second sub-pixel driving circuit P162. A first end (an upper end) of the ninth transition electrode ZL9 is connected with the gate electrode TG3 of the driving transistor T3 of the third sub-pixel driving circuit P163 through at least part (for example, part) of a tenth via GK10 penetrating through the second insulating layer 134, and a second end (a lower end) of the ninth transition electrode ZL9 is connected with the first electrode TSD11 of the data writing transistor T1 of the third sub-pixel driving circuit P163.

For example, the seventh transition electrode ZL7, the eighth transition electrode ZL8, and the ninth transition electrode ZL9 are not parallel to the second direction Y, for example, intersect the second direction Y at a certain angle; for example, the certain angle is less than or equal to 20°.

For example, each of the structures of the eighth via GK8, the ninth via GK9, and the tenth via GK10 is similar to the structure of the third via GK3, which will not be repeated here.

For example, in some embodiments, as illustrated in FIG. 10, in the second direction Y, a portion of the first gate line G1 that is routed with the first connection line ZL1 side by side, is located on a side of the first connection line ZL1 close to the transparent region TM10 of the second repeating unit C12. In the second direction Y, the first connection line ZL1 is spaced apart from the first fold line portion G111 of the first gate line G1, and the second connection line ZL2 is spaced apart from the second gate line G2, thereby reducing the interference between signals of the lines.

Figure 12A:
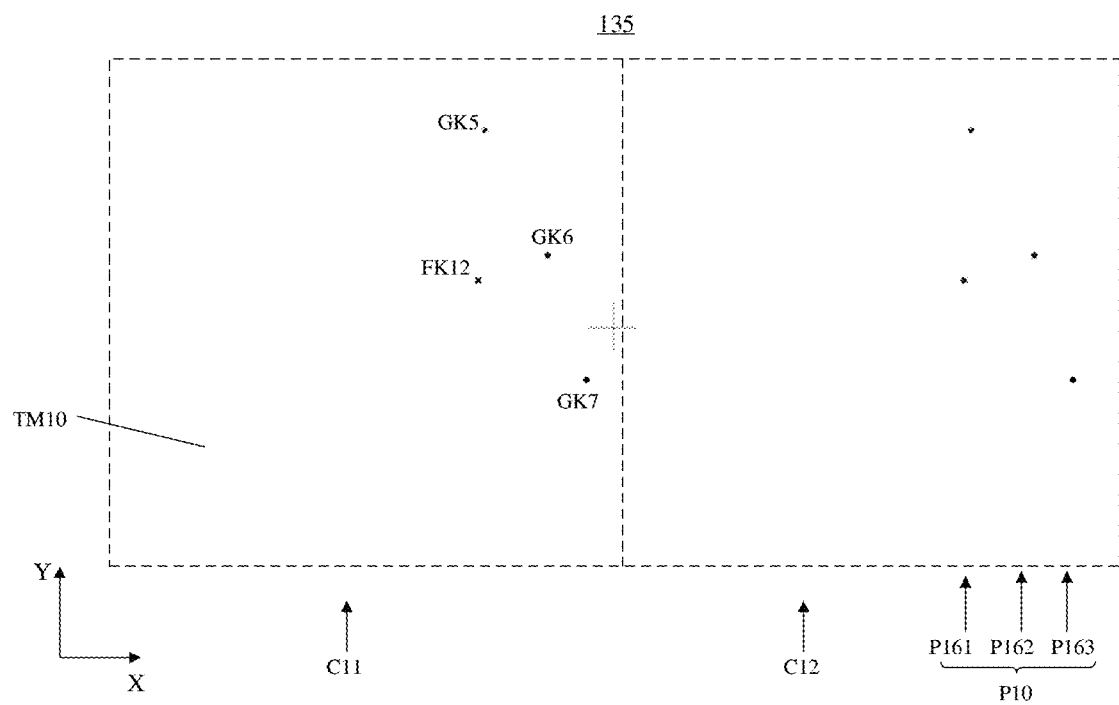
FIG. 12A is a plan view of a passivation layer provided by at least one embodiment of the present disclosure.
Figure 12B:
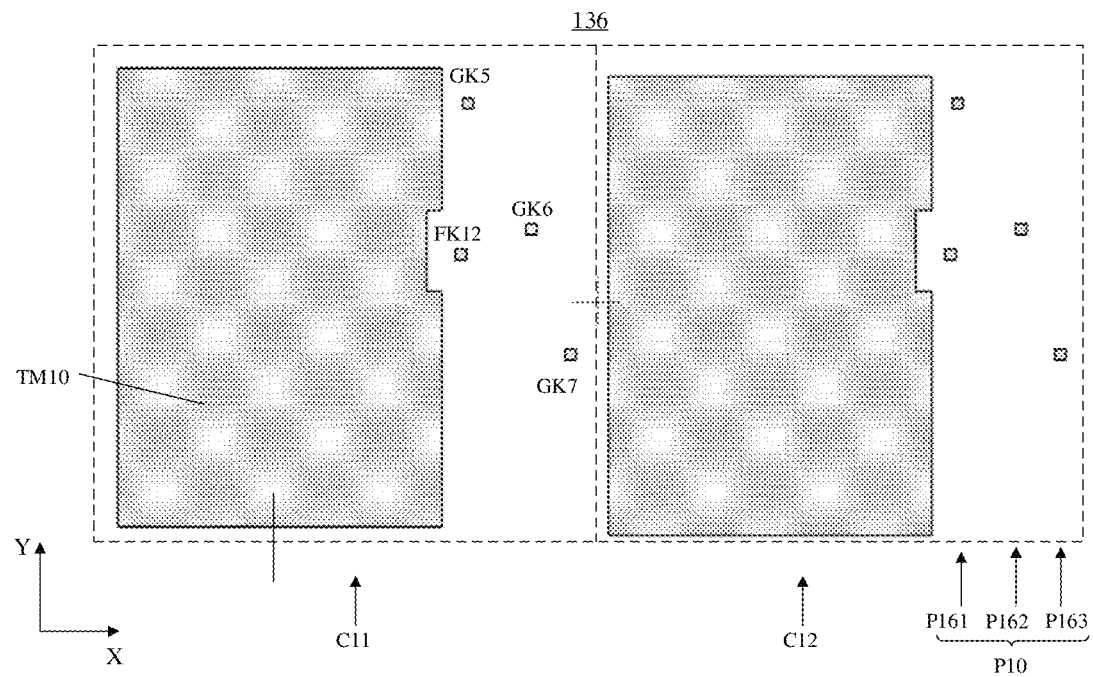
FIG. 12B is a plan view of a third insulating layer provided by at least one embodiment of the present disclosure.
Figure 12C:
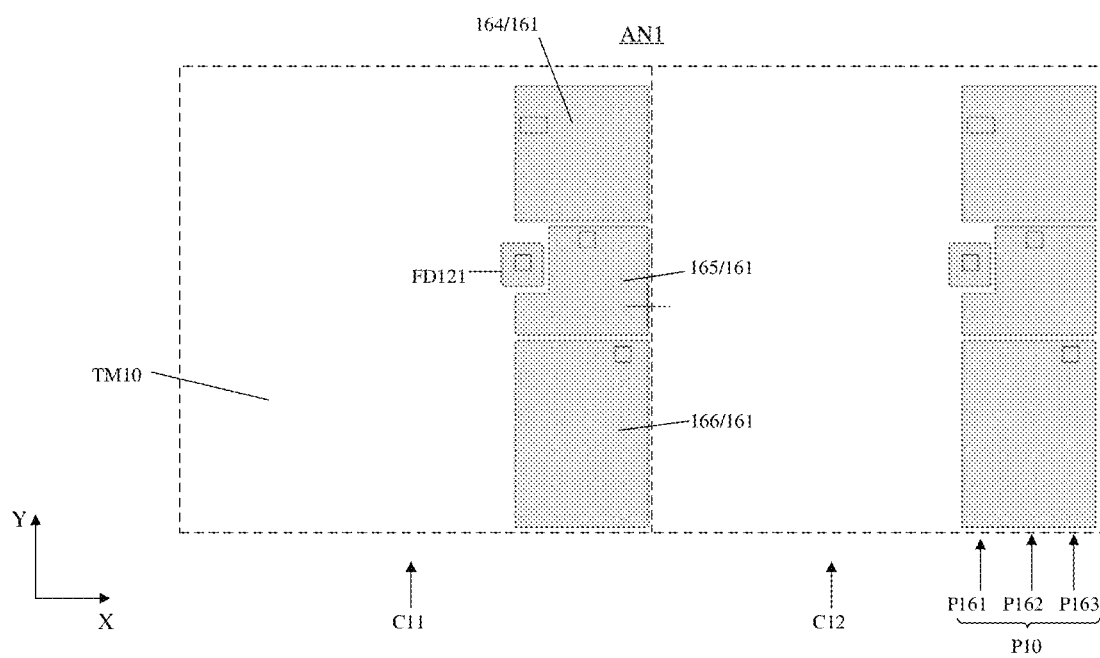
FIG. 12C is a plan view of a first sub-layer of a first electrode layer provided by at least one embodiment of the present disclosure.
Figure 12D:
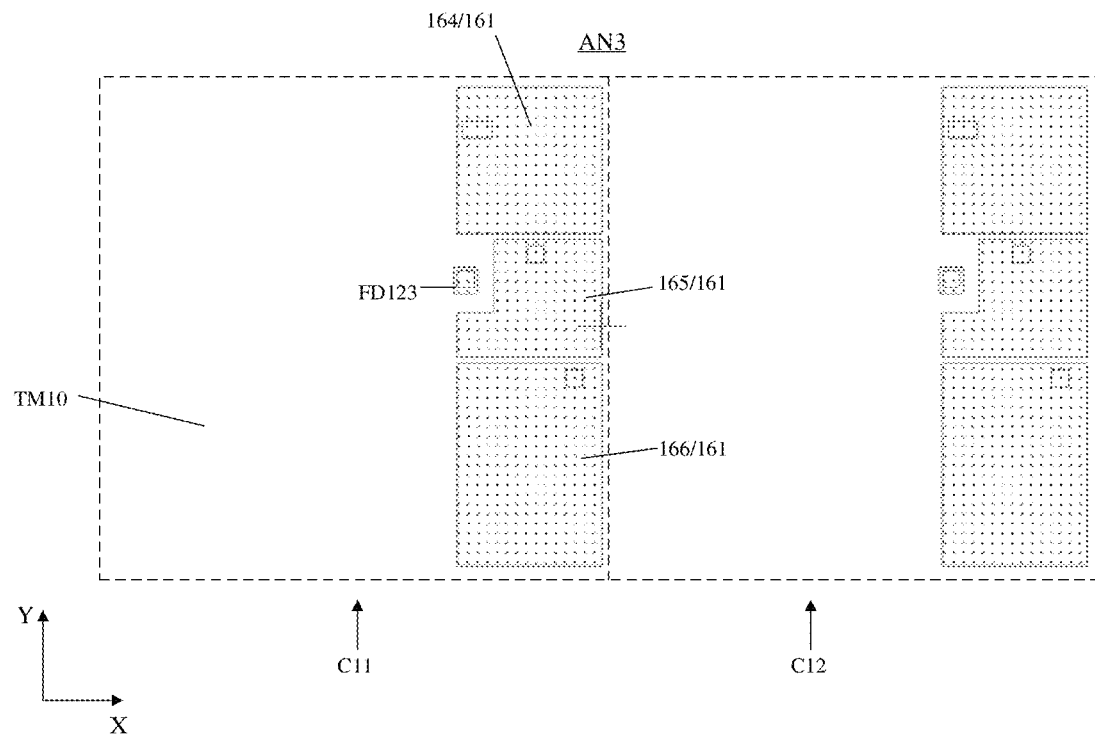
FIG. 12D is a plan view of a third sub-layer of the first electrode layer provided by at least one embodiment of the present disclosure.
Figure 12E:
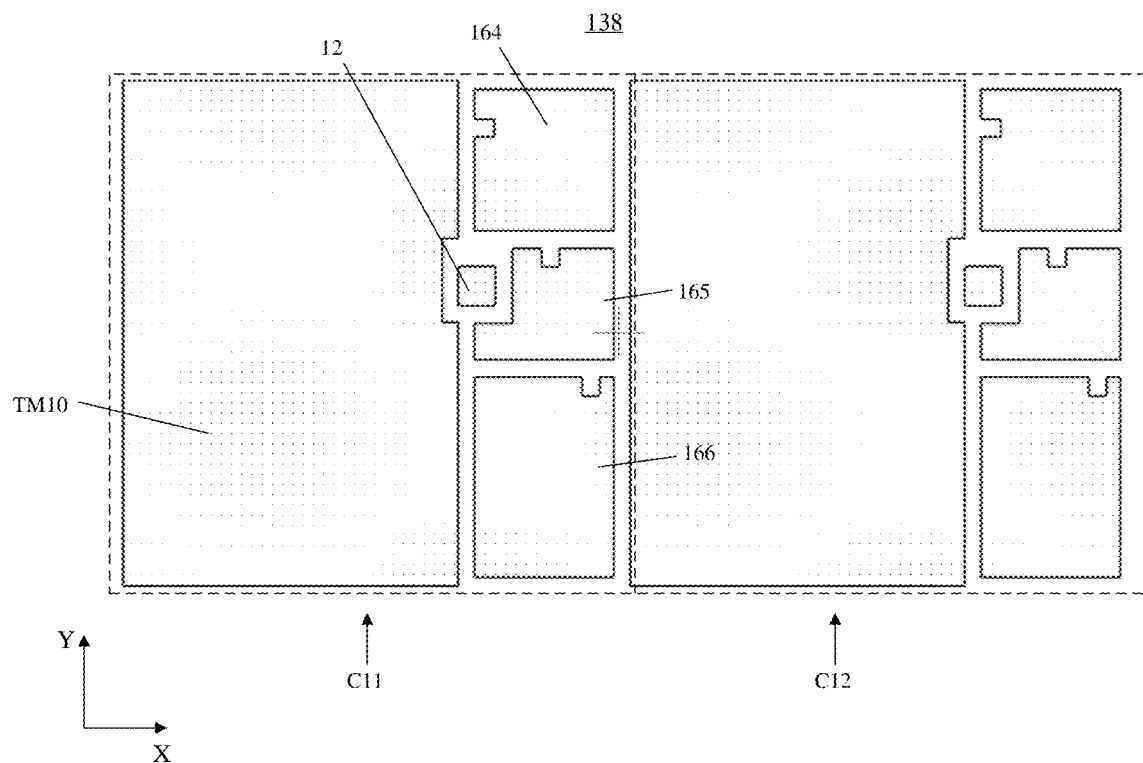
FIG. 12E is a plan view of a pixel defining layer provided by at least one embodiment of the present disclosure.

FIG. 12A is a plan view of a passivation layer provided by at least one embodiment of the present disclosure. FIG. 12B is a plan view of a third insulating layer provided by at least one embodiment of the present disclosure. FIG. 12C is a plan view of a first sub-layer of a first electrode layer provided by at least one embodiment of the present disclosure. FIG. 12D is a plan view of a third sub-layer of a first electrode layer provided by at least one embodiment of the present disclosure. FIG. 12E is a plan view of a pixel defining layer provided by at least one embodiment of the present disclosure. The structure of the display substrate will be further described in detail with reference to FIG. 12A to FIG. 12E.

For example, in some embodiments, as illustrated in FIG. 6, FIG. 7, and FIG. 12C, the light-emitting elements 160 of the plurality of sub-pixels of each repeating unit C1 include a first light-emitting element 164, a second light-emitting element 165, and a third light-emitting element 166. The first light-emitting element 164, the second light-emitting element 165, and the third light-emitting element 166 are provided to correspond to the first sub-pixel filter region LG1, the second sub-pixel filter region LG2, and the third sub-pixel filter region LG3, respectively. The display substrate 1 further includes a fifth via GK5, a sixth via GK6, and a seventh via GK7 that penetrate through at least the third insulating layer 136 (for example, further penetrate through the passivation layer 135). The fifth via GK5, the sixth via GK6, and the seventh via GK7 are respectively configured to expose the first sub-pixel driving circuit P161, the second sub-pixel driving circuit P162, and the third sub-pixel driving circuit P163. The first electrode 161 of the first light-emitting element 164 is connected with the first sub-pixel driving circuit P161 through the fifth via GK5. The first electrode 161 of the second light-emitting element 165 is connected with the second sub-pixel driving circuit P162 through the sixth via GK6. The first electrode 161 of the third light-emitting element 166 is connected with the third sub-pixel driving circuit P163 through the seventh via GK7.

For example, as illustrated in FIG. 12A and FIG. 12B, each of the fifth via GK5, the sixth via GK6, and the seventh via GK7 penetrates through the third insulating layer 136 and the passivation layer 135, so as to connect the first light-emitting element 164 with the first sub-pixel driving circuit P161, connect the second light-emitting element 165 with the second sub-pixel driving circuit P162, and connect the third light-emitting element 166 with the third sub-pixel driving circuit P163.

It should be noted that, for the third insulating layer 136 and the passivation layer 135 as illustrated in FIG. 12A and FIG. 12B, the illustrated filled part is a part that is cut out (i.e. a hole in the third insulating layer 136 and the passivation layer 135). For example, as illustrated in FIG. 6, an orthographic projection of the fifth via GK5 on the main surface of the base substrate 10 does not overlap with an orthographic projection of a light-emitting region of the first light-emitting element 164 on the main surface of the base substrate 10, so as to improve the flatness of the light-emitting region of the first light-emitting element 164. An orthographic projection of the sixth via GK6 on the main surface of the base substrate 10 does not overlap with an orthographic projection of a light-emitting region of the second light-emitting element 165 on the main surface of the base substrate 10, so as to improve the flatness of the light-emitting region of the second light-emitting element 165. An orthographic projection of the seventh via GK7 on the main surface of the base substrate 10 does not overlap with an orthographic projection of a light-emitting region of the third light-emitting element 166 on the main surface of the base substrate 10, so as to improve the flatness of the light-emitting region of the third light-emitting element 166.

For example, the size range of each of the fifth via GK5, the sixth via GK6, and the seventh via GK7 is about 9-12 μm. For example, the size of each of the fifth via GK5, the sixth via GK6, and the seventh via GK7 is selected to be about 10 or 11 μm. The sizes of the fifth via GK5, the sixth via GK6, and the seventh via GK7 are selected depending on the display substrate during the manufacturing process.

For example, in some embodiments, as illustrated in FIG. 2, FIG. 6 and FIG. 7, orthographic projections of the fifth via GK5 and the sixth via GK6 on the main surface of the base substrate 10 are close to an orthographic projection of the light-shielding bar BM1, which is between the first sub-pixel filter region LG1 and the second sub-pixel filter region LG2, on the main surface of the base substrate 10, and are respectively located on two sides of the orthographic projection of the light-shielding bar BM1, which is between the first sub-pixel filter region LG1 and the second sub-pixel filter region LG2, on the main surface of the base substrate 10. That is, the fifth via GK5 is below the light-emitting region of the first light-emitting element 164 and on an upper side of the light-shielding bar BM1, and the sixth via GK6 is located on an upper side of the light-emitting region of the second light-emitting element 165. Thus, the areas of the light-emitting regions of the first light-emitting element 164 and the second light-emitting element 165 can be increased. An orthographic projection of the seventh via GK7 on the main surface of the base substrate 10 is close to an orthographic projection of the light-shielding bar BM2, which is between the second sub-pixel filter region LG2 and the third sub-pixel filter region LG3, on the main surface of the base substrate 10, and overlaps with the third sub-pixel filter region LG3. That is, the seventh via GK7 is located on an upper side of the light-emitting region of the third light-emitting element 166 to increase the area of the light-emitting region of the third light-emitting element 166. It should be noted that in this embodiment, the position of the fifth via GK5 may be changed according to actual requirements.

For example, in some other embodiments, as illustrated in FIG. 2, FIG. 6 and FIG. 7, an orthographic projection of the fifth via GK5 on the main surface of the base substrate 10 overlaps with an orthographic projection of an end of the first electrode plate CST1 of the storage capacitor CST of the first sub-pixel driving circuit P161, which is connected with the second electrode TSD31 of the sensing transistor T3, on the main surface of the base substrate 10. That is, the fifth via GK5 is located on an upper side of the light-emitting region of the first light-emitting element 164 to reduce the influence on the light-emitting region of the first light-emitting element 164. An orthographic projection of the sixth via GK6 on the main surface of the base substrate 10 is close to the orthographic projection of the light-shielding bar BM1, which is between the first sub-pixel filter region LG1 and the second sub-pixel filter region LG2, on the main surface of the base substrate 10, and overlaps with the second sub-pixel filter region LG2. That is, the sixth via GK6 is located on the upper side of the light-emitting region of the second light-emitting element 165 to increase the area of the light-emitting region of the second light-emitting element 165. An orthographic projection of the seventh via GK7 on the main surface of the base substrate 10 is close to the orthographic projection of the light-shielding bar BM2, which is between the second sub-pixel filter region LG2 and the third sub-pixel filter region LG3, on the main surface of the base substrate 10, and overlaps with the third sub-pixel filter region LG3. That is, the seventh via GK7 is located on the upper side of the light-emitting region of the third light-emitting element 166 to increase the area of the light-emitting region of the third light-emitting element 166.

For example, as illustrated in FIG. 12C, the first layer AN1 of the first electrode layer AN includes the first sub-electrode layer FD121 and the layer, close to the base substrate 10, of each of the first electrodes of the first light-emitting element 164, the second light-emitting element 165, and the third light-emitting element 163. The layers, close to the base substrate 10, of the first electrodes of the first light-emitting element 164, the second light-emitting element 165, and the third light-emitting element 163 are respectively connected with the first sub-pixel driving circuit P161, the second sub-pixel driving circuit P162, and the third sub-pixel driving circuit P163 through the fifth via GK5, the sixth via GK6, and the seventh via GK7, respectively. The first sub-electrode layer FD121 is connected with the first connection electrode FD11 through the second hole FK12 that penetrates the passivation layer 135 and the third insulating layer 136 in FIG. 12A and FIG. 12B.

For example, as illustrated in FIG. 12D, the third layer AN3 of the first electrode layer AN includes the second electrode layer FD122 and the layer, away from the base substrate 10, of each of the first electrodes of the first light-emitting element 164, the second light-emitting element 165, and the third light-emitting element 163.

For example, as illustrated in FIG. 12E, the pixel defining layer 138 has a plurality of openings to define the transparent region TM10, the light-emitting regions of the first light-emitting element 164, the second light-emitting element 165 and the third light-emitting element 163, and the electrode overlapping region 12. It should be noted that for the pixel defining layer 138, the filled part in the figure represents a part that is cut out from the pixel defining layer 138.

For example, a width of each line of the first conductive layer SD (as illustrated in FIG. 9G) is 4 to 5 μm. For example, a width of each line of the second conductive layer GATE (as illustrated in FIG. 9E) is 4 to 5 μm. For example, the first electrode or the second electrode of the data writing transistor T1 and the driving transistor T2 exceeds a via by 1 μm, for example, a width thereof is 4.0 to 4.5 μm.

For example, in some examples, a thickness of the second conductive layer GATE is 2000-300 angstroms, and a thickness of the first conductive layer SD is 5000-8000 angstroms, which are not limited in the embodiments of the present disclosure.

Figure 13:
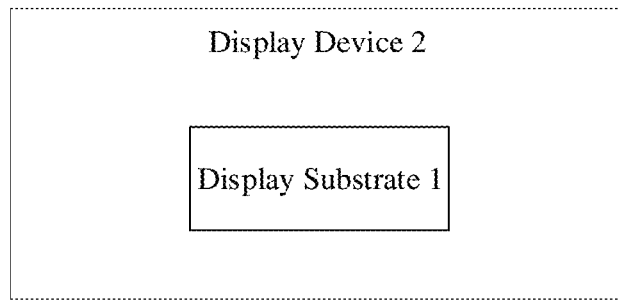
FIG. 13 is a schematic view of a display device provided by at least one embodiment of the present disclosure.

At least one embodiment of the present disclosure further provides a display device. FIG. 13 is a schematic view of a display device provided by at least one embodiment of the present disclosure. As illustrated in FIG. 13, the display device 2 includes the display substrate 1 provided by any embodiment of the present disclosure, for example, the display substrate 1 as illustrated in FIG. 2.

It should be noted that the display device 2 may be a product or component with a transparent display function. The display device 2 may further include other components, such as a data driving circuit, a timing controller, etc., which are not limited in the embodiments of the present disclosure.

It should be noted that, for the sake of clarity and conciseness, the embodiments of the present disclosure do not provide all the constituent units of the display device. In order to realize the basic function of the display device, those skilled in the art can provide and install other structures not illustrated according to specific needs, which are not limited in the embodiments of the present disclosure.

Regarding the technical effects of the display device 2 provided by the above-mentioned embodiments, reference may be made to the technical effects of the display substrate 1 provided in the embodiments of the present disclosure, which will not be repeated here.

FIG. 14A-FIG. 14F are schematic views of a manufacturing process of a display device provided by at least one embodiment of the present disclosure.

Figure 14A:
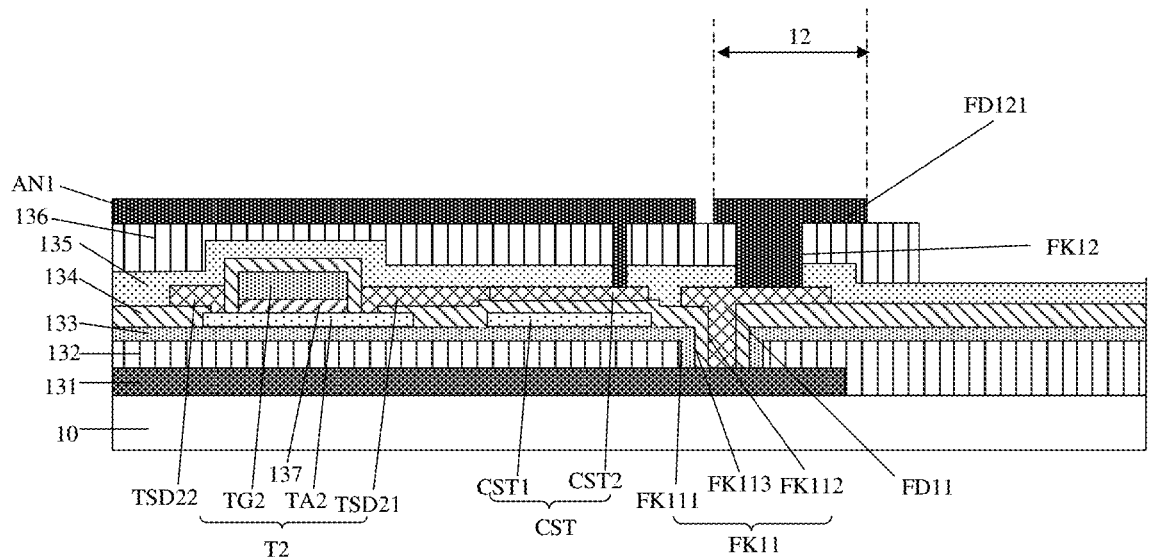
FIG. 14A-FIG. 14F are schematic views of a manufacturing process of a display device provided by at least one embodiment of the present disclosure.

For example, as illustrated in FIG. 14A, a base substrate 10 is provided, and a metal material is deposited on the base substrate to form a light-shielding layer 131 through a patterning process. For example, the metal material includes silver, aluminum, chromium, copper, molybdenum, titanium, aluminum neodymium alloy, copper molybdenum alloy, molybdenum tantalum alloy, molybdenum neodymium alloy, or any combination thereof. An insulating material is deposited on the light-shielding layer 131 to form a first insulating layer 132 through a patterning process. The first insulating layer 132 includes a first sub-hole FK111. For example, a material of the first insulating layer 132 includes inorganic insulating materials such as silicon oxide, silicon nitride, silicon oxynitride, or other suitable materials. An insulating material is deposited on the first insulating layer 132 to form a buffer layer 133 through a patterning process. The buffer layer 133 includes a third sub-hole FK113. A semiconductor material is deposited on the buffer layer 133 to form an active layer TA2 of a driving circuit T2 of a sub-pixel driving circuit and a first electrode plate CST1 of a storage capacitor CST through a patterning process, that is, the semiconductor layer ACT as illustrated in FIG. 9D is formed.

For example, as illustrated in FIG. 14A, an insulating material is deposited on the semiconductor layer ACT to form a fourth insulating layer 137 through a patterning process. A metal material is deposited on the fourth insulating layer 137 to form a gate electrode TG2 of the driving circuit T2 of the sub-pixel driving circuit, that is, the second conductive layer GATE as illustrated in FIG. 9E is formed. A material of the gate electrode TG2 of the driving circuit T2 includes, for example, a metal material or an alloy material, such as a metal single-layer or multi-layer structure formed by molybdenum, aluminum, titanium, etc. For example, the multi-layer structure is a structure in which multiple metal layers are stacked (such as a stack of three metal layers of titanium, aluminum and titanium (Ti/Al/Ti)). An insulating material is deposited on the second conductive layer GATE to form a second insulating layer 134 through a patterning process. The second insulating layer 134 includes a second sub-hole FK112. A metal material is deposited on the second insulating layer 134 to form a first electrode TSD21 and a second electrode TSD22 of the driving circuit T2 and a first connection electrode FD11 through a patterning process, that is, the first conductive layer SD is formed. For example, the material of the first electrode TSD21 and the second electrode TSD22 of the driving circuit T2 and the first connection electrode FD11 includes a metal material or an alloy material, such as a metal single-layer or multi-layer structure formed by molybdenum, aluminum, titanium, etc. For example, the multi-layer structure is a structure in which multiple metal layers are stacked ((such as a stack of three metal layers of titanium, aluminum and titanium (Ti/Al/Ti)). A passivation layer 135 and a third insulating layer 136 are sequentially formed on the first conductive layer SD. The passivation layer 135 and the third insulating layer 136 include a second hole FK12 and vias exposing the sub-pixel driving circuit.

For example, as illustrated in FIG. 14A, a metal material is deposited on the third insulating layer 136 to form a first layer AN1 of a first electrode layer AN through a patterning process. The first layer AN1 of the first electrode layer AN includes two parts spaced apart from each other, which are a first sub-electrode layer FD121 of the second connection electrode FD12 and the layer, close to the base substrate, of a first electrode 161 of a light-emitting element 160. The first sub-electrode layer FD121 of the second connection electrode FD12 is connected with the first connection electrode through the second hole FK12. The layer, close to the base substrate, of the first electrode 161 of the light-emitting element 160 is connected with the sub-pixel driving circuit through a via in the passivation layer 135 and the third insulating layer 136. For example, a material of the first layer AN1 of the first electrode layer AN includes at least one transparent conductive oxide material, such as indium tin oxide (ITO), indium zinc oxide (IZO), zinc oxide (ZnO), etc.

Figure 14B:
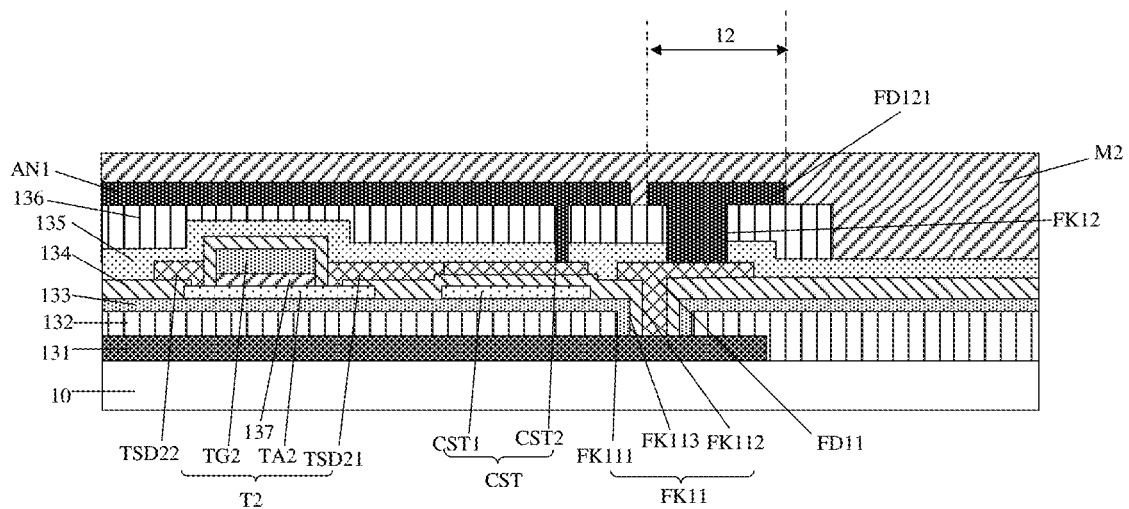

For example, as illustrated in FIG. 14B, a layer M2 is formed on the first layer AN1 of the first electrode layer AN by, for example, evaporation, and the layer M2 is used to form a second layer AN2 of the first electrode 161. For example, the layer M2 includes an alloy material, such as AlNd and the like.

Figure 14C:
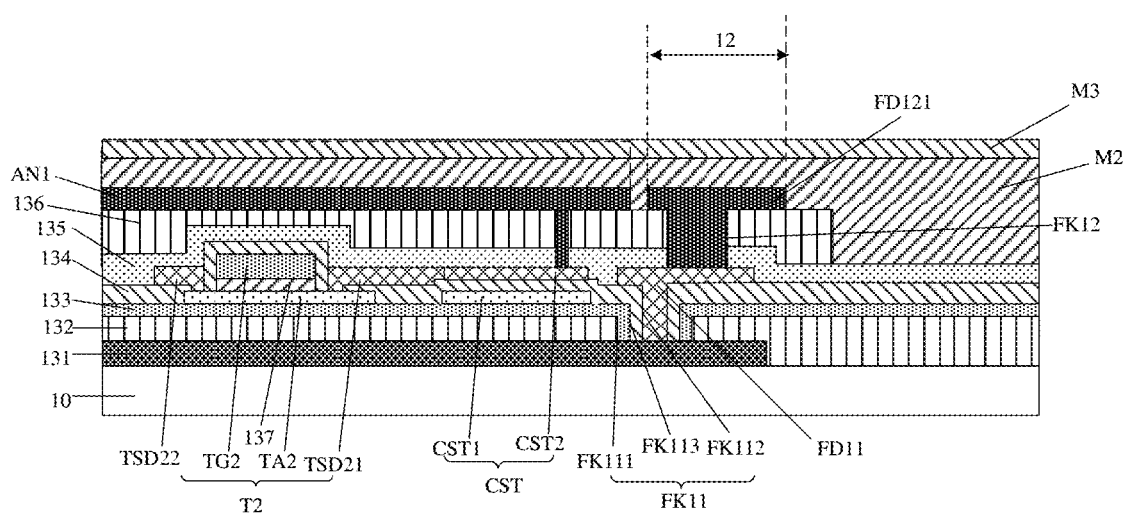

For example, as illustrated in FIG. 14C, a layer M3 is formed on the layer M2 by, for example, magnetron sputtering, and the layer M3 is used to form a third layer AN3 of the first electrode 161. For example, the layer M3 includes at least one transparent conductive oxide material, such as indium tin oxide (ITO), indium zinc oxide (IZO), zinc oxide (ZnO), and the like.

Figure 14D:
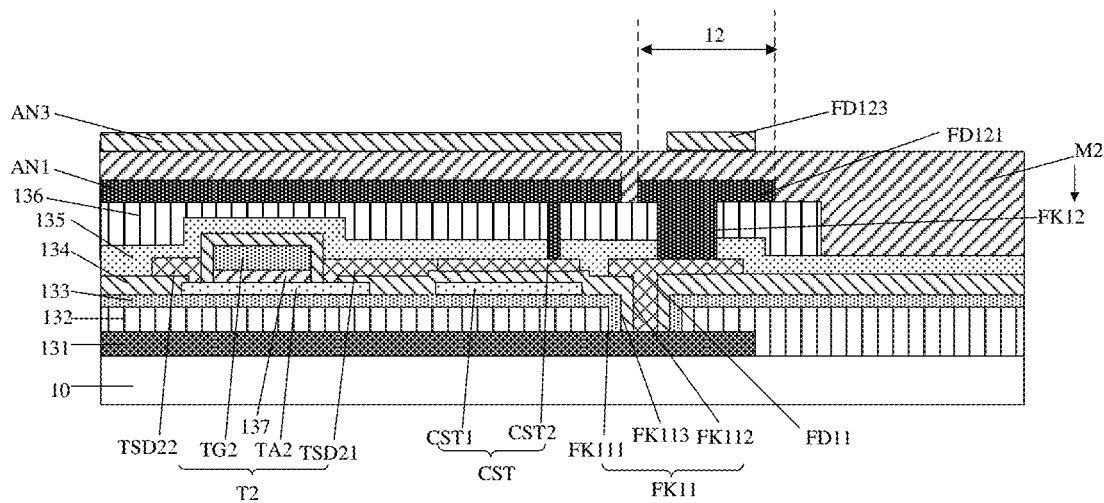

For example, as illustrated in FIG. 14D, a patterning process is performed on the layer M3 to form a third sub-electrode layer FD123 of the second connection electrode FD12 and the layer, away from the base substrate, of the first electrode 161 of the light-emitting element 160, that is, the third layer AN3.

Figure 14E:
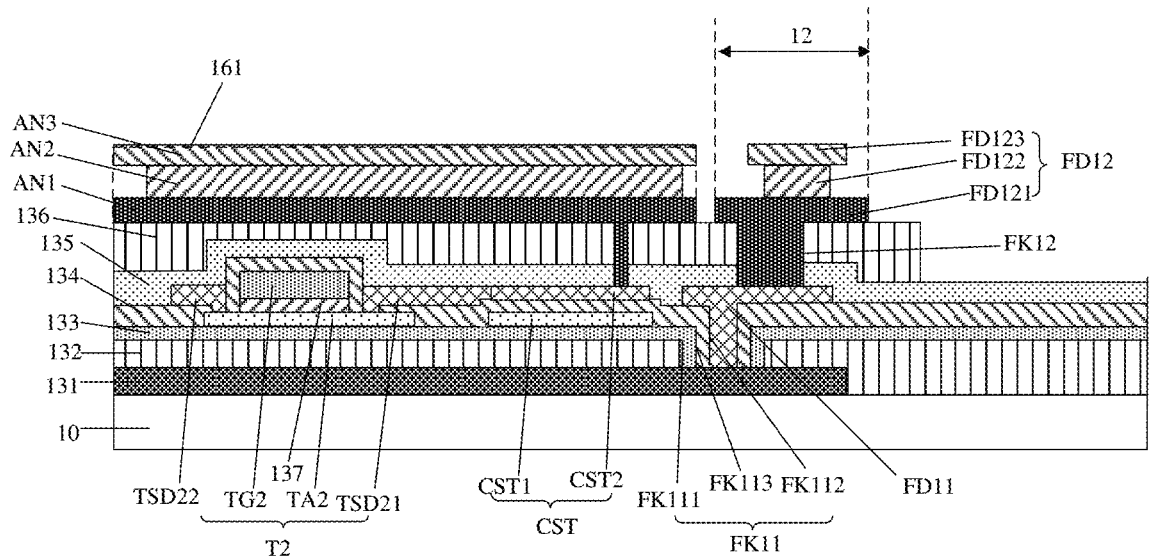

For example, as illustrated in FIG. 14E, a patterning process is performed on the layer M2 to form a second sub-electrode layer FD122 of the second connection electrode FD12 and an interlayer of the first electrode 161 of the light-emitting element 160, that is, the second layer AN2.

The manufacturing process of the first electrode layer AN of the first electrode 161 of the first light-emitting element as illustrated in FIG. 14A to FIG. 14E allows a cross-section of the first electrode 161 of the light-emitting element 160 has an I-shape and a cross-section of a combination of the first sub-electrode layer FD121, the second sub-electrode layer FD122, and the third sub-electrode layer FD123 has an I-shape.

Figure 14F:
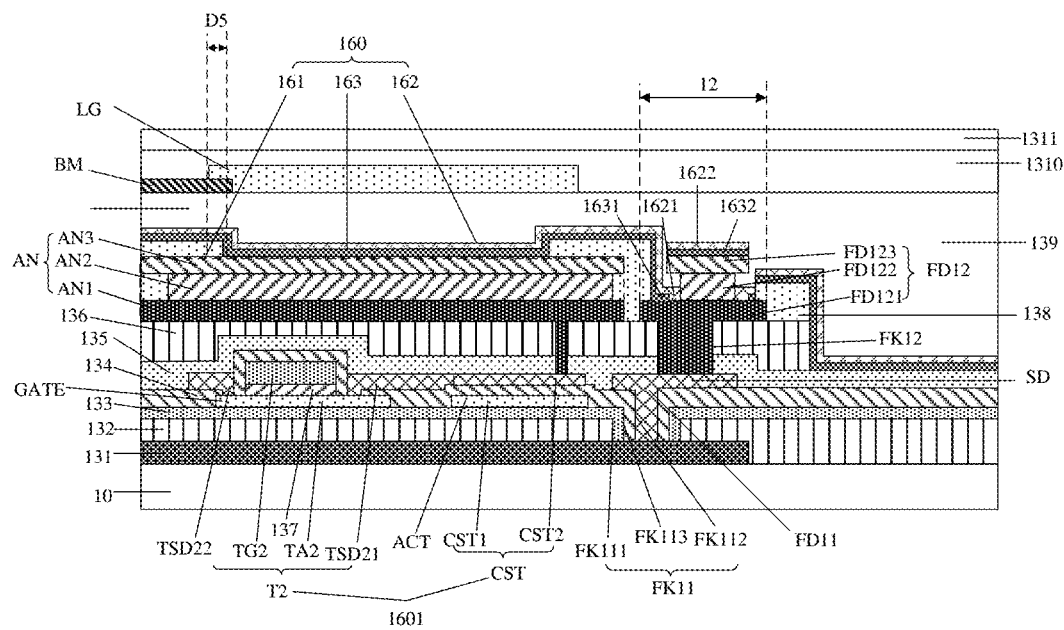

For example, as illustrated in FIG. 14F, a pixel defining layer 138, a light-emitting layer 163 of the light-emitting element 160, a second electrode 162 of the light-emitting element 160, an encapsulation layer 139, a black matrix BM, a filter layer LG, a light-transmitting layer 1310, and a protective layer 1311 are formed sequentially on the first electrode layer AN. The detailed manufacturing process of the above-mentioned layers will not be repeated.

It should be noted that the structure of each layer formed during the manufacturing process of the display substrate 2 may be referred to the introduction of FIG. 3, which will not be described in detail here.

The following statements should be noted:
(1) The accompanying drawings involve only the structure(s) in connection with the embodiment(s) of the present disclosure, and other structure(s) can be referred to common design(s).
(2) In case of no conflict, features in one embodiment or in different embodiments can be combined to obtain new embodiments.

The foregoing descriptions are merely exemplary implementations of the present disclosure, and are not used to limit the protection scope of the present disclosure, which is determined by the appended claims.

What is claimed is:

1. A display substrate, comprising:
a base substrate, comprising a display region, wherein the display region comprises a plurality of repeating units arranged in array, each of the plurality of repeating units comprises a transparent region and a pixel region which are arranged in a first direction, the pixel region comprises a plurality of sub-pixels, each of the plurality of sub-pixels comprises a sub-pixel driving circuit and a light-emitting element, the light-emitting element is located on a side of the sub-pixel driving circuit away from the base substrate, and the sub-pixel driving circuit is configured to drive the light-emitting element to emit light; and
a plurality of sensing signal lines provided on the base substrate and extending along a second direction different from the first direction, wherein two lines of repeating units are provided between adjacent two of the plurality of sensing signal lines, the two lines of repeating units respectively extend along the second direction, and each of the plurality of sensing signal lines is connected with sub-pixel driving circuits of the plurality of sub-pixels of two lines of repeating units which are adjacent to the each of the plurality of sensing signal lines and extend along the second direction, and is configured to provide a reference voltage signal, wherein
the sub-pixel driving circuit comprises a driving transistor and a storage capacitor,
the light-emitting element comprises a first electrode, a second electrode and a light-emitting layer located between the first electrode and the second electrode; the second electrode is a cathode and has a light-shielding auxiliary electrode which is electrically connected with the second electrode and made of a metal material, the auxiliary electrode is arranged on the base substrate and located at a side of the sub-pixel driving circuit close to the base substrate, and an orthographic projection of the auxiliary electrode on a main surface of the base substrate overlaps with the light-emitting element, the driving transistor and the storage capacitor in the pixel region of the repeating unit and does not overlap with the transparent region of the repeating unit, wherein the display region comprises a first repeating unit and a second repeating unit that are adjacently arranged along the first direction, the plurality of sub-pixel driving circuits in the pixel region of the first repeating unit and the plurality of sub-pixel driving circuits in the pixel region of the second repeating unit respectively comprise a first sub-pixel driving circuit, a second sub-pixel driving circuit, and a third sub-pixel driving circuit that are arranged in the first direction;

each of the sub-pixel driving circuits comprises a data writing circuit, a driving circuit, a charge storage circuit, and a sensing circuit; the data writing circuit comprises a data writing transistor, the driving circuit comprises the driving transistor, and the sensing circuit comprises a sensing transistor;

the display substrate further comprises a semiconductor layer, a first conductive layer, a second conductive layer, a second insulating layer, and a fourth insulating layer located on the base substrate;

the semiconductor layer comprises an active layer of the data writing transistor, an active layer of the driving transistor, and an active layer of the sensing transistor;

the second conductive layer comprises a first connection line extending along the first direction, the first connection line is connected with first electrodes of sensing transistors of the first sub-pixel driving circuit, the second sub-pixel driving circuit, and the third sub-pixel driving circuit of the first repeating unit or the second repeating unit through at least part of a third via, the first electrode of the sensing transistor comprises a first sub-portion and a second sub-portion connected with each other along the second direction, a part of the third via is configured to penetrate through the second insulating layer and the fourth insulating layer to expose the active layer of the sensing transistor, another part of the third via is configured to penetrate through the second insulating layer to expose the first connection line; and the first sub-portion is in contact with the active layer of the sensing transistor, and the second sub-portion is in contact with the first connection line.

2. The display substrate according to claim 1, further comprising a plurality of power supply lines, wherein the plurality of power supply lines are provided on the base substrate and extend along the second direction;

in the first direction, the plurality of power supply lines and the plurality of sensing signal lines are alternately arranged;

one line of repeating units extending along the second direction is provided between each of the plurality of sensing signal lines and a power supply line adjacent to the each of the plurality of sensing signal lines, two lines of repeating units respectively extending along the second direction are provided between adjacent two of the plurality of power supply lines, and each of the plurality of power supply lines is connected with sub-pixel driving circuits of the plurality of sub-pixels of two lines of repeating units which are adjacent to the each of the plurality of power supply lines and respectively extend along the second direction, and is configured to provide a first power supply voltage.

3. The display substrate according to claim 2, further comprising a peripheral region, a gate driving circuit, and a plurality of gate lines extending along the first direction, wherein the peripheral region at least partially surrounding the display region, the gate driving circuit is located in the peripheral region, and the plurality of gate lines are connected with the gate driving circuit and are connected with sub-pixel driving circuits of pixel regions of respective lines of the repeating units respectively extending along the first direction;

the gate driving circuit is configured to sequentially output a gate scanning signal for driving the sub-pixel driving circuits of the pixel regions of respective lines of the repeating units respectively extending along the first direction; and the plurality of repeating units are arranged in N lines respectively extending along the first direction, the gate driving circuit comprises N cascaded shift register units, and an $(n)^{th}$-stage shift register unit is connected with sub-pixel driving circuits of pixel regions of an $(n)^{th}$ line of repeating units, wherein n is an integer and $1 \leq n \leq N$, and N is an integer greater than or equal to 2.

4. The display substrate according to claim 3, wherein the sub-pixel driving circuits of the pixel region are arranged along the first direction;

the driving circuit is connected with a first node, a second node, and a third node, the third node is further connected with a first power supply voltage terminal, the first power supply voltage terminal is connected with one of the plurality of power supply lines, and the driving circuit is configured to receive the first power supply voltage through the third node and control a driving current flowing through the light-emitting element under control of a level of the first node;

the data writing circuit is connected with the first node, and is configured to receive the gate scanning signal as a scanning driving signal and write a data signal to the first node in response to the scanning driving signal;

the charge storage circuit is connected with the first node and the second node, and is configured to store the data signal that is written and a reference voltage signal;

the sensing circuit is connected with the second node, and is configured to receive the gate scanning signal as a sensing driving signal, the sensing circuit is further connected with one of the plurality of sensing signal lines to receive the reference voltage signal and write the reference voltage signal to the driving circuit or read a sensing voltage signal from the driving circuit in response to the sensing driving signal; and the light-emitting element is connected with the second node and a second power supply voltage terminal, and is configured to receive a second power supply voltage through the second power supply voltage terminal and emit light under the driving of the driving current.

5. The display substrate according to claim 4, wherein the plurality of gate lines comprises a first gate line and a second gate line;

the first gate line is connected with data writing circuits of a plurality of sub-pixel driving circuits of pixel regions of a $(M)^{th}$ line of repeating units extending in the first direction, sensing circuits of a plurality of sub-pixel driving circuits of pixel regions of a (M−1)$^{th}$ line of repeating units extending in the first direction, and an output terminal of a (M)$^{th}$-stage shift register unit, so that a gate scanning signal output from the output terminal of the (M)$^{th}$-stage shift register unit is outputted to the data writing circuits of the plurality of sub-pixel driving circuits of the pixel regions of the (M)$^{th}$ line of repeating units as a scanning driving signal, and is outputted to the sensing circuits of the plurality of sub-pixel driving circuits of the pixel regions of the (M−1)$^{th}$ line of repeating units as a sensing driving signal; and the second gate line is connected with sensing circuits of the plurality of sub-pixel driving circuits of the pixel regions of the (M)$^{th}$ line of repeating units extending in the first direction, data writing circuits of a plurality of sub-pixel driving circuits of pixel regions of a (M+1)$^{th}$ line of repeating units extending in the first direction, and an output terminal of a (M+1)$^{th}$-stage shift register unit, so that a gate scanning signal output from the output terminal of the (M+1)$^{th}$-stage shift register unit is outputted to the data writing circuits of the plurality of sub-pixel driving circuits of the pixel regions of the (M+1)$^{th}$ line of repeating units as a scanning driving signal, and is outputted to the sensing circuits of the plurality of sub-pixel driving circuits of the pixel regions of the (M)$^{th}$ line of repeating units as a sensing driving signal, wherein 1<M<N, and M is an integer.

6. The display substrate of claim 5, wherein
the active layer of the data writing transistor, the active layer of the driving transistor, and the active layer of the sensing transistor respectively extend along the second direction, and the base substrate is a flexible substrate.

7. The display substrate according to claim 6, wherein
the second conductive layer is located on a side of the semiconductor layer away from the base substrate, the fourth insulating layer is located between the second conductive layer and the semiconductor layer, the first conductive layer is located on a side of the second conductive layer away from the base substrate, and the second insulating layer is located between the second conductive layer and the first conductive layer;

each of the plurality of power supply lines comprises a first sub-line located in the second conductive layer and a second sub-line located in the first conductive layer, the first sub-line comprises a plurality of first wiring segments arranged along the second direction, the plurality of first wiring segments are located in each of the repeating units, and the second sub-line passes through the display region along the second direction; and the second sub-line is stacked on a side of the first sub-line away from the base substrate, and is connected with the first sub-line through at least one first via penetrating through the second insulating layer.

8. The display substrate according to claim 6, wherein
each of the plurality of sensing signal lines comprises a third sub-line located in a second conductive layer and a fourth sub-line located in the first conductive layer, the third sub-line comprises a plurality of second wiring segments arranged along the second direction, the plurality of second wiring segments are located in each of the repeating units, and the fourth sub-line passes through the display region along the second direction; and the fourth sub-line is stacked on a side of the third sub-line away from the base substrate, and is connected with the third sub-line through at least one second via penetrating through the second insulating layer.

9. The display substrate according to claim 5, wherein
one of the plurality of sensing signal lines is provided between the pixel region of the first repeating unit and a transparent region of the second repeating unit, and the one of the plurality of sensing signal lines is connected with the plurality of sub-pixel driving circuits of pixel regions of the first repeating unit and the second repeating unit;

one of the plurality of power supply lines is provided on a side of the pixel region of the second repeating unit away from the transparent region of the second repeating unit, the one of the plurality of power supply lines is connected with the plurality of sub-pixel driving circuits of the pixel region of the second repeating unit, another of the plurality of power supply lines is provided on a side of a transparent region of the first repeating unit away from the pixel region of the first repeating unit, and the another of the plurality of power supply lines is connected with the plurality of sub-pixel driving circuits of the pixel region of the first repeating unit;

the first conductive layer comprises a first transition electrode extending along the first direction, and the first electrode and a second electrode of the sensing transistor, a first terminal of the first transition electrode is connected with the first electrode of the sensing transistor of the third sub-pixel driving circuit of the first repeating unit, and a second terminal of the first transition electrode is connected with the first electrode of the sensing transistor of the first sub-pixel driving circuit of the second repeating unit; and the first transition electrode intersects with a second sub-line of the sensing signal line so as to be connected with the second sub-line of the sensing signal line.

10. The display substrate according to claim 9, wherein
at least part of each of orthographic projections of the first electrodes of the sensing transistors of the first sub-pixel driving circuit, the second sub-pixel driving circuit, and the third sub-pixel driving circuit on the main surface of the base substrate overlaps with an orthographic projection of the first connection line on the main surface of the base substrate.

11. The display substrate according to claim 10, wherein
the charge storage circuit comprises a storage capacitor, the semiconductor layer further comprises a first electrode plate of the storage capacitor, and the first conductive layer further comprises a second electrode plate of the storage capacitor; and the second electrode of the sensing transistor is connected with an end of the second electrode plate close to the sensing transistor, and the second electrode of the sensing transistor and the second electrode plate are integral with each other.

12. The display substrate according to claim 11, wherein
in the second direction, the data writing transistor and the driving transistor are located on a side of the storage capacitor away from the sensing transistor, and the driving transistor is located between the data writing transistor and the storage capacitor;

the first conductive layer further comprises a first electrode and a second electrode of the data writing transistor, a first electrode and a second electrode of the driving transistor, a second transition electrode and a third transition electrode, and each of the second transition electrode and the third transition electrode comprises the third node;

the second electrode of the driving transistor is located on a side of the driving transistor away from the storage capacitor;

one end of the second transition electrode is connected with the second electrode of the driving transistor of the third sub-pixel driving circuit of the second repeating unit, and the other end of the second transition electrode is connected with one of the plurality of power supply lines close to the third sub-pixel driving circuit of the second repeating unit; and one end of the third transition electrode is connected with the second electrode of the driving transistor of the first sub-pixel driving circuit of the first repeating unit, and the other end of the third transition electrode is connected with another one of the plurality of power supply lines close to the transparent region of the first repeating unit.

13. The display substrate according to claim 12, wherein the second conductive layer comprises a second connection line extending along the first direction;

the second connection line is connected with second electrodes of driving transistors of the first sub-pixel driving circuit, the second sub-pixel driving circuit, and the third sub-pixel driving circuit of the first repeating unit or the second repeating unit through at least part of a fourth via; and at least part of each of orthographic projections of the second electrodes of the driving transistors of the first sub-pixel driving circuit, the second sub-pixel driving circuit, and the third sub-pixel driving circuit on the main surface of the base substrate overlaps with an orthographic projection of the second connection line on the main surface of the base substrate.

14. The display substrate according to claim 12, wherein the first electrode of the driving transistor is connected with an end of the second electrode plate of the storage capacitor away from the sensing transistor, the first electrode of the driving transistor and the second electrode plate are integral with each other; and the first electrode plate of the storage capacitor is connected with the active layer of the driving transistor, and the first electrode plate of the storage capacitor and the active layer of the driving transistor are integral with each other.

15. The display substrate according to claim 12, wherein each of the first electrode plate and the second electrode plate of the storage capacitor is a strip extending along the second direction;

the display substrate further comprises a filter layer, and the filter layer is located on a side of the light-emitting element away from the base substrate;

the filter layer comprises a first sub-pixel filter region, a second sub-pixel filter region, and a third sub-pixel filter region;

in each of the plurality of repeating units, the first sub-pixel filter region, the second sub-pixel filter region, and the third sub-pixel filter region are sequentially arranged along the second direction, and the second sub-pixel filter region is located between the first sub-pixel filter region and the third sub-pixel filter region;

an orthographic projection of the first sub-pixel filter region on the main surface of the base substrate overlaps with an orthographic projection of at least part of the sensing transistor of the sub-pixel driving circuits in the pixel region on the main surface of the base substrate, and further overlaps with an orthographic projection of a part of the storage capacitor close to the sensing transistor on the main surface of the base substrate;

an orthographic projection of the third sub-pixel filter region on the main surface of the base substrate overlaps with an orthographic projection of at least part of the data writing transistor and the driving transistor of the sub-pixel driving circuits in the pixel region on the main surface of the base substrate, and further overlaps with an orthographic projection of a part of the storage capacitor close to the driving transistor on the main surface of the base substrate; and an orthographic projection of the second sub-pixel filter region on the main surface of the base substrate overlaps with an orthographic projection of a part, which is in middle of the storage capacitor in the second direction, of the storage capacitor of the sub-pixel driving circuits in the pixel region on the main surface of the base substrate.

16. The display substrate according to claim 15, further comprising a third insulating layer and a pixel defining layer, wherein the third insulating layer is located on a side of the first conductive layer away from the base substrate, the light-emitting element is located on a side of the third insulating layer away from the base substrate, and the pixel defining layer is configured to define a light-emitting region of the light-emitting element;

a plurality of light-emitting elements of each of the plurality of repeating units comprise a first light-emitting element, a second light-emitting element, and a third light-emitting element;

the first light-emitting element, the second light-emitting element, and the third light-emitting element are provided to respectively correspond to the first sub-pixel filter region, the second sub-pixel filter region, and the third sub-pixel filter region;

the display substrate further comprises a fifth via, a sixth via, and a seventh via that penetrate through at least the third insulating layer, and the fifth via, the sixth via, and the seventh via are respectively configured to expose the first sub-pixel driving circuit, the second sub-pixel driving circuit, and the third sub-pixel driving circuit; and the first electrode of the first light-emitting element is connected with the first sub-pixel driving circuit through the fifth via, the first electrode of the second light-emitting element is connected with the second sub-pixel driving circuit through the sixth via, and the first electrode of the third light-emitting element is connected with the third sub-pixel driving circuit through the seventh via.

17. The display substrate according to claim 16, further comprising a black matrix, wherein in the pixel region of each of the plurality of repeating units, the black matrix comprises a plurality of light-shielding bars respectively extending along the first direction;

at least part of orthographic projections of the plurality of light-shielding bars on the main surface of the base substrate respectively overlap with an interval between the first sub-pixel filter region and the second sub-pixel filter region in the second direction and an interval between the second sub-pixel filter region and the third sub-pixel filter region in the second direction;

orthographic projections of the fifth via and the sixth via on the main surface of the base substrate are close to an orthographic projection of the light-shielding bar, which is between the first sub-pixel filter region and the second sub-pixel filter region, on the main surface of the base substrate, and are respectively located on two sides of the orthographic projection of the light-shielding bar, which is between the first sub-pixel filter region and the second sub-pixel filter region, on the main surface of the base substrate;

or, an orthographic projection of the fifth via on the main surface of the base substrate overlaps with an orthographic projection of an end of the first electrode plate of the storage capacitor of the first sub-pixel driving circuit, which is connected with the second electrode of the sensing transistor, on the main surface of the base substrate, an orthographic projection of the sixth via on the main surface of the base substrate is close to an orthographic projection of the light-shielding bar, which is between the first sub-pixel filter region and the second sub-pixel filter region, on the main surface of the base substrate, and overlaps with the second sub-pixel filter region; and an orthographic projection of the seventh via on the main surface of the base substrate is close to an orthographic projection of the light-shielding bar, which is between the second sub-pixel filter region and the third sub-pixel filter region, on the main surface of the base substrate, and overlaps with the third sub-pixel filter region.

18. The display substrate according to claim 9, further comprising a plurality of data lines, wherein the plurality of data lines respectively extending along the second direction, and the plurality of data lines comprise a first data line, a second data line, and a third data line provided in each of the plurality of repeating units;

the first data line and the second data line are located between the first sub-pixel driving circuit and the second sub-pixel driving circuit, and the third data line is located between the second sub-pixel driving circuit and the third sub-pixel driving circuit;

the first data line, the second data line, and the third data line are electrically connected with the first sub-pixel driving circuit, the second sub-pixel driving circuit, and the third sub-pixel driving circuit, respectively, to provide a data signal;

the first conductive layer further comprises a fourth transition electrode, a fifth transition electrode, and a sixth transition electrode arranged along the first direction;

the fourth transition electrode is connected with the first data line and a second electrode of the data writing transistor of the first sub-pixel driving circuit;

the fifth transition electrode is connected with the second data line and a second electrode of the data writing transistor of the second sub-pixel driving circuit; and the sixth transition electrode is connected with the third data line and a second electrode of the data writing transistor of the third sub-pixel driving circuit.

19. The display substrate according to claim 10, wherein the first gate line and the second gate line are located in the second conductive layer, the first gate line is close to sensing transistors of the first repeating unit and the second repeating unit, and the second gate line is close to data writing transistors of the first repeating unit and the second repeating unit;

the first gate line comprises a fold line portion, the fold line portion comprises a first fold line portion extending along the first direction, and a second fold line portion and a third fold line portion that are respectively connected with two ends of the first fold line portion and extend along the second direction, and the first fold line portion, the second fold line portion, and the third fold line portion bypass the first connection line; and an orthographic projection of the first fold line portion on the main surface of the base substrate overlaps with orthographic projections of active layers of the sensing transistors of the first sub-pixel driving circuit, the second sub-pixel driving circuit, and the third sub-pixel driving circuit on the main surface of the base substrate, and overlapping portions respectively form gate electrodes of the sensing transistors.

* * * * *